United States Patent
Kondo et al.

(10) Patent No.: US 7,854,860 B2
(45) Date of Patent: Dec. 21, 2010

(54) HIGH-STABILITY MICROENCAPSULATED HARDENED FOR EPOXY RESIN AND EPOXY RESIN COMPOSITION

(75) Inventors: Yoshikimi Kondo, Tokyo (JP); Hiroshi Uchida, Tokyo (JP); Kazuhiro Daikai, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 317 days.

(21) Appl. No.: 11/991,785

(22) PCT Filed: Sep. 29, 2006

(86) PCT No.: PCT/JP2006/319483

§ 371 (c)(1),
(2), (4) Date: Mar. 11, 2008

(87) PCT Pub. No.: WO2007/037378

PCT Pub. Date: Apr. 5, 2007

(65) Prior Publication Data
US 2009/0261298 A1    Oct. 22, 2009

(30) Foreign Application Priority Data

| Sep. 29, 2005 | (JP) | 2005-283583 |
| Sep. 29, 2005 | (JP) | 2005-285410 |
| Feb. 3, 2006 | (JP) | 2006-027077 |
| Apr. 14, 2006 | (JP) | 2006-112238 |
| Jun. 20, 2006 | (JP) | 2006-169776 |

(51) Int. Cl.
*H01B 1/12* (2006.01)
*H01M 2/16* (2006.01)

(52) U.S. Cl. ............. 252/500; 525/523; 524/183; 428/42.24; 523/211; 106/287.3; 429/129

(58) Field of Classification Search ............ 252/500; 525/523, 211; 524/183; 428/42.24; 523/211; 106/287.3; 429/129
See application file for complete search history.

(56) References Cited

U.S. PATENT DOCUMENTS

| 4,833,226 A | 5/1989 | Ishimura et al. |
| 5,357,008 A | 10/1994 | Tsai et al. |
| 5,548,058 A | 8/1996 | Muroi et al. |
| 5,589,523 A | 12/1996 | Sawaoka et al. |
| 6,555,602 B1 * | 4/2003 | Harada et al. ............ 523/466 |
| 6,805,958 B2 * | 10/2004 | Nakamura et al. ........ 428/416 |
| 2006/0128835 A1 | 6/2006 | Usui et al. |
| 2008/0251757 A1 * | 10/2008 | Yamamoto et al. ......... 252/73 |
| 2009/0186962 A1 * | 7/2009 | Kondo et al. ............ 523/351 |

FOREIGN PATENT DOCUMENTS

| EP | 1 557 438 A1 | 7/2005 |
| JP | 64-70523 | 3/1989 |
| JP | 5-331264 | 12/1993 |
| JP | 2005-344046 | 12/2005 |
| TW | 305860 | 5/1997 |
| TW | 200410998 | 7/2004 |
| WO | WO 2004/037885 A1 | 5/2004 |

OTHER PUBLICATIONS

Office Action issued on Mar. 10, 2010 in a corresponding Chinese Application (200680036309.X).
Yongquan Lu et al., "Practical Infrared Spectra Analysis," Publishing House of Electronics Industry, 1989, pp. 148, 159 & 162.

* cited by examiner

*Primary Examiner*—Douglas McGinty
(74) *Attorney, Agent, or Firm*—Finnegan, Henderson, Farabow, Garrett & Dunner, L.L.P.

(57) ABSTRACT

A microencapsulated latent hardener for epoxy resins which comprises cores (C) and shells (S) with which the cores are covered, characterized in that the cores (C) are ones formed from, as a starking material, particles of an epoxy resin hardener (H) comprising an amine adduct (A) and a low-molecular amine compound (B) as major ingredients and that the shells (S) have on the surface thereof connecting groups (x), (y), and (z) which absorb infrared. Also provided is an epoxy resin composition containing the hardener.

51 Claims, No Drawings

HIGH-STABILITY MICROENCAPSULATED HARDENED FOR EPOXY RESIN AND EPOXY RESIN COMPOSITION

TECHNICAL FIELD

The present invention relates to a novel latent epoxy resin hardener and a one-liquid epoxy resin composition using the same. In particular, the present invention relates to a latent epoxy resin hardener which not only has a high hardening activity and latency but also give a composition that has a superior stability at high temperature, solvent resistance, dispersibility and compatibility with other epoxy resins, and to a one-liquid epoxy resin composition using the same.

BACKGROUND ART

Epoxy resins have been widely used in paints, insulating materials for electric and electronics fields, adhesives and the like, because the hardened epoxy resins has a superior quality in mechanical properties, electric properties, thermal properties, chemical resistance, adhesiveness and the like. Epoxy resin compositions in general use at this time are a so-called two-liquid type, for which two-liquids, an epoxy resin and a hardener, are mixed before use.

The two-liquid epoxy resin composition can be hardened at room temperature but the storage and handling are complicated because the epoxy resin and the harder have to be stored separately, and both have to be weighed and mixed as necessary before use. Furthermore, since the usable time is limited, it is impossible to pre-mix them in a large quantity which creates a problem of frequent mixing and low efficiency.

To solve such problems of the two-liquid epoxy resin combination, several one-liquid epoxy resin compositions have been proposed up until now. For example, a latent hardener such as dicyandiamide, $BF_3$-amine complex, amine salts, denatured imidazole compounds has been mixed with epoxy resins.

However, these latent hardeners having good storage stability have low curability requiring high temperature or long time for curing, while those having high curability have low storage stability requiring, for example, storage at a low temperature such as −20° C. For example, although the storage stability of the combination at normal temperature in 6 months or longer for dicyandiamide, a curing temperature of 170° C. or higher is required, and when a curing promoting agent is used together to decrease the curing temperature, curing is possible at 130° C. but the storage stability at room temperature is not sufficient, and the composition must be stored at a low temperature. Thus a composition having both high curability and superior storage stability has been strongly desired. Further, when products of film shape or an epoxy resin impregnated base are prepared, these products are often mixtures containing solvents and reactive diluents, and conventional latent hardeners used for such mixtures have extremely low storage stability. It is also impossible to prepare one-liquid varnish in which hardeners are mixed with solvents, and varnishes essentially need to be two-liquid products and an improvement in this point has been desired.

To respond these requirements, so-called microcapsulated hardeners have been proposed which contain cores of amine hardeners covered with specific shells, succeeding to obtain both low temperature curability and storage stability to some extent (for example see Patent Document 1). In this Patent Document 1, a master batch type hardener for one-liquid epoxy resin compositions, which contain a hardener composed of a core of a specific amine hardener and a shell of a reaction product of an isocyanate compound or a reaction product of the aforementioned amine compound and an epoxy resin, is disclosed.

However, in recent years, especially in the field of electronics apparatus, further improvement in curability without impairing storage stability is demanded for one-liquid epoxy resin compositions, which are used as one of connecting materials, in order to match high density electric circuit and to improve connection reliability as well as to use materials having low heat resistance for making mobile devices lighter, or to improve productivity great deal.

To satisfy such demands, latent hardeners have been proposed in which a hardener is covered with a film obtained by a reaction of a specific component (for example, see Patent Document 2).

Patent Document 1: JP-A-1-70523

Patent Document 2: JP-A-2005-344046

DISCLOSURE OF THE INVENTION

Problem to be Solved by the Invention

However, in the latent hardeners disclosed in Patent Document 2, there is a problem that in the curing reaction of epoxy resins by the hardener, the curability is not fast enough because the time required for the epoxy functional group to react is too long. Thus, it has been pointed out that the curing reaction of epoxy resins by the conventional latent hardener has a shortcoming in rapidity of the curing reaction. Also, there have been a stronger demand for a latent hardener to have a solvent resistance, which is important to express a high latency when mixing the epoxy resin composition and solvent, to have a high moisture resistance which can reduce an effect of moisture to the epoxy resin compositions, to have a high adhesiveness to obtain epoxy resin compositions having a strong adhesive strength, and to have a superior dispersibility and fluidity so that it is easy to prevent generating aggregates when mixing the epoxy resin and hardener and to remove the aggregates, and however, it has been difficult to achieve these by conventional arts.

Thus, the object of the present invention is to provide a latent hardener having superior storage stability and rapid curing reactivity, and to provide a solvent resistance, moisture resistance, high adhesiveness, dispersibility and high fluidity to an epoxy resin hardener composition containing the hardener, as well as to provide, by using the epoxy resin compositions, adhesive materials, electrically conductive materials, insulating materials, sealing materials, coating materials, paint compositions, preimpregnating agents, structural adhesives, heat conductive materials, sealing materials for fuel cells and the like, which have high storage stability, solvent resistance, moisture resistance, dispersibility and fluidity, and in which a high connection reliability, adhesive strength, and high degree of sealing can be obtained even in curing condition at low temperature and short time.

Means for Solving the Problem

The present inventors studied hard to solve the problem described above and have completed the present invention by obtaining an information that the above object can be achieved, in a microcapsulated hardener for epoxy resin containing at least a core (C) which is obtained from an epoxy resin hardener (H) as a starting material and a shell (S) which covers the core, by forming a core (C) using a starting material of particles of epoxy resin hardener (H) having a specific range of average particle diameter, and a shell (S) covering the core having a binding group which absorbs infrared radiation with a specific wave number, in which the starting material, epoxy resin hardener (H), consists of an amine adduct (A) and a low molecular amine compound (B) as major ingredients; the amine adduct (A) is obtained by a reaction of an epoxy resin (e1) having a specific molecular weight with an amine compound; the starting material, epoxy resin hardener (H), contains a specific amount of water; the starting material, epoxy resin hardener (H), contains the low molecular amine compound (B) at a specific rate; the starting material, epoxy resin hardener (H), contains a specific amount of a solvent (SL) which is inert to the main component, the amine adduct (A); the starting material, epoxy resin hardener (H), is made to demonstrate a specific dissolution behavior to a specific liquid epoxy resin; the core (C) is covered with the shell (S) having a specific volume ratio to the core (C); the shell (S) covering the core (C) is formed by controlling the content of a specific functional group made of a specific material at a specific ratio; and the amine adduct (A) which is the main component of the starting material, epoxy resin hardener (H), has a specific rang of weight average molecular weight.

That is, the present invention is as follows.

1) A microcapsulated epoxy resin hardener containing at least a core (C) and a shell (S) covering the core, wherein:

the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients, a molecular weight distribution of the epoxy resin hardener (H), defined as a ratio of a weight average molecular weight to a number average molecular weight of the amine adduct (A), being over 1 but 7 or less, and a water content of the epoxy resin hardener (H) being 0.05-3 parts by mass based on 100 parts by mass of the epoxy resin hardener (H); and the shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$.

2) The microcapsulated epoxy resin hardener according to 1), wherein the aforementioned shell (S) contains essentially no carboxylate ester group.

3) The microcapsulated epoxy resin hardener according to 1), wherein the aforementioned shell (S) contains essentially no ester bond except for a carbamate ester bond.

4) The microcapsulated epoxy resin hardener according to any one of 1)-3), wherein a content of the low molecular amine compound (B) in the epoxy resin hardener (H) is 0.001-3 parts by mass based on 100 parts by mass of the epoxy resin hardener (H).

5) The microcapsulated epoxy resin hardener containing at least a core (C) and a shell (S) covering the core, wherein:

the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients, a water content of the epoxy resin hardener (H) being 0.05-3 parts by mass based on 100 parts by mass of the epoxy resin hardener (H) and a content of a solvent (SL) that is inert to the amine adduct (A) being 0.001-3 parts by mass based on 100 parts by mass of the epoxy resin hardener (H); and the shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$.

6) The microcapsulated epoxy resin hardener according to 5), wherein the aforementioned shell (S) contains essentially no carboxylate ester group.

7) The microcapsulated epoxy resin hardener according to 5), wherein the aforementioned shell (S) contains essentially no ester bond except for a carbamate ester bond.

8) The microcapsulated epoxy resin hardener containing at least a core (C) and a shell (S) covering the core, in which:

the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients and has a solubility to a liquid epoxy resin of 0.01-3 mass % determined by a calorimetric method after solvent extraction; and the shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$.

9) The microcapsulated epoxy resin hardener according to 8), in which the aforementioned shell (S) contains essentially no carboxylate ester group.

10) The microcapsulated epoxy resin hardener according to 8), wherein the aforementioned shell (S) contains essentially no ester bond except for a carbamate ester bond.

11) The microcapsulated epoxy resin hardener containing at least a core (C) and a shell (S) covering the core, wherein:

the core (C) is formed from, as a starting material, particles having an average particle diameter of over 0.3 μm but 12 μm or less, defined as a median diameter, which are made of an epoxy resin hardener (H) having an amine adduct (A) and a low molecular amine compound (B) as major ingredients;

the shell (S) has, at least surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$; and contains a resin having a urea bond in its structure; and a volume ratio of the core (C) to the shell (S) is 100:1 to 100:50.

12) The microcapsulated epoxy resin hardener according to 11), wherein the shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, a and binding group (z) absorbing infrared radiation of wave number 1730-1755 $cm^{-1}$, and contains a resin having a urea bond but essentially no carboxylate ester bond in its structure.

13) The microcapsulated epoxy resin hardener according to 11), wherein the shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$, and contains a resin having a urea bond but essentially no ester bond except for a carbamate ester bond in its structure.

14) The microcapsulated epoxy resin hardener containing at least a core (C) and a shell (S) covering the core, wherein:

the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients, a water content of the epoxy resin hardener (H) being 0.05-3 parts by mass based on 100 parts by mass of the epoxy resin hardener (H); and the shell (S) has, at least on a surface, a binding group (x) absorbing infrared radiation of wave number 1630-1680 cm$^{-1}$, a binding group (y) absorbing infrared radiation of wave number 1680-1725 cm$^{-1}$, and a binding group (z) absorbing infrared radiation of wave number 1730-1755 cm$^{-1}$, and the binding groups (x), (y) and (z) being a urea group, biuret group and urethane group, respectively, and a concentration ratio of the binding group (x) to a total concentration of the binding groups (x), (y) and (z) (=x/(x+y+z)) being 0.50-0.75.

15) The microcapsulated epoxy resin hardener according to 14), in which the aforementioned shell (S) contains essentially no carboxylate ester group in its structure.

16) The microcapsulated epoxy resin hardener according to 14), in which the aforementioned shell (S) contains essentially no ester bond except for a carbamate ester bond in its structure.

17) A microcapsulated epoxy resin hardener containing at least a core (C) and a shell (S) covering the core, wherein:

the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients, the amine adduct (A) being obtained by a reaction of an epoxy resin (e1) and an amine compound, and a weight average molecular weight of the amine adduct (A) being 150-8000; and the shell (S) has, at least on a surface, a binding group (x) absorbing infrared radiation of wave number 1630-1680 cm$^{-1}$, a binding group (y) absorbing infrared radiation of wave number 1680-1725 cm$^{-1}$, and a binding group (z) absorbing infrared radiation of wave number 1730-1755 cm$^{-1}$.

18) The microcapsulated epoxy resin hardener according to 17), wherein the aforementioned shell (S) contains essentially no carboxylate ester group.

19) The microcapsulated epoxy resin hardener according to 17), wherein the aforementioned shell (S) contains essentially no ester bond except for a carbamate ester bond.

20) A microcapsulated epoxy resin hardener containing at least a core (C) and a shell (S) covering the core, wherein:

the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients, the amine adduct (A) being obtained by a reaction of an epoxy resin (e1) and an amine compound, and a weight average molecular weight of the epoxy resin (e1) being 150-5000; and the shell (S) has, at least on a surface, a binding group (x) absorbing infrared radiation of wave number 1630-1680 cm$^{-1}$, a binding group (y) absorbing infrared radiation of wave number 1680-1725 cm$^{-1}$, and a binding group (z) absorbing infrared radiation of wave number 1730-1755 cm$^{-1}$.

21) The microcapsulated epoxy resin hardener according to 20), wherein the aforementioned shell (S) contains essentially no carboxylate ester group.

22) The microcapsulated epoxy resin hardener according to 20), wherein the aforementioned shell (S) contains essentially no ester bond except for a carbamate ester bond.

23) The microcapsulated epoxy resin hardener according to any one of 1)-22), wherein the low molecular amine compound (B) is an imidazole.

24) The microcapsulated epoxy resin hardener according to any one of 1)-23), wherein a total chlorine content of the epoxy resin (e1) is 2500 ppm or less.

25) The microcapsulated epoxy resin hardener according to any one of 1)-24), wherein the epoxy resin hardener (H) is a solid at 25° C.

26) The microcapsulated epoxy resin hardener according to any one of 1)-25), in which a total chlorine content of the epoxy resin hardener (H) is 2500 ppm or less.

27) The microcapsulated epoxy resin hardener according to any one of 1)-26), wherein the shell (S) includes any two or more of an isocyanate compound, an active hydrogen compound, an epoxy resin hardener (h2), an epoxy resin (e2) and the low molecular amine compound (B).

28) The microcapsulated epoxy resin hardener according to any one of 1)-27), wherein a total chlorine content of the epoxy resin (e2) is 2500 ppm or less.

29) A master batch type epoxy resin hardener composition including an epoxy resin (e3) and the microcapsulated epoxy resin hardener according to any one of 1)-2.8), in which a weight ratio of the epoxy resin (e3) to the microcapsulated epoxy resin hardener is 100:0.1 to 100:1000.

30) The master batch type epoxy resin hardener composition according to 29), wherein a total chlorine content of the epoxy resin (e3) is 2500 ppm or less.

31) The master batch type epoxy resin hardener composition according to 29) or 30), wherein a total chlorine content is 2500 ppm or less.

32) The master batch type epoxy resin hardener composition according to any one of 29)-31), wherein diol terminal impurity component of the epoxy resin (e3) is 0.001-30 weight % of basic structural components of the epoxy resin (e3).

33) A one-liquid epoxy resin composition, including an epoxy resin (e4) and the master batch type epoxy resin hardener composition according to any one of 29)-32), wherein a weight ratio of the epoxy resin (e4) to the master batch type epoxy resin hardener composition is 100:0.001 to 100:1000.

34) The composition according to any one of 29)-33), further including at least one epoxy resin hardener (h3) selected from the group consisting of acid anhydrides, phenols, hydrazides and guanidines.

35) The composition according to any one of 29-34), further including a cyclic borate ester.

36) The composition according to 35), wherein the cyclic borate ester compound is 2,2'-oxybis(5,5'-dimethyl-1,3,2-dioxaborinan).

37) The composition according to 35) or 36), wherein a content of the cyclic borate ester compound is 0.001-10 mass %.

38) A paste composition including the composition according to any one of 29)-37).

39) A film composition including the composition according to any one of 29)-37).

40) An adhesive including the composition according to any one of 29)-37).

41) An adhesive paste including the composition according to any one of 29)-37).

42) An adhesive film including the composition according to any one of 29)-37).

43) An electrically conductive material including the composition according to any one of 29)-37).

44) An anisotropic electrically conductive material including the composition according to any one of 29)-37).

45) An anisotropic electrically conductive film including the composition according to any one of 29)-37).

46) An insulating material including the composition according to any one of 29)-37).

47) A sealing material including the composition according to any one of 29)-37).

48) A coating material including the composition according to any one of 29)-37).

49) A paint composition including the composition according to any one of 29)-37).

50) A prepreg including the composition according to any one of 29)-37).

51) A heat conductive material including the composition according to any one of 29)-37).

52) A separator material for fuel cells including the composition according to any one of 29)-37).

ADVANTAGE OF THE INVENTION

The epoxy resin hardener and epoxy resin composition of the present invention have a very good storage stability, solvent resistance, moisture resistance, adhesiveness, dispersibility and fluidity, and the epoxy resin composition thereof has a high curability, and also the cured products demonstrate superior reliability, water resistance and electric properties.

BEST MODE FOR CARRYING OUT THE INVENTION

The present invention will be described concretely as follows.

I. Microcapsulated Epoxy Resin Hardener

The present invention provides a microcapsulated epoxy resin hardener containing at least a core (C) and a shell (S) covering the core, in which the core (C) is formed from, as a starting material, particles having an average particle diameter of over 0.3 μm but 12 μm or less, defined as a median diameter, which are made of an epoxy resin hardener (H) having an amine adduct (A) and a low molecular amine compound (B) as major ingredients, and the shell (S) contains on a surface at least a binding group (x) absorbing infrared radiation of wave number 1630-1680 $cm^{-1}$, binding group (y) absorbing infrared radiation of wave number 1680-1725 $cm^{-1}$, and binding group (z) absorbing infrared radiation of wave number 1730-1755 $cm^{-1}$, and a master batch type epoxy resin hardener composition including the microcapsulated epoxy resin hardener and an epoxy resin (e3).

The present invention will be described in detail as follows.

(I-1) Core (C)

The core (C) of the microcapsulated hardener for epoxy resin of the present invention is formed from, as a starting material, particles having an average particle diameter of over 0.3 μm but 12 μm or less, preferably 1 μm-10 μm, more preferably 1.5 μm-5 μm defined as a median diameter, which are made of an epoxy resin hardener (H) having an amine adduct (A) and a low molecular amine compound (B) as major ingredients. Here, the average particle diameter defined as the median diameter is a Stokes diameter measured by a laser diffraction•light scattering method. Further, the shape is not particularly limited and can be any shape, for example, spherical, granular, powder or amorphous, but spherical shape is preferable for reducing viscosity of the one-liquid epoxy resin composition. Here, the spherical shape includes not only a true sphere but also irregular shapes with round edges.

When the particle diameter is greater than 12 μm, a homogeneously cured product can not be obtained. When the composition is prepared, large particle size aggregates are also tend to form resulting in impairing the physical property of the cured products.

When the particle diameter is smaller than 0.3 μm, aggregation each other occurs among the starting material particles making a formation of thin shell, like the one in the present invention difficult. As the result, the parts where imperfect capsule film formation exists cause impairment of the storage stability and solvent resistance.

There are several methods for obtaining desired average particle diameter of the epoxy resin hardener (H) which is a starting material of the core (C) of the microcapsulated epoxy resin hardener of the present invention. For example, a method of controlled grinding of lumps of epoxy resin hardener, a method for obtaining a desired average particle diameter by performing crude and fine grindings and then by a finely controlled sorting procedure, and a method for obtaining a desired average particle diameter by controlling conditions of a spray drier of the dissolved epoxy resin hardener are included.

As an apparatus for grinding, a ball mill, attriter, beads mill, jet mill and the like may be used as necessary but an impact crushing apparatus is often used. The impact crushing apparatus used here includes, for example, jet mills such as a swirl flow type powder crushing jet mill and powder crushing counter jet mill. The jet mill is an apparatus to make fine particles by crushing solid materials each other by high speed jet flow of air and the like.

As an apparatus for sorting, general sorting apparatuses using wind power and dry-sorting apparatuses such as other various air separators, micron separators, Microblex and Acucut can be used.

(I-2) Epoxy Resin Hardener (H)

The epoxy resin hardener (H) will be described. The epoxy resin hardener (H), the starting material of the core (C), includes: amine hardeners; acid anhydride hardeners such as phthalic anhydride, hexahydrophthalic anhydride, tetrahydrophthalic anhydride and methylnadic anhydride; phenol hardeners such as phenol novolac, cresol novolac and bisphenol A novolac; mercaptan hardeners such as propyleneglycol denatured polymercaptan, a thiogluconate ester of trimethylolpropane, polysulfide resins; halogenated borate hardeners such as an ethylamine salt of trifluoroborane; tertiary ammonium salt hardeners such as a phenolic salt of 1,8-diazabicyclo(5,4,0)-undeca-7-ene; urea hardeners such as 3-phenyl-1,1-dimethylurea; phosphine hardeners such as triphenyl phosphine, tetraphenyl phosphoniumtetraphenyl borate; and amine hardeners are preferred because they are superior in low temperature curing and storage stability.

Among amine hardeners, an amine hardener containing an amine adduct (A) and a low molecular amine compound (B) as major ingredients is preferred.

The amine adduct (A) will be described.

The amine adduct (A) includes compounds having amino groups obtained by a reaction of at least one kind of compounds selected from the group consisting of carboxylate compounds, sulfonate compounds, urea compounds, isocyanate compounds and epoxy resin (e1) and an amine compound. Carboxylate compounds, sulfonate compounds, urea compounds, isocyanate compounds and epoxy resin (e1) to be used as a material for the amine adduct (A) are shown below.

The carboxylate compounds include succinic acid, adipic acid, sebacic acid, phthalic acid, dimer acid and the like, the sulfonate compounds include ethanesulfonic acid, p-toluenesulfonic acid and the like, and the urea compounds include urea, methyl urea, dimethyl urea, ethyl urea, t-butyl urea and the like.

The isocyanate compounds include aliphatic diisocyanates, alicyclic diisocyanates, aromatic diisocyanates, aliphatic triisocyanates, polyisocyanates and the like.

The aliphatic diisocyanates include ethylene diisocyanate, propylene diisocyanate, butylene diisocyanate, hexamethylene diisocyanate, trimethylhexamethylene diisocyanate and the like.

The alicyclic diisocyanates include isophorone diisocyanate, 4,4'-dicyclohexyl methane diisocyanate, norbornane diisocyanate, 1,4-isocyanatocyclohexane, 1,3-bis(isocyanato methyl)-cyclohexane, 1,3-bis(2-isocyanatopropyl-2yl)-cyclohexane and the like.

The aromatic diisocyanates include tolylene diisocyanate, 4,4'-diphenylmethane diisocyanate, xylene diisocyanate, 1,5-naphthalene diisocyanate and the like.

The aliphatic triisocyanates include 1,6,11-undecane triisocyanate, 1,8-diisocyanate-4-isocyanatemethyloctane, 1,3, 6-triisocyanatemethylhexane, 2,6-diisocyanatohexanate-2-isocyanato ethyl, 2,6-diisocyanatohexanate-1-methyl-2-isocyanateethyl and the like.

The polyisocyanates include polymethylenepolyphenyl polyisocyanate and polyisocyanates induced from the diisocyanate compounds described above. The polyisocyanates induced from the diisocyanate compounds described above include isocyanulate type polyisocyanates, biuret type polyisocyanates, urethane type polyisocyanates, alohanate type polyisocyanate, carbodiimide type polyisocyanate and the like.

The epoxy resin (e1) include any of monoepoxy compounds, multi-valent epoxy compounds or a mixture thereof.

The monoepoxy compounds include butylglycidyl ether, hexylglycidyl ether, phenylglycidyl ether, allylglycidyl ether, para-tert-butylphenylglycidyl ether, ethylene oxide, propylene oxide, para-xylylglycidyl ether, glycidyl acetate, glycidyl butylate, glycidyl hexoate, glycidyl benzoate and the like.

The polyepoxy compounds include: bisphenol type epoxy resins, which are glycidylated bisphenols, for example bisphenol A, bisphenol F, bisphenol AD, bisphenol S, tetramethyl bisphenol A, tetramethyl bisphenol F, tetramethyl bisphenol AD, tetramethyl bisphenol S, tetrabromobisphenol A, tetrachlorobisphenol A and tetrafluorobisphenol A; epoxy resins, which are other glycidylated divalent phenols, for example biphenol, dihydroxynaphthalene, 9,9-bis(4-hydroxyphenyl)fluorene; epoxy resins, which are glycidylated trisphenols, for example 1, 1,1-tris(4-hydroxyphenyl)methane, 4,4-(1-(4-(1-(4-hydroxypheyl)-1-methylethyl)phenyl) ethylidene)bisphenol; epoxy resins, which are glycidylated tetrakisphenols, for example 1, 1,2,2-tetrakis(4-hydroxyphenyl)ethane; novolac type epoxy resins, which are glycidylated novolacs, for example phenol novolac, cresol novolac, bisphenol A novolac, brominated phenol novolac, brominated bisphenol A novolac; epoxy resins, which are glycidylated multivalent phenols; aliphatic ether type epoxy resins, which are glycidylated polyvalent alcohols such as glycerin and polyethyleneglycol; ether ester type epoxy resins, which are glycidylated hydroxycarboxylic acid such as p-oxybenzoic acid and β-oxynaphtoeic acid: ester type epoxy resins, which are glycidylated polycarboxylic acid such as phthalic acid and terephthalic acid; glycidyl type epoxy resins of glycidylated amine compounds such as 4,4-diaminodiphenylmethane and m-aminophenol, and amine type epoxy resins such as triglycidylisosyanulate, and aliphatic epoxides such as 3,4-epoxycyclohexylmethyl-3',4'-epoxycyclohexane carboxylate.

Among the carboxylate compounds, sulfonate compounds, isocyanate compounds, urea compounds and epoxy resin (e1), which are used as the material for the amine adduct (A), the epoxy resin (e1) is preferred because it has an high curability and superior storage stability.

As the epoxy resin (e1), a multivalent epoxy compound is preferred because the storage stability of the epoxy resin composition can be increased. The multivalent epoxy compound is preferably a glycidyl type epoxy resin due to an overwhelmingly high productivity of amine adducts, more preferably an epoxy resin which is a glycidylated multivalent phenol due to a superior adhesiveness and heat resistance of the cured product, and further more preferably a bisphenol type epoxy resin. Yet further more preferred are epoxy resins of glycidylated bisphenol A and glycidylated bisphenol F. Still further the epoxy resin which is glycidylated bisphenol A is more preferred. These epoxy resins may be used singly or in combination.

The total chlorine content of the epoxy resin (e1) is preferably 2500 ppm or less to obtain an epoxy resin composition in which the curability and storage stability are in good balance, and more preferably 2000 ppm of less, more preferably 1500 ppm or less, more preferably 800 ppm or less, more preferably 400 ppm or less, more preferably 180 ppm or less, more preferably 100 ppm or less, more preferably 80 ppm or less and further more preferably 50 ppm or less.

The total chlorine content in the present invention represents a total amount of organic chlorine and inorganic chlorine contained in a compound and is a mass based value. The total chlorine content is measured by a following method. An epoxy resin composition is repeatedly washed and filtered using xylene until the epoxy resin disappears. Next, the filtrate is distilled off at 100° C. or less under reduced pressure to obtain the epoxy resin. The epoxy resin sample thus obtained is accurately weighed so that 1-10 g to be titrated in 3-7 ml and dissolved in 25 ml of ethyleneglycol monobutyl ether. 25 ml of 1N KOH in propyleneglycol solution is added to the solution, boiled for 20 minutes and then titrated with silver nitrate solution. The total chlorine content is calculated from the titrated amount.

The total chlorine content is preferably 0.01 ppm or more to facilitate a shell formation control for the epoxy resin (e1). The total chlorine content is more preferably, 0.02 ppm or above, more preferably 0.05 ppm or above, more preferably 0.1 ppm or above, more preferably 0.2 ppm or above and further more preferably 0.5 ppm or above. By containing the total chlorine content of 0.1 ppm or above, the shell forming reaction is carried out efficiently on the surface of the hardener and the shell having a good storage stability can be obtained. The range of the total chlorine content is preferably 0.1-200 ppm, more preferably 0.2-80 ppm and further more preferably 0.5-50 ppm.

Among the total chlorine, chlorine contained in a 1,2-chlorohydrine group is called in general hydrolyzable chlorine, and the hydrolyzable chlorine content in the epoxy resin which is used as a material for the amine adduct is preferably 50 ppm or less, more preferably from 0.01 to 20 ppm and further more preferably from 0.05 to 10 ppm. The hydrolyzable chlorine content can be obtained by measuring by the following method. 3 g of the sample is dissolved in 50 ml toluene, mixed with 20 ml of 0.1 N KOH methanol solution and boiled for 15 minutes. The mixture was titrated with a silver nitrate solution and the hydrolyzable chlorine content was calculated from the titrated amount.

The hydrolyzable chlorine content of 50 ppm or less is preferred, because of the advantage for both high curability and storage stability as well as superior electric properties.

The amine compounds for generating the amine adduct (A) by reacting with at least one kind of compound selected from the group consisting of carboxylate compounds, sulfonate compounds, urea compounds, isocyanate compounds and epoxy resin (e1) include a compound having at least one primary amino group and/or secondary amino group but no tertiary amino group, and a compound having at least one tertiary amino group and at least one active hydrogen group.

The compound having at least one primary amino group and/or secondary amino group but no tertiary amino group includes primary amine groups having no tertiary amino group such as methylamine, ethylamine, propylamine, butylamine, ethylenediamine, propylenediamine, hexamethylenediamine, diethylenetriamine, triethylenetetramine, ethanolamine, propanolamine, cyclohexylamine, isophoronediamine, aniline, toluidine, diaminodiphenylmethane and diaminodiphenylsulfonic acid; and secondary amine groups having no tertiary amino group such as dimethylamine, diethylamine, dipropylamine, dibutylamine, dipentylamine, dihexylamine, dimethanolamine, diethanolamine, dipropanolamine, dicyclohexylamine, piperidine, piperidone, diphenylamine, phenylmethylamine and phenylethylamine.

In the compound having at least one tertiary amino group and at least one active hydrogen group, examples of the active hydrogen group include a primary amino group, secondary amino group, hydroxy group, thiol group, carboxylic acid and hydrazide group.

The compound having at least one tertiary amino group and at least one active hydrogen group includes: aminoalcohols such as 2-dimethylaminoethanol, 1-methyl-2-dimethylaminoethanol, 1-phenoxymethyl-2-dimethylaminoethanol, 2-diethylaminoethanol, 1-butoxymethyl-2-dimethyl aminoethanol, methyldiethanolamine, triethanolamine and N-β-hydroxyethylmorpholine; aminophenols such as 2-(dimethylaminomethyl)phenol and 2,4,6-tris(dimethylaminomethyl)phenol; imidazoles such as 2-methylimidazole, 2-ethyl-4-methylimidazole, 2-undecylimidazole, 2-heptadecylimidazole, 2-phenylimidazole, 1-aminoethyl-2-methylimidazole, 1-(2-hydroxy-3-phenoxypropyl)-2-methylimidazole, 1-(2-hydroxy-3-phenoxypropylp)-2-ethyl-4-methylimidazole, 1-(2-hydroxy-3-butoxypropyl)-2-methylimidazole and 1-(2-hydroxy-3-butoxypropyl)-2-ethyl-4-methylimidazole; imidazolines such as 1-(2-hydroxy-3-phenoxypropyl)-2-phenylimidazoline, 1-(2-hydroxy-3-butoxypropyl)-2-methylimidazoline, 2-methylimidazoline, 2,4-dimethylimidazoline, 2-ethylimidazoline, 2-ethyl-4-methylimidazoline, 2-benzylimidazoline, 2-phenylimidazoline, 2-(o-tolyl)-imidazoline, tetramethylene-bis-imidazoline, 1,1,3-trimethyl-1,4-tetramethylene-bis imidazoline, 1,3,3-trimethyl-1,4-tetramethylene-bis-imidazoline, 1,1,3-trimethyl-1,4-tetramethylene-bis-4-methylimidazoline, 1,3,3-trimethyl-1,4-tetramethylene-bis-4-methylimidazoline, 1,2-phenylene-bis-imidazoline, 1,3-phenylene-bis-imidazoline, 1,4-phenylene-bis-imidazoline, 1,4-phenylene-bis-4-methylimidazoline; tertiary aminoamines such as dimethylaminopropylamine, diethylaminopropylamine, dipropylaminopropylamine, dibutylaminopropylamine, dimethylaminoethylamine, diethylaminoethylamine, dipropylaminoethylamine, dibutylaminoethylamine, N-methylpiperadine, N-aminoethylpiperadine and diethylaminoethylpiperadine; aminomercaptans such as 2-dimethylaminoethanethiol, 2-mercaptobenzoimidazole, 2-mercaptobenzothiazole, 2-mercaptopyridine and 4-mercaptopyridine; aminocarboxylic acids such as N,N-dimethylaminobenzoic acid, N,N-dimethylglycine, nicotinic acid, isonicotinic acid and picolic acid; and aminohydrazides such as N,N-dimethylglycinehydrazide, nicotinic acid hydrazide and isonicotinic acid hydrazide.

Since the curability and storage stability are in good balance, a preferable amine compound is the one having at least one tertiary amine and at least one active hydrogen group, and imidazoles are more preferable, and 2-methylimidazole and 2-ethyl-4-methylimidazole are further more preferable.

Among these amine adducts (A), the one obtained by the reaction of an epoxy resin (e1) and imidazoles is preferred.

Next, the amine compounds referred as the materials for the aforementioned amine adduct (A) can be used as a low molecular amine compound (B), and these can be used in combination.

Among these low molecular amine compounds, imidazoles are especially preferred.

By confining the molecular weight distribution of the amine adduct (A) to a specific range, the microcapsulated epoxy resin hardener and/or master batch type epoxy resin hardener composition and/or epoxy resins having high storage stability can be obtained without impairing the curability of the one-liquid epoxy resin compositions.

Further, it has been generally accepted that for the expression of the adhesive strength of an epoxy resin composition, a hardener that is a catalyst of the curing reaction does not have a great effect. However, surprisingly in the present invention it was found that by confining the molecular weight distribution of the amine adduct (A) to a specific range, not only the microcapsulated epoxy resin hardener have high storage stability but also the adhesive strength of the epoxy resin compositions can be improved dramatically without impairing the curability of one liquid epoxy resin compositions. Furthermore, the microcapsulated epoxy resin hardener and/or master batch type epoxy resin hardener composition and/or epoxy resins having high storage stability, which has not only storage stability and adhesiveness but also extremely good solvent resistance, can be obtained by using the microcapsulated epoxy resin hardener produced from the starting material, the epoxy resin hardener (H), in which the molecular weight distribution of the amine adduct (A) is in a specific range, the content of the low molecular amine compound (B) to the epoxy resin hardener (H) is in a specific range, the water content to the epoxy resin hardener (H) is in a specific range and the particle diameter is in a specific range.

That is, the molecular weight distribution of the amine adduct (A) used in the present invention is made to be over 1 but 7 or less. Here, the molecular weight distribution is defined as a ratio of a weight average molecular weight to a number average molecular weight and calculated from a molecular weight obtained as polystyrene conversion using gel permission chromatography (hereinafter called as GPC). The molecular weight distribution of the amine adduct (A) is preferably 1.01-6.50, more preferably 1.20-5 and furthermore preferably 1.5-4. The microcapsulated epoxy resin hardener and/or master batch type epoxy resin hardener composition and/or epoxy resins having high curability and storage stability as well as superior adhesive strength for epoxy resins can be obtained by confining the molecular weight distribution of the amine adduct (A) to over 1 but 7 or less. When the ratio of the molecular weight distribution is over 7, the curability is impaired causing the cured product with inferior adhesive strength of epoxy resins.

When the microcapsulated epoxy resin hardener is formed from a starting material, an epoxy resin hardener (H), in which the amine adduct (A) and the low molecular amine compound (B) are the major ingredients and the average diameter defined as the median diameter is over 0.3 µm but 12 µm or less, by adjusting the water content of the hardener for epoxy resin (H) to 0.05-3 parts by mass based on 100 parts by mass of the hardener for epoxy resin (H), the microcapsulated epoxy resin hardener and/or master batch type epoxy resin hardener composition and/or epoxy resins not only demonstrating a superior solvent resistance, but also capable of widening of the range of the low molecular amine compound (B) content in the epoxy resin hardener (H), having a superior storage stability and having a superior curability can be obtained.

By making the water content of the starting material, the epoxy resin hardener (H), 0.05 parts by mass or more, not only fusion of the particles of the epoxy resin hardener (H) each other is prevented and a stable quality condition can be maintained, but also the shell (S), which is made from reaction products of any of two or more of an isocyanate compound, active hydrogen compound, epoxy resin hardener (h2), epoxy resin (e2) and low molecular amine compound (B), covering the core (C) of the microcapsulated epoxy resin hardener formed from the epoxy resin hardener (H) as a starting material, is formed on the surface of the core (C) efficiently, and the quality and tightness of the film formed play a role to contain efficiently the low molecular amine compound (B) in the epoxy resin hardener (H) to the capsule film forming reaction. As the result, the film having superior storage stability and solvent resistance as well as a superior curability can be obtained. When the water content of the epoxy resin hardener (H) exceeds 3 parts by mass, aggregation of particles each other tends to occur on the production, storage and deposit of the particle powder of the epoxy resin hardener (H) making it difficult to produce and control the particle powder of the epoxy resin hardener (H) in a stable quality. Furthermore, when the shell (S), which is made from reaction products of any of two or more of an isocyanate compound, active hydrogen compound, epoxy resin hardener (h2), epoxy resin (e2) and low molecular amine compound (B), is formed on the surface of the epoxy resin hardener (H), the microcapsulated epoxy resin hardener and/or master batch type epoxy resin hardener composition in stable quality condition can not be obtained because of the effect of the aggregation phenomenon of the particle powder. Still further, it is preferable for curability that the epoxy resin hardener (H) of the present invention is an amine hardener, but the amine hardener tends to absorb and retain water by nature. Thus, the water content of the epoxy resin hardener (H) should be strictly controlled.

There are several methods for controlling the water content of the epoxy resin hardener (H) of the present invention in a specific range. They include for example, a method for obtaining a desired water content by controlling the temperature and humidity environment when the epoxy resin hardener (H) is pulverized, a method for adjusting the water content in a desired range by obtaining the epoxy resin hardener (H) having a desired average particle diameter and keeping at an constant temperature and humidity and a method for controlling the change of water content by drying the starting particles for the epoxy resin hardener (H) in vacuo to remove water and then keeping in a sealed condition.

The water content of the epoxy resin hardener (H) of the present invention can be measured without any problem by a normal quantitative method for measuring water content. For example, the Karl-Fischer method using coulometric titration, gas chromatography method by TCD (Thermal Conductivity Detector) and quantitative assay method for the amount of hydrogen gas generated by a chemical reaction in proportion to the water content.

In the present invention, when the microcapsulated epoxy resin hardener is formed from the starting material, the epoxy resin hardener (H) which have the amine adduct (A) and low molecular compound (B) as the major ingredients and have a particle size in a specific range, the microcapsulated epoxy resin hardener having not only high storage stability but also superior curability and solvent resistance can be obtained by including a specific range of the amount of low molecular amine compound (B) in the epoxy resin hardener (H).

That is, in the present invention, the amount of low molecular amine compound (B) in 100 parts by mass of the epoxy resin hardener (H) having an average particle diameter, defined as the median diameter, over 0.3 µm but 12 µm or less is in the range of 0.001-3 parts by mass, preferably 0.01-2.5 parts by mass, more preferably 0.02-2 parts by mass and still more preferably 0.03-1.5 parts by mass.

In this case, the content of low molecular amine compound (B) in the epoxy resin hardener (H) is also in a specific range to the amine adduct (A), which is one of the major ingredients of the epoxy resin hardener (H). The preferred amount of the low molecular amine compound (B) in 100 parts by mass of the amine adduct (A) in the epoxy resin hardener (H) is in the range of 0.001-1 mass part.

By including 0.001 parts by mass or more of the low molecular amine compound (B) in the epoxy resin hardener (H), a hard and dense shell can be formed in the shell (S) forming reaction, and the microcapsulated epoxy resin hardener having high storage stability and solvent resistance can be obtained. When the content of the low molecular amine compound (B) to the epoxy resin hardener (H) is 3 parts by mass or greater, even if the water content of the epoxy resin hardener (H) is in the specific range, it is difficult to control stably the shell (S) forming reaction, and also the storage stability and solvent resistance are impaired due to an increase of the amount of the low molecular amine compound eluted through the capsule film.

The amine adduct (A) of the present invention can be obtained by reacting, for example, an epoxy resin (e1) and an amine compound in the range of preferably 0.5-10 equivalent (more preferably 0.8-5 equivalent, still more preferably 0.95-4 equivalent) of the active hydrogen group in the amine compound to one equivalent of the epoxy group of the epoxy resin (e1), in the presence of a solvent as necessary, for example at the temperature of 50-250° C. for 0.1-10 hours. By adjusting the equivalent ratio of the active hydrogen group to the epoxy group to 0.5 or above, the amine adduct (A) in which the molecular weight distribution is 7 or less can be obtained advantageously, and the equivalent ratio of 10 or less is advantageous because the recovery of the unreacted amine compound, which is carried out to adjust the content of the low molecular amine compound (B) containing in the epoxy resin hardener (H) of the present invention to a desired value, can be performed economically.

Both of superior curability and storage stability can be achieved by obtaining the microcapsulated epoxy resin hardener from a starting material of the epoxy resin hardener (H) having an average particle diameter of over 0.3 µm but 12 µm or less, defined as a median diameter and having the amine adduct (A) and the low molecular amine compound (B) as major ingredients, in which the amine adduct (A) is obtained by the reaction of the epoxy resin (e1) and an amine compound, and a weight average molecular weight of the amine adduct (A) is 150 or more but less than 8000, preferably 300-5000, more preferably 350-2500. Here, the weight average molecular weight is calculated from the molecular weight obtained as polystyrene conversion using the GPC method described above. The epoxy resin hardener (H), which can essentially be microcapsulated latent, can be obtained when the weight average molecular weight is greater than 150. If the weight average molecular weight is 8000 or greater, not only the curability becomes inferior but also the cured product property of thus obtained epoxy resin composition is inferior.

Further, both of superior curability and storage stability can be achieved by obtaining the microcapsulated epoxy resin hardener from a starting material of the epoxy resin hardener (H) having an average particle diameter of over 0.3 µm but 12 µm or less, defined as a median diameter and having the amine adduct (A) and the low molecular amine compound (B) as major ingredients, in which the amine adduct (A) is obtained by the reaction of the epoxy resin (e1) and an amine compound, and a weight average molecular weight of the epoxy resin (e1) is 150 or more but less than 5000, preferably 300-3000, more preferably 350-1500. Here, the weight average molecular weight is calculated from the molecular weight obtained as polystyrene conversion using the GPC method described above. The epoxy resin hardener (H), which can essentially be microcapsulated latent, can be obtained when the weight average molecular weight is greater than 150. If the weight average molecular weight is 5000 or greater, not only the curability becomes inferior but also the cured product property of thus obtained epoxy resin composition is inferior.

The solvent to be used as necessary in the reaction for obtaining the amine adduct (A) from the epoxy resin (e1) and an amine compound includes for example: hydrocarbons such as benzene, toluene, xylene, cyclohexane, mineral spirit and naphtha; ketones such as acetone, methylethylketone, and methylisobutylketone; esters such as ethyl acetate, n-butyl acetate and propyleneglycolmonomethyl ether acetate; alcohols such as methanol, isopropanol, n-butanol, butylcellosolve and butylcarbitol; and water, and these solvents may be used in combination. However, among the solvents used, the solvent showing an activity to the amine adduct (A) is preferable removed by distillation and the like method.

The low molecular amine compound (B) may be mixed with the amine adduct (A) after the amine adduct (A) is produced, or may be mixed before and/or during the production. Also, an unreacted material of an amine compound which is a material for the amine adduct (A) may be used as the low molecular amine compound (B).

When the microcapsulated epoxy resin hardener is formed from, as a starting material, the epoxy resin hardener (H) having a specific range of particle diameter and having the amine adduct (A) and the low molecular amine compound (B) as major ingredients, the present invention discovered that by including water in the epoxy resin hardener (H) in a specific range and by including an inert solvent (SL) in the epoxy resin hardener (H) having a specific particle diameter in a specific range, a microcapsulated epoxy resin hardener or an epoxy resin composition can be obtained without impairing the curability of one-liquid epoxy resin composition in which the microcapsulated epoxy resin hardener and/or master batch type epoxy resin hardener composition and/or epoxy resin composition have high storage stability and superior fluidity of the epoxy resin composition and have superior dispersibility when preparing the microcapsulated epoxy resin hardener and/or master batch type epoxy resin hardener composition.

That is, the epoxy resin hardener (H), which has the amine adduct (A) and the low molecular amine compounds (B) as major ingredients and has an average particle diameter of over 0.3 µm but 12 µm or less defined as a median diameter, contains 0.05-3 parts by mass of water based on 100 parts by mass of the epoxy resin hardener (H), and 0.001-3 parts by mass of an inert solvent (SL) based on 100 parts by mass of the epoxy resin hardener (H) included in the amine adduct (A).

In the present invention, the solvent (SL) is inert to the amine adduct (A) is defined as follows: when 1 mass part of the epoxy resin hardener (H), which has the amine adduct (A) and the low molecular amine compounds (B) as major ingredients and has an average particle diameter of over 0.3 µm but 12 µm or less defined as a median diameter, is mixed with 100 part of the solvent (SL) at 60° C., the epoxy resin hardener (H) is dissolved homogeneously; and in the LC analyses of the solution fractions immediately after adding 10 weight parts of the epoxy resin hardener (H) based on 100 parts by mass of the solvent (SL) and after leaving the mixture standing at 25° C. for 8 hours, the loss of amine adduct (A) to the added amount of amine adduct (A) due to the reaction of the solvent (SL) and amine adduct (A) is less than 1 mass part. The details of the LC analyses condition will be described. TOSOH Co. high speed liquid chromatography (AS-8021, Detector UV-8020, hereinafter called HPLC) and Millipore Co. Novapack C-18 column are used. The mobile phase is water/acetonitrile gradient=70/30 to 0/100. Detection wavelength is 254 nm. When a decrease of the area ratio of the absorbance of the solvent (SL) and amine adduct (A) immediately after the addition and after 8 hours of standing at 25° C. is 10% or less, the solvent (SL) is defined to be inert to the amine adduct (A).

Examples of such solvents (SL) include: hydrocarbons such as benzene, toluene, xylene, cyclohexane, mineral spirit and naphtha; ethers such as ethyleneglycol monomethyl ether and propyleneglycol monomethyl ether; alcohols such as methanol, isopropanol, n-butanol, t-butyl alcohol, butylcellosolve and butylcarbitol; and water, and these solvents may be used in combination. Especially, toluene, xylene, propyleneglycol monomethyl ether and n-butanol are preferred.

By adjusting the water content to 0.05-3 parts by mass and the solvent (SL) content to 0.001 parts by mass or more based on 100 parts by mass of the epoxy resin hardener (H), which has the amine adduct (A) and the low molecular amine compounds (B) as major ingredients and has an average particle diameter of over 0.3 µm but 12 µm or less defined as a median diameter, and in the reaction forming the shell (S) covering the core (C) made of a starting material of the epoxy resin hardener (H), by controlling aggregation each other of the core (C) and behavior of the hardener components eluted through the film of the shell (S), a superior fluidity of the epoxy resin composition to which the microcapsulated epoxy resin hardener is mixed can be obtained, and the microcapsulated epoxy resin hardener having a superior dispersibility in the mixture can also be obtained. When the solvent (SL) content is over 3 parts by mass based on 100 parts by mass of the epoxy resin hardener (H), which has the amine adduct (A) and the low molecular amine compounds (B) as major ingredients and has an average particle diameter of over 0.3 µm but 12 µm or less defined as a median diameter, there are problems of fusion of the microcapsulated epoxy resin hardener and an increase of viscosity of the epoxy resin composition combined with the microcapsulated epoxy resin hardener, and the storage stability is impaired, and fluidity and dispersibility are worsened.

The solvent (SL) included in the epoxy resin hardener (H), which has the amine adduct (A) and the low molecular amine compounds (B) as major ingredients and has an average particle diameter of over 0.3 μm but 12 μm or less defined as a median diameter, may be mixed after the fusion of the epoxy resin hardener (H), after the amine adduct (A) is produced or before and/or during the amine adduct (A) is produced, or during the process of obtaining the particles. Further, in the reaction process of the epoxy resin (e1) and an amine compound to obtain the amine adduct (A), a desired amount of the solvent to be used may be included and separated.

There are several methods for adjusting the solvent (SL) content in the epoxy resin hardener (H) of the present invention to the specific range. For example, they include a method for adjusting to desired solvent content by controlling the environment of grinding the epoxy resin hardener (H), a method by which, after melting, the epoxy resin hardener (H) is mixed and homogenized with desired solvent content, and then cooled, solidified again and ground, and a method by which, after obtaining the epoxy resin hardener (H) having a desired average particle diameter, the starting particles of the epoxy resin hardener (H) are dried in vacuo to remove the solvent until it reaches desired content.

When the microcapsulated epoxy resin hardener is formed from a starting material, an epoxy resin hardener, in which the amine adduct (A) and the low molecular amine compound (B) are the major ingredients and the average diameter defined as the median diameter is over 0.3 μm but 12 μm or less, the present inventors discovered that the microcapsulated epoxy resin hardener or the epoxy resin composition having a superior curability as well as showing a superior storage stability and solvent resistance can be obtained because the microcapsulated epoxy resin hardener is formed from particles of the starting material having a solubility of the epoxy resin hardener (H) in a liquid epoxy resin of 0.01-3 mass % determined by the solvent extraction colorimetric method.

In the present invention, the solvent extraction calorimetric method which demonstrates the behavior of the solubility is as follow: 20 parts by mass of powder particles of the epoxy resin hardener (H) having the average particle diameter defined as the median diameter is over 0.3 μm but 12 μm or less are mixed with 30 parts of a liquid epoxy resin at 25° C. and subjected to a process of stirring, mixing and dispersing homogeneously for 15 minutes, and then 20 parts by mass of xylene was added to the mixture as a solvent not dissolving the powder of the epoxy resin hardener (H). The mixture was further stirred homogeneously and filtered by suction through a 2 μm pore size PTFE made membrane filter to obtain a filtrate which is a xylene extract of the component of the epoxy resin hardener (H) dissolved in the liquid epoxy resin. To this filtrate, methanol, which is predetermined to be a solvent which dissolves the epoxy resin hardener (H) homogeneously, is used to prepare a methanol solution of the epoxy resin hardener (H), and then this methanol solution is diluted with xylene at an appropriate ratio to prepare the standard colorimetric sample for colorimetry that is a methanol/xylene mixed solution in which the epoxy resin hardener (H) is dissolved at a specific concentrations. This technique is to determine the dissolved amount of the epoxy resin hardener (H) which is dissolved in the liquid epoxy resin from the powder particles of the epoxy resin hardener (H) and extracted by xylene by comparing the hue of the extract filtrate which is obtained by suction filtration of the mixture through the PTFE membrane filter with the standard calorimetric samples of specific concentrations. In the methanol/xylene solution of the epoxy resin hardener (H), it is preferable that the ratio of methanol/xylene is prepared in the range of 0.01/100 to 10/100 and the dissolved amount of the epoxy resin hardener (H) in methanol/xylene solution is in the range of 0.005-5 mass %. Since the epoxy resin hardener (H) is not soluble in xylene alone, when preparing a high concentration standard colorimetric sample, the mixing ratio of the methanol solution of the epoxy resin hardener (H) and xylene needs to be adjusted so that deposits of the epoxy resin hardener (H) are not formed on mixing.

Since the epoxy resin hardener (H) has solubility to the liquid epoxy resin of 0.01 mass % or more by the solvent extraction colorimetric method, the epoxy resin hardener (H) has a superior curability, and since the hardener ingredients eluted through the film of the shell (S) strengthens gaps of the film of the shell (S), the epoxy resin hardener (H) performs useful functions, and as the results, the microcapsulated epoxy resin hardener and/or master batch type epoxy resin hardener (H) and/or epoxy resin composition having extremely good storage stability, solvent resistance and moisture resistance can be obtained. If the epoxy resin hardener (H) has solubility to the liquid epoxy resin of 3 mass % or more by the solvent extraction calorimetric method, when the shell (S) is formed in the reaction of forming a core (C) from a starting material of the epoxy resin hardener, in which the amine adduct (A) and the low molecular amine compound (B) are the major ingredients and the average diameter defined as the median diameter is over 0.3 μm but 12 μm or less, and forming a shell (S) covering the core (C), there are problems of fusion of the microcapsulated epoxy resin hardener and an increase of viscosity of the epoxy resin composition combined with the microcapsulated epoxy resin hardener, and the storage stability is impaired, and fluidity and dispersibility are worsened.

A liquid epoxy resin demonstrating such a solubility is preferably a polyvalent epoxy compound, which includes: bisphenol type epoxy resins that are glycidylated bisphenols such as bisphenol A, bisphenol F and bisphenol S; glycidylated compounds of 1,2-dihydroxybenzene, 1,3-dihydroxybenzene, 1,4-dihydroxybenzene, 3-methyl-1,2-dihydroxybenzene, 4-methyl-1,2-dihydroxybenzene, 1,2-dihydroxynaphthalene, 1,3-dihydroxynaphthalene, 1,4-dihydroxynaphthalene, 1,6-dihydroxynaphthalene, 2,3-dihydroxynaphthalene, 2,4-dihydroxynaphthalene, 2,6-dihydroxynaphthalene and 2,7-dihydroxynaphthalene; aliphatic ether type epoxy resins that are glycidylated multivalent alcohols such as glycerin and polyethyleneglycol. These can be used singly or in combination of 2 or more. Among them, bisphenol type epoxy resins are preferable, and further the epoxy resin that is glycidylated bisphenol A and the epoxy resin that is glycidylated bisphenol F are more preferable.

There are several methods for adjusting to a specific range the solubility of the epoxy resin hardener (H) of the present invention, in which the amine adduct (A) and the low molecular amine compound (B) are the major ingredients and the average diameter defined as the median diameter is over 0.3 μm but 12 μm or less, to the liquid epoxy resins determined by the solvent extraction colorimetric method. It is most preferable to adjust the solubility to the specific range by controlling a content of a solvent (SL) that is inert to: the molecular weight distribution and weight average molecular weight of the amine adduct (A); the contents of the low molecular amine (B) and water in the epoxy resin hardener (H); and the amine adduct (A) included in the epoxy resin hardener (H). Further, the solubility can be controlled by the particle diameter distribution, specific surface area and the particle shape, which is dependent on the grinding method, of the epoxy resin hardener (H) in which the average diameter defined as the median diameter is over 0.3 µm but 12 µm or less.

The shape of the epoxy resin hardener (H) of the present invention, in which the amine adduct (A) and the low molecular amine compound (B) are the major ingredients and the average diameter defined as the median diameter is over 0.3 µm but 12 µm or less, is preferably a solid at 25° C., that is the softening point is over 25° C. The softening point is more preferably at 40° C. or higher and still more preferably at 60° C. or higher. By using the epoxy resin hardener (H) which is a solid at 25° C. as a starting material, the microcapsulated epoxy resin hardener and/or master batch type epoxy resin hardener and/or epoxy resin composition having a high storage stability can be obtained.

The total chlorine content in the epoxy resin hardener (H) of the present invention preferably 2500 ppm or less, more preferably 2000 ppm or less, more preferably 1500 ppm or less, more preferably 800 ppm or less, more preferably 400 ppm or less, more preferably 180 ppm or less, more preferably 100 ppm or less, more preferably 80 ppm or less and still more preferably 50 ppm or less. With total chlorine content of 2500 ppm or less, the epoxy resin composition in which a curability and storage stability are in high balance can be obtained.

Further, to facilitate the control of the shell forming reaction, the total chlorine content in the epoxy resin hardener (H) is preferably 0.01 ppm or higher, more preferably 0.02 ppm or higher, more preferably 0.05 ppm or higher, more preferably 0.1 ppm or higher, more preferably 0.2 ppm or higher and still more preferably 0.5 ppm or higher. With total chlorine content of 0.1 ppm or higher, the shell forming reaction is carried out efficiently on the surface of the hardener, and the shell having a superior storage stability can be obtained.

(I-3) Shell (S)

The shell (S) of the present invention is characterized by covering the core (C) of the microcapsulated epoxy resin hardener which is formed from the epoxy resin hardener (H) as a starting material and having at least on the surface a binding group (x) absorbing infrared radiation of wave number 1630-1680 $cm^{-1}$, binding group (y) absorbing infrared radiation of wave number 1680-1725 $cm^{-1}$, and binding group (z) absorbing infrared radiation of wave number 1730-1755 $cm^{-1}$, and containing a urea bond in its structure but preferably not containing a carboxylate ester bond and more preferably not containing an ester bond except for a carbamate ester bond.

By reducing the number of the ester bonds, an impairment of the shell (S), reduction of the storage stability and lowering properties of the epoxy resin compositions after curing due to hydrolysis of the ester bond at high humidity can be controlled.

Among the binding groups (x), an especially useful group includes a urea bond. Among the binding groups (y), an especially useful group includes a Biuret bond. Also, among the binding groups (z), an especially useful group includes a urethane bond.

Here, infrared absorption can be measured using an infrared spectrophotometer, and especially using a Fourier transform infrared spectrophotometer is preferred. Further, the presence of the binding group (x), (y) and (z) at least on the surface of the core (C) of the microcapsulated epoxy resin hardener, which is formed from the epoxy resin hardener (H) as a starting material, can be determined using a microscopic FT-IR.

Further, the present invention is a microcapsulated epoxy resin hardener containing at least a core (C) and a shell (S) covering the core, characterized in that the core (C) includes an epoxy resin hardener having an amine adduct (A) and a low molecular amine compound (B) as major ingredients as a starting material, and the shell (S) includes reaction products of any of two or more of an isocyanate compound, active hydrogen compound, epoxy resin hardener (h2), epoxy resin (e2) and low molecular amine compound (B).

Here, the isocyanate compound that can be used includes the isocyanate compounds described as examples of the materials for the amine adduct (A) that is one of the major ingredients of the core (C) described above.

Further, the active hydrogen compound includes water, compounds having at least one primary amino group and/or secondary amino group, compounds having at least one hydroxy group and the like, preferably having no carboxylate ester bond and more preferably no ester bond except for a carbamate ester bond in the structure thereof. These may be used in combination.

An aliphatic amine, alicyclic amine and aromatic amine can be used as the compound having at least one primary amino group and/or secondary amino group.

The aliphatic amine includes: alkyl amines such as methylamine, ethylamine, propylamine, butylamine and dibutylamine; alkylene diamines such as ethylenediamine, propylenediamine, butylenediamine and hexamethylenediamine; polyalkylenepolyamines such as diethylenetriamine, triethylenetetramine and tetraetylenepentamine; polyoxyalkylenepolyamines such as polyoxypropylenediamine and polyoxydtylenediamine.

The alicyclic amine includes, cyclopropylamine, cyclobutylamine, cyclopentylamine, cyclohexylamine, isophoronediamine and the like.

The aromatic amine includes aniline, toluidine, benzylamine, naphthylamine, diaminophenylmethane, diaminophenylsulfone and the like.

The compound having at least one hydroxy group includes an alcohol compound, phenol compound and the like.

The alcohol compound includes: monoalcohols such as methyl alcohol, propyl alcohol, butyl alcohol, amyl alcohol, hexyl alcohol, heptyl alcohol, octyl alcohol, nonyl alcohol, decyl alcohol, undecyl alcohol, lauryl alcohol, dodecyl alcohol, stearyl alcohol, eicosyl alcohol, allyl alcohol, crotyl alcohol, propargyl alcohol, cyclopentanol, cyclohexanol, benzyl alcohol, cinnamyl alcohol, ethyleneglycol monomethyl ether, ethyleneglycol monoethyl ether and diethyleneglycol monobutyl; polyvalent alcohols such as ethyleneglycol, polyethyleneglycol, propyleneglycol, polypropyleneglycol, 1,3-butanediol, 1,4-butanediol, hydrogenated bisphenol A, neopentylglycol, glycerine, trimethylolpropane and pentaerythritol. In addition, the polyvalent alcohols include a compound having in one molecule 2 or more secondary hydroxy groups, which are obtained by a reaction of a compound having at least one epoxy group and a compound having at least one hydroxy group, carboxyl group, primary or secondary amino group and mercapto group. These alcohol compounds can be any of the primary, secondary or tertiary alcohol.

Phenol compounds includes, for example; monophenols such as phenol, cresol, xyrenol, carvacrol, thymol and naphthol; and polyvalent phenols such as catechol, resorcin, hydroquinone, bisphenol A, bisphenol F, pyrogallol and phloroglucinol.

The polyvalent alcohols and polyvalent phenols are preferred, and especially the polyvalent alcohols are preferred as these compounds having at least one hydroxy group.

As the epoxy resin hardener (h2) can be used are those described as examples of the epoxy resin hardener (H) having the amine adduct (A) described above and the low molecular amine compound (B) as major ingredients.

The epoxy resin hardener (h2) can be the same or different from the epoxy resin hardener (H) which is the starting material for the core (C), but preferably the same.

Further, as the epoxy resins (e2) can be used are polyvalent epoxy compounds described as examples of the epoxy resin (e1) which can be a material for the amine adduct (A) which is the main component of the epoxy resin hardener (H), a starting material of the core (C) described above.

In addition, the epoxy resin (e2) can be the same or different from the epoxy resin (e1), which is the material of the amine adduct (A) of the main component of the epoxy resin hardener (H) that is a starting material of the core (C) described above, and the epoxy resin (e3), which is included in the master batch type epoxy resin hardener composition described below.

These epoxy resins may be used singly or in combination.

Epoxy resins, usually, have impure termini in the molecule to which chlorine is bound but these impure termini have a bad effect on electric properties of the cured products.

Therefore, the total chlorine content in the epoxy resin (e2) is preferably 2,500 ppm or less, more preferably 1,500 ppm or less and still more preferably 500 ppm or less.

Such reaction products of any two or more of an isocyanate compound, active hydrogen compound, epoxy resin hardener (h2), epoxy resins (e2) and low molecular amine compound (B) have a urea bond, but preferably no carboxylate ester bond, more preferably have no ester bond except for a carbamate ester bond and still more preferably have a Biuret bond and urethane bond.

The reaction of any two or more of an isocyanate compound, active hydrogen compound, epoxy resin hardener (h2), epoxy resin (e2) and low molecular amine compound (B) is normally carried out at a temperature range of −10-150° C. for 10 minutes-12 hours of the reaction time. As necessary the reaction can be carried out in a dispersion medium. The dispersion medium includes solvents, plasticizers, resins and the like. The solvents include: hydrocarbons such as benzene, toluene, xylene, cyclohexane, mineral spirit and naphtha; ketones such as acetone, methylethylketone and methylisobutylketone; esters such as ethyl acetate, n-butyl acetate and propyleneglycol monomethylethyl ether acetate; alcohols such as methanol, isopropanol, n-butanol, butylcellosolve and butylcarbitol; and water. The plasticizers include: phathalic acid diesters such as dibutyl phthalate and di(2-ethylhexyl) phthalate; aliphatic dibasic acid esters such as di(2-ethylhexyl)adipate; triester phosphates such as tricredyl phosphate; glycol esters such as polyethyleneglycol ester. The resins include silicone resins, epoxy resins, phenol resins and the like.

Among them, the reaction of the epoxy resin (e2) and the epoxy resin hardener (h2) is carried out normally in a temperature range of −10-150° C., preferably 0-100° C. for 1-168 hours, preferably 2-72 hours of the reaction time and can be carried out in a dispersion medium. An examples of the dispersion medium includes solvents, plasticizer and the like.

Solvents and plasticizers that can be used have been described as examples that can be used in the reaction of any of two or more of the isocyanate compounds, active hydrogen compounds, epoxy resin hardener (h2), epoxy resin (e2) and low molecular amine compound (B) described above.

Methods for forming the shell (S) covering the core (C), formed from, as a starting material, particles having an average particle diameter of over 0.3 µm but 12 µm or less, defined as a median diameter, which are made of an epoxy resin hardener (H) having an amine adduct (A) and a low molecular amine compound (B) as major ingredients, include but not limited to a method for depositing the shell (S) on the surface of the epoxy resin hardener (H) by dissolving an ingredient of the shell (S) to a solvent, which is a dispersion medium, dispersing particles of the epoxy resin hardener (H) into the dispersion medium and by reducing a solubility of the ingredient of the shell (S), a method for depositing on particles of a starting material by dispersing the epoxy resin hardener (H) particles which is the starting material of the core (C) into the dispersion medium and by adding a material forming the shell to this dispersion medium, and a method for generating the shell forming material on the surface of the starting material particles where the reaction is carried out by adding a source of the shell generating material to the dispersion medium. The latter 2 methods are preferred because the reaction and covering are carried out at the same time.

The dispersion medium includes a solvent, plasticizer, resin and the like.

The solvents, plasticizers and resins that can be used are those described as the examples of the solvents, plasticizers and resins that can be used in the reactions of the isocyanate compounds and active hydrogen compound described above.

Here, when an epoxy resin is used as a dispersion medium, a master batch type epoxy resin hardener composition can be obtained at the same time as the shell formation.

The shell (S) forming reaction is normally carried out at a temperature range of −10-150° C., preferably 0-100° C. for a reaction time of 10 minutes-24 hours, preferably 2-10 hours.

(I-4) Volume Ratio

In the present invention, the microcapsulated epoxy resin hardener contains at least a core (C) and a shell (S) covering the core, wherein the core (C) is formed from, as a starting material, particles having an average particle diameter of over 0.3 µm but 12 µm or less, defined as a median diameter, which are made of an epoxy resin hardener (H) having an amine adduct (A) and a low molecular amine compound (B) as major ingredients, and the shell (S) contains on a surface at least a binding group (x) absorbing infrared radiation of wave number 1630-1680 cm$^{-1}$, binding group (y) absorbing infrared radiation of wave number 1680-1725 cm$^{-1}$, binding group (z) absorbing infrared radiation of wave number 1730-1755 cm$^{-1}$ and a resin having a urea bond but preferably no carboxylate ester group, and more preferably having no ester bond except a carbamate ester bond, and the volume ratio of the core (C) and the shell (S) is preferably 100:1 to 100:50, more preferably 100:1 to 100:20 and still more preferably 100:1 to 100:10.

If the volume ratio of the shell (S) to 100 volumes of the core (C) is smaller than 1, the storage stability is reduced. Further, if the ratio is greater than 50, it was found that not only the curability was reduced as normally expected but also when a master batch type hardener composition was obtained using the microcapsulated epoxy resin hardener the ratio of which is greater than 50, the storage stability and dispersibility of the master batch type epoxy resin hardener to an epoxy resin on mixing is reduced.

Here, the volume ratio is based on the following core (C) volume and shell (S) volume calculated from the average particle diameter (r) and average thickness of the shell (d) of the microcapsulated epoxy resin hardener obtained by an analysis of a transmission electron micrographic (TEM) observation by an image analysis software.

$$Core(C)\text{volume} = 4/3 \cdot \pi \cdot ((r-d)/2)^3$$

$$Shell(S)\text{volume} = 4/3 \cdot \pi \cdot ((r)/2)^3 - 4/3 \cdot \pi \cdot ((r-d)/2)^3$$

wherein π is the ratio of the circumference of a circle to its diameter.

In the present invention, methods for making the volume ratio of the core (C) to the shell (S) to a desired range includes a method of controlling the amount of input material forming the shell (S), a method of controlling the reaction between the epoxy resin hardener (H) seeping out of gaps of the film of the shell (S) and the epoxy resin (e2) that react when the shell (S) is formed, and the like.

There are several methods for adjusting the volume ratio of the core (C) to the shell (S) of the present invention to a specific range, and in the method of forming the shell (S) with which covers the core (C), a method of controlling the ratio of the added amount of the material that forms the shell (S), a method of controlling the temperature and/or time for forming the shell (S) and the like are included.

(I-5) Ratio of Functional Groups

For the functional groups present on the surface of the microcapsulated epoxy resin hardener of the present invention, the core (C) is formed from, as a starting material, particles having an average particle diameter of over 0.3 μm but 12 μm or less, defined as a median diameter, which are made of an epoxy resin hardener (H) having an amine adduct (A) and a low molecular amine compound (B) as major ingredients, and the water content of the epoxy resin hardener (H) is 0.05-3 parts by mass based on 100 parts by mass of the epoxy resin hardener (H), and the shell (S) contains on a surface at least a binding group (x) absorbing infrared radiation of wave number 1630-1680 cm$^{-1}$, binding group (y) absorbing infrared radiation of wave number 1680-1725 cm$^{-1}$, and binding group (z) absorbing infrared radiation of wave number 1730-1755 cm$^{-1}$, and the shell (S) contains preferably no carboxylate ester group, more preferably contains essentially no ester bond except for a carbamate ester bond, and the binding groups (x), (y) and (z) which the shell (S) contains are a urea group, biuret group and urethane group, respectively, and it is characterized in that a concentration ratio of the binding group (x) to a total concentration of the binding groups (x), (y) and (z) (=x/(x+y+z)) is 0.50-0.75. If the concentration ratio is smaller than 0.50, the products are inferior in solvent resistance. Further, if the concentration ratio is greater than 0.75, in the shell forming reaction fusion and aggregation tend to occur among the particles of the epoxy resin hardener (H) each other, and it is becoming difficult to control the epoxy resin hardener (H) with stable quality.

In addition, the shell (S) of the present invention is characterized by having a urea group, biuret group and urethane group, but preferably no carboxylate ester group, more preferably no ester group except for a carbamate ester group. If the carboxylate ester group is present, at a high humidity hydrolysis of the ester bond causes impairment of the shell (S), reduction of storage stability and humidity resistance as well as lowering of the physical properties of the epoxy resin composition after curing.

Further, on the surface of the core (C) of the microcapsulated epoxy resin hardener of the present invention formed from, as a starting material, particles having an average particle diameter of over 0.3 μm but 12 μm or less, defined as a median diameter, which are made of an epoxy resin hardener (H) having an amine adduct (A) and a low molecular amine compound (B) as major ingredients, the binding group (x) and binding group (y) are preferably present in a concentration range of 1-1000 meq/kg and 1-1000 meq/kg, respectively. Here, the concentration is the value to the microcapsulated epoxy resin hardener. The concentration of the binding group (x) of 1 meq/kg or higher is advantageous to obtain the microcapsulated epoxy resin hardener having a high resistance to a mechanical shearing force. Also, at 1000 meq/kg or less, it is advantageous to obtain a high curability. More preferable concentration range of the binding group (x) is 10-300 meq/kg.

The concentration of the binding group (y) of 1 meq/kg or higher is advantageous to obtain the microcapsulated epoxy resin hardener having a high resistance to a mechanical shearing force. Also, at 1000 meq/kg or less, it is advantageous to obtain a high curability. More preferable concentration range of the binding group (y) is 10-200 meq/kg.

The preferable concentration range of the binding group (z) is 1-200 mg/kg. The concentration of the binding group (z) of 1 meq/kg or higher is advantageous for forming a shell having a high resistance to a mechanical shearing force, and at 200 meq/kg or less, it is advantageous to obtain a high curability. More preferable concentration range of the binding group (z) is 5-100 meq/kg.

Quantitative determination of the concentration of the binding group (x), binding group (y) and binding group (z) and the concentration ratio of the binding groups can be carried out by the method described below. First, for preparing the standard curve for the quantitative determination of the binding group (x), (y) and (z), tetramethylsuccinonitrile was prepared as a standard substance using FT/IR-410 made by JASCO Co.

[Formula 1]

Standard Substance

Tetramethylsuccinonitrile

Further, model compound (1) which has the binding group (x) having an absorption at 1630-1680 cm$^{-1}$ but neither (y) no (z),

[Formula 2]

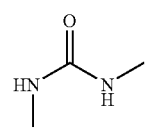

Urea bond (x)

Model compound (1)

similarly, model compound (2) which has the binding group (y) having an absorption band at 1680-1725 cm$^{-1}$ but neither (x) no (z),

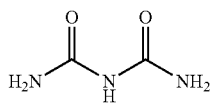

Biuret bond (y)
Model compound (2)

and model compound (3) which has the binding group (z) having an absorption band at 1730-1755 cm$^{-1}$ but neither (x) nor (y),

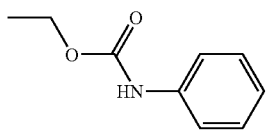

Urethane bond (2)
Model compound (3)

are prepared. And then, a mixture, in which each of the standard substance, model compound (1), (2) and (3) are exactly weighed and mixed at an arbitrary ratio, is ground together with KBr powder and a standard sample tablet for FT/IR measurement is prepared using a tablet press. To an area of the absorption band of 2240-2260 cm$^{-1}$ of the standard substance, tetramethylsuccinonitrile, an area ratio of the absorption band of 1630-1680 cm$^{-1}$ of model compound (1) is obtained. That is, the mass ratio in the standard sample, which is the mixture of model compound (1) and the standard sample, is plotted on the vertical axis, and the ratio of the area of the absorption band of 1630-1680 cm$^{-1}$ of model compound (1) to the area of the absorption band of 2240-2260 cm$^{-1}$ of the standard substance, tetramethylsuccinonitrile, is plotted on the horizontal axis, and the standard curve is prepared from the relation between the area ratio of the infrared absorption bands and the mass ratio of the ingredients using linear regression. Similarly, for model compound (2) and (3), the standard curves are prepared from the relation between the area ratio of the infrared absorption bands and the mass ratio of the ingredients using linear regression. Model compounds (1), (2), (3) and the standard substance, tetramethylsuccinonitrile used were reagent grade and obtained from Tokyo Chemical Industry Co. Ltd.

Next, measurement of concentration ratio of the binding group (x), (y) and (z) is shown. First, the microcapsulated epoxy resin hardener is dried at 40° C. in vacuo and weighed. Also, the capsule film obtained from the microcapsulated epoxy resin hardener is dried at 40° C. in vacuo and the weight of the capsule film separated from the microcapsulated epoxy resin hardener is measured. The method for separating the capsule film from the microcapsulated epoxy resin hardener includes a step of repeated wash and filtration of the microcapsulated epoxy resin hardener using methanol until the epoxy resin hardener disappears and a step of removing methanol completely at a temperature of 50° C. or lower. To 3 g of this sample, 10 mg of the standard substance, tetramethylsuccinonitrile is added, mixed and ground in an agate mortar, and then 2 mg of the mixture is ground together with 50 mg of KBr powder, and a tablet for FT/IR measurement is prepared using a tablet press. Using this tablet an infrared spectra is obtained using FT/IR-410 made by JASCO Co. Concentrations of the binding group, respectively in the sample from thus obtained spectra chart and the previously prepared standard curve to obtain a concentration of the binding groups per 1 kg of microcapsulated epoxy resin hardener and a concentration ratio between (x), (y) and (z).

In the present invention, methods for adjusting the concentration ratio (=x/(x+y+z)) of the total of the binding group (x), (y) and (z) contained in the shell (S) to a desired range includes: a method of controlling the amount of input of isocyanate compounds, active hydrogen compounds, epoxy resin hardener (h2), epoxy resin (e2) and low molecular amine compound (B) in the reaction for forming the shell (S); a method for controlling the ratio of each material; a method of controlling the temperature and/or time of the shell forming reaction; and the like. Especially, it is important to control the input of isocyanate compounds which is used to generate a urea bond and biuret bond, and the compounds having one or more hydroxy groups in one molecule which is used to generate a urethane bond. The isocyanate compounds and the compound having one or more hydroxy groups in one molecule, which have been described earlier for the materials of the amine adduct (A) and for the active hydrogen compounds, can be used.

II. Master Batch Type Epoxy Resin Hardener Composition

The master batch type epoxy resin hardener composition of the present invention contains the epoxy resin (e3) and the microcapsulated epoxy resin hardener and the weight ratio is 100:0.1 to 100:1000.

The master batch type epoxy resin hardener composition of the present invention is preferably liquid at room temperature or a paste having a viscosity of 50 mPa·s-10,000,000 mPa·s at 25° C. The lower is the viscosity, the higher is the workability, and it is preferred because an amount attached to a container is lower and waste can be reduced.

The epoxy resin (e3) and the method for producing the same will be described in detail as follows.

(II-1) Epoxy Resin (e3)

The polyvalent epoxy compounds described as examples of epoxy resin (e1) that becomes a material for the amine adduct (A) included as an major ingredient in the epoxy resin hardener (H), which is the starting material of the aforementioned core (C), can be used as the epoxy resin (e3). These epoxy resins may be used singly or in combination.

Among these, an epoxy resin that is a glycidylated polyvalent phenols is preferred, especially a bisphenol type epoxy resin is preferred from the view point of adhesiveness and heat resistance of the cured products thus obtained. Especially the glycidylated product of bisphenol A and glycidylated product of bisphenol F are preferred.

As described above, the impure termini to which chlorine in the molecular of the epoxy resin is bound have a bad effect on electrical properties of the cured products, and therefore the total amount of chlorine of the epoxy resin (e3) included in the master batch type epoxy resin hardener composition of the present invention is preferably 2500 ppm or less, more preferably 1500 ppm or less, still more preferably 500 ppm or less.

Further, the total amount of chlorine not only in the epoxy resin (e3) but also in the entire master batch type epoxy resin hardener composition is preferably 2500 ppm or less.

Still further, the diol termini impure component of the epoxy resin (e3) is preferably 0.001-30 weight % of the basic structural component of the epoxy resin (e3).

Here, the diol termini impure component is an epoxy resin, in the structure of which either one or both of the terminal epoxy groups have a ring opening and 1,2-glycol is formed.

"A review of Epoxy Resin, Vol. 1 Fundamentals I" published by The Japan Society of Epoxy Resin Technology is cited as a reference. For the basic structure components of the epoxy resin (e3) and the analytical method for the diol termini impure components, the analysis is carried out according to the method described in the literatures cited in the same "A review of Epoxy Resin, Vol. 1 Fundamentals I" published by The Japan Society of Epoxy Resin Technology.

When the ratio of the diol termini impure component of the epoxy resin (e3) to the basic structural components of the epoxy resin (e3) is greater than 30 mass %, water resistance of the cured product may be decreased and when it is less than 0.001 mass %, the curability of the epoxy resin composition may be decreased. From these viewpoint, the ratio of the diol termini impure component of the epoxy resin (e3) to the basic structural components of the epoxy resin (e3) is preferably 0.01-25 mass %, more preferably 0.1-20 mass %, particularly preferably 0.5-18 mass %, especially preferably 1.2-15 mass %.

The ratio of the diol termini impure component of the epoxy resin (e3) of the present invention to the basic structural components of the epoxy resin (e3) can be obtained by the method according to Examples.

(II-2) Method for the Production

The method for producing the master batch type epoxy resin hardener of the present invention includes: a method of dispersing the microcapsulated epoxy resin hardener into the epoxy resin (e3) using 3 rolls and the like; and a method of performing the shell (S) producing reaction on the surface of the epoxy resin hardener (H) in the epoxy resin (e3) to obtain the microcapsulated epoxy resin hardener and at the same time to obtain the master batch type epoxy resin hardener. The latter has a higher productivity and is preferred.

III. One-Liquid Epoxy Resin Composition

The master batch type epoxy resin hardener composition of the present invention can be made into a one-liquid epoxy resin composition by diluting further with an epoxy resin.

The preferable one-liquid epoxy resin composition contains epoxy resin (e4) and the master batch type epoxy resin hardener composition of the present invention, and the weight ratio is 100:0.01 to 100:1000. Here, the polyvalent epoxy compounds described as examples of epoxy resin (e1) that becomes a material for the amine adduct (A) included as an major ingredient in the epoxy resin hardener (H), which is the starting material of the aforementioned core (C), can be used as epoxy resin (e4). The examples described as the method for producing the master batch type epoxy resin hardener composition can also be used.

IV. Additive

The master batch type epoxy resin hardener composition and one-liquid epoxy resin composition of the present invention can contain, as long as the functions are not decreased, additives such as expanders, reinforcement materials, fillers, pigments, electroconductive fine particles, organic solvents, reactive diluents, nonreactive diluents, resins, crystalline alcohols and coupling agents. Examples of fillers include coal tar, glass fiber, asbestos fiber, boron fiber, carbon fiber, cellulose, polyethylene powder, polypropylene powder, quartz powder, mineral silicate, mica, asbestos powder and slate powder. Examples of pigments include kaolin, aluminum oxide 3 hydrate, aluminum hydroxide, chalk powder, gypsum, calcium carbonate, antimony trioxide, penton, silica, aerosol, lithopone, barite and titanium dioxide. Examples of electroconductive fine particles include carbon black, graphite, carbon nanotube, fullerene, iron oxide, gold, silver, aluminum powder, iron powder, nickel, copper, zinc, chromium, solder, nanosize metal crystals, intermetallic compound, and any of these are used effectively according to their use. The organic solvents include, for example, toluene, xylene, methylethylketone, methylisobutylketone, ethyl acetate and butyl acetate. The reactive diluents include, for example, butylglycidyl ether, N,N'-glycidyl-o-toluidine, phenylglycidyl ether, styrene oxide, ethyleneglycoldiglycidyl ether, propyleneglycoldiglycidyl ether and 1,6-hexanedioldiglycidyl ether. The nonreactive diluents include, for example, dioctyl phthalate, dibutyl phthalate, dioctyl adipate and petroleum solvents. The resins include, for example, polyester resin, polyurethane resin, acrylic resin, polyether resin, melamine resin and denatured epoxy resins such as urethane-denatured epoxy resin, rubber-denatured epoxy resin and alkyd-denatured epoxy resin. The crystalline alcohols include 1,2-cyclohexanediol, 1,3-cyclohexanediol, 1,4-cyclohexanediol, pentaerythritol, sorbitol, sucrose and trimethylolpropane. The content of other additives is preferably less than 30 weight %.

Such other additives include the epoxy resin hardener (h3).

Those examples of the epoxy resin hardener (H), which is the starting material of the aforementioned core (C), as well as anything that can be used as an epoxy resin hardener in general can be used as the epoxy resin hardener (h3), but in particular at least one kind of epoxy resin hardener selected from the group consisting of acid anhydride hardeners, phenol hardeners, hydrazide hardeners and guanidine hardeners is preferred.

The acid anhydride hardeners include phthalic acid anhydride, trimellitic acid anhydride, pyromellitic acid anhydride, hexahydrophthalic acid anhydride, tetrahydrophthalic acid anhydride, 3-chlorophthalic acid anhydride, 4-chlorophthalic acid anhydride, benzophenontetracarboxylic acid anhydride, succinic acid anhydride, methylsuccinic acid anhydride, dimethylsuccinic acid anhydride, dichlorosuccinic acid anhydride, methylnadic acid, dodecylsuccinic acid, chlorendic acid anhydride, maleic acid anhydride and the like.

The phenol hardeners include phenol novolac, cresol novolac, bisphenol A novolac and the like.

The hydrazide hardeners include succinic acid dihydrazide, adipic acid dihydrazide, phthalic acid dihydrazide, isophthalic acid dihydrazide, terephthalic acid dihydrazide, p-oxybenzoic acid hydrazide, salicylic acid hydrazide, phenylaminopropionic acid hydrazide, maleic acid dihydrazide and the like.

The guanidine hardeners include dicyandiamide, methylguanidine, ethylguanidine, propylguanidine, butylguanidine, dimethylguanidine, trimethylguanidine, phenylguanidine, diphenylguanidine, toluoylguanidine and the like.

Here, the epoxy resin hardener (h3) may be the same as the epoxy resin hardener (H) which is a starting material of the core (C) but preferably different.

Also, to improve the storage stability of the composition, a cyclic borate ester compound can be added.

The cyclic borate ester compound contains a boron in a ring structure and particularly 2,2'-oxybis(5,5'-dimethyl-1,3,2-oxaborinane) is preferred.

A content of the cyclic borate ester compound is preferably 0.001-10 weight % to the master batch type epoxy resin hardener or the one-liquid epoxy resin composition.

The master batch type epoxy resin hardener or the one-liquid epoxy resin composition of the present invention can be applied to any use in the forms of paste and film.

In particular, they are useful as adhesives and/or pastes for bonding and films for bonding as well electroconductive materials, anisotropic conductive materials, insulating materials, sealing materials, coating materials, paint compositions, prepreg, heat conductive materials, sealing materials for fuel cells and the like.

The adhesives and/or pastes for bonding and films for bonding are useful as materials for liquid adhesives, film form adhesives and dye-bondings. Methods for producing the film form adhesives are described in, for example, JP-A-62-141083 and JP-A-05-295329. More concretely, solid epoxy resin, liquid epoxy resin and also solid urethane resin are dissolved, mixed and dispersed in toluene to 50 weight % to prepare a solution. A varnish is prepared by adding and dispersing the master batch type epoxy resin hardener composition to this solution to 30 weight %. This solution is applied to, for example, a polyethylene terephthalate base with a 50 μm thickness for peeling off so that the thickness after drying toluene is 30 μm. By drying toluene, a film for bonding can be obtained that is inactive at normal temperature, but adhesiveness is expressed by heating due to the effect of the latent hardener.

The electroconductive materials include electroconductive films, electroconductive pastes and the like. The anisotropic conductive materials include anisotropic conductive films, anisotropic conductive pastes and the like. The methods for producing these are, for example, described in JP-A-01-113480. More concretely, for example, in the production of the film for bonding described above, these can be produced by mixing and dispersing the electroconductive and anisotropic conductive materials at the step of varnish preparation, followed by application to a base for peeling and then drying. As electroconductive particles, metal particles such as solder particles, nickel particles, nanosize metal crystals, metal particles covered with another metal and slanted particles of copper and silver, and for example, resin particles of styrene resin, urethane resin, melamine resin, epoxy resin, acryl resin, phenol resin and styrene-butadiene resin coated with thin electroconductive film of gold, nickel, silver, copper and solder are used. In general, the electroconductive particles are spherical fine particles of about 1-20 μm. The base for preparing film includes, for example, polyester, polyethylene, polyimide and polytetrafluoroethylene, and a method for preparing film involves application to the base and then drying the solvent.

The insulating materials include insulating adhesive films and insulating adhesive pastes. By using the film for bonding described above, the insulating adhesive films that are insulating materials can be obtained. Further, the insulating adhesive paste can be obtained, not only by using the sealing materials but also by mixing an insulating fillers among the fillers described above.

The useful sealing materials include solid sealing materials, liquid sealing materials and film sealing materials, and the liquid sealing materials are useful as an underfill material, potting material, dam material and the like. Methods for producing the sealing materials are described, for example, in JP-A-5-43661 and JP-A-2002-226675 as sealing and immersion molding materials for electric and electronic parts. More concretely, bisphenol A type epoxy resin, a hardener, for example, an acid hydride hardener such as methylhexahydrophthalic acid anhydride, and in addition, spherical fused silica powder are mixed homogeneously, to which the master batch type epoxy resin hardener composition obtained in the present invention is added and mixed homogeneously to obtain the sealing material.

The coating materials include, for example, coating materials for electronic materials, overcoat materials for printed wiring board cover, layer insulating resin composition for printed wiring plates. Methods for producing coating materials includes various methods described JP-B-4-6116 in JP-A-7-304931, JP-A-8-64960, JP-A-2003-246838 and the like. More concretely, by selecting silica and the like as a filler from the filling agents, mixing a bisphenol A type epoxy resin and other phenoxy resin, rubber denatured epoxy resin and the like, and further mixing the master batch type hardener for epoxy resin composition of the present invention, a 50% solution is prepared with MEK. This is applied to a polyimide film at a thickness of 50 μm, and a copper film is overlaid on top of it, and lamination is carried out at a temperature of 60-150° C. This laminate is heat cured at 180-200° C. to obtain a layered plate in which each layer is coated with an epoxy resin composition.

Methods for producing the paint composition include, for example, methods described in JP-A-11-323247, JP-A-2005-113103 and the like. More concretely, bisphenol A type epoxy resin is mixed with titanium dioxide, talc and the like, and 1:1 mixed solvents of MIBK/xylene is added, stirred and mixed to prepare a main formulation. To these the master batch type epoxy resin hardener composition of the present invention is added and dispersed homogeneously to obtain the epoxy paint composition.

Methods for producing the prepreg include, for example, the method described in JP-A-09-71633, WO98/44017 pamphlet and the like and they can be obtained by impregnating an epoxy resin composition to a support base and by heating. The solvent for the impregnating varnish includes methylethylketone, acetone, ethylcellosolve, methanol, ethanol, isopropyl alcohol and the like, and preferably these solvents do not remain in the prepreg. Further, the support base is not particularly limited, but examples include paper, glass cloth, glass unwoven cloth, aramid cloth, liquid crystal polymer and the like. The ratio of the resin composition and the support base is not particularly limited, but normally the resin in the prepreg is preferably adjusted to 20-80 weight %.

Methods for producing the heat conducting materials include, for example, JP-A-06-136244, JP-A-10-237410, JP-A-2000-3987 and the like. More concretely, epoxy resin as a heat curing resin, phenol novolac hardener as a hardener and graphite powder as a heat conducting filler are mixed and mulled homogeneously. To this the master batch type epoxy resin hardener composition of the present invention is mixed, and the heat conductive resin paste can be obtained.

Method for producing the sealing materials for fuel cells includes JP-A-2002-332328, JP-A-2004-75954 and the like. More concretely, using an artificial graphite material as an electroconductive material, and a liquid epoxy resin, biphenyl type epoxy resin, resol type phenol resin or novolac type phenol resin as a heat curing resin, the materials are mixed by a mixer and to the mixture the master batch type epoxy resin hardener composition of the present invention is added and dispersed homogeneously to obtain the sealing materials for fuel cells. This molding material composition is compression molded at a die temperature of 170-190° C. and molding pressure of 150-300 kg/cm$^2$ to obtain the sealing material for fuel cell having a superior practical electroconductivity as well as good impermeability to gases and superior moldability.

EXAMPLES

The present invention is described concretely by Examples and Comparative Examples as follows, but the present invention is not limited by these.

Measurements and evaluations in Examples and Comparative Examples below were performed as follows.

(1) Epoxy Equivalent

This is a mass (g) of an epoxy resin containing 1 equivalent of the epoxy group, and is determined according to JIS K-7236.

(2) Total Chlorine Amount of Epoxy Resin

One g of a sample was dissolved in 25 ml of ethyleneglycol monobutyl ether, to which 25 ml of propylene glycol solution in 1 N KOH was added, and the mixture was boiled for 20 minutes and then titrated with an aqueous solution of silver nitrate.

(3) Hydrolyzable Chlorine Amount of Epoxy Resin

Three grams of a sample was dissolved in 50 ml toluene, to which 20 ml of methanol solution of 0.1 N KOH was added, and the mixture was boiled for 15 minutes and then titrated with an aqueous solution of silver nitrate.

(4) Total Chlorine Amount of Master Batch Type Epoxy Resin Hardener Composition

The master batch type epoxy resin hardener composition was repeatedly washed and filtered using xylene until epoxy resin was completely removed. Next, the filtrate was distilled at a temperature of 100° C. or lower under reduced pressure to obtain epoxy resin. 1-10 g of thus obtained epoxy resin sample was accurately weighed so that the titration volume was 3-7 ml, and dissolved in 25 ml of ethyleneglycol monobutyl ether, to which 25 ml of propylene glycol solution in 1N KOH was added, and the mixture was boiled for 20 minutes and then titrated with an aqueous solution of silver nitrate.

(5) Quantitative Measurement of Basic Structural Component of Epoxy Resin (e3) of the Master Batch Type Epoxy Resin Hardener Composition The master batch type epoxy resin hardener composition is repeatedly washed and filtered using xylene until epoxy resin is completely removed. Next, the filtrate is distilled at a temperature of 100° C. or lower under reduced pressure to obtain epoxy resin.

The epoxy resin thus obtained is analyzed and quantitated by the following method. A high speed liquid chromatography (AS-8021, Detector UV-8020, herein after called HPLC) made by Tosoh Co. and a column Novapack C-18, made by Milliopore Co are used. Mobile phase is gradiented with water/actonitrile=70/30 to 0/100. The detection wave length is 254 nm. Fractions are collected using a switching valve for the separation liquid selecting a separation condition by the difference of the structures of the both termini by a HPLC analysis. Each of the fractionated separation solution is distilled under reduced pressure, and the residue is analyzed by MS. In the MS spectra, among the standard peaks having a difference of 18 in the mass number, the one which is smaller by 18 is regarded as the basic structural component. For this basic structural component, the content of the basic structural component of epoxy resin (e3) of the master batch type epoxy resin hardener composition is calculated from the area ratio obtained from the peak intensity on the HPLC analysis chart.

(6) Diol Termini Impurity Amount of Epoxy Resin (e3) of the Master Batch Type Epoxy Resin Hardener Composition The master batch type epoxy resin hardener composition is repeatedly washed and filtered using xylene until epoxy resin is completely removed. Next, the filtrate is distilled at a temperature of 100° C. or lower under reduced pressure to obtain epoxy resin.

The epoxy resin thus obtained was analyzed and quantitated by the following method. A high speed liquid chromatography (AS-8021, Detector UV-8020, herein after called HPLC) made by Tosoh Co. and a column Novapack C-18, made by Milliopore Co are used. Mobile phase is gradiented with water/actonitrile=70/30 to 0/100. The detection wave length is 254 nm. Fractions are collected using a switching valve for the separation liquid selecting a separation condition by the difference of the structures of the both termini by a HPLC analysis. Each of the fractionated separation solution is distilled under reduced pressure, and the residue is analyzed by MS. In the MS spectra, among the standard peaks having a difference of 18 in the mass number, the one which is smaller by 18 is regarded as the basic structural component and the other which is larger by 18 is regarded as the diol termini impurity component. From the ratio of the area indicating the peak intensity of the diol termini impurity component and the area indicating the peak intensity of the basic structural component in the HPLC analysis chart, the content of diol termini impurity component to the basic structural component of epoxy resin (e3) of the master batch type epoxy resin hardener composition is calculated.

(7) Average Particle Diameter of the Epoxy Resin Hardener (H)

Four milligrams of the epoxy resin hardener (H) in particle powder form was placed in 32 g of cyclohexane solution of 0.1 weight % surface activating agent (Aerosol OT-75, made by Mitsui SciTech Co.) and dispersed by irradiating ultrasonic for 5 minutes with a Ultrasonic Cleaner (MODEL W-211, Honda Electronics Co.). The water temperature of the Ultrasonic Cleaner at the time was adjusted at 19±2° C. A part of thus obtained dispersion solution was subjected to a particle size distribution measurement using a HORIBA LA-920 (a particle distribution meter, Horiba Co.) and based on this the average particle diameter was calculated.

(8) Viscosity

Viscosity was measured at 25° C. using a BM type viscometer.

(9) Softening Point

Softening point was measured according to JIS K-7234 (ring and ball method).

(10) Molecular Weight Distribution

Gel permission chromatography was performed using HLC8220GPC (Detector: RI) made by Tosoh Co. under the condition, column: two columns of PLgel 3μ MIXED-E (Polymer Laboratory Inc.), elution solution: 1% lithium bromide solution in dimethylformamide, standard curve: polystyrene, and the molecular weight distribution was shown as a value of the weight average molecular weight divided by the number average molecular weight.

(11) Measurement of Molecular Weight by GPC Measurement

The measurements were performed under the conditions described below and the quantitation was carried out by preparing a standard curve using standard polystyrene of the molecular weight of 580, 1,060, 1,940, 5,000, 10,050, 21,000 and 50,400.

Column: HCL-8120GEL SUPER 1000, 2000, 3000 series (Tosoh Co.),

Elution solution: tetrahydrofuran,

Flow: 0.6 ml/min

Detector: UV8020, measured at 254 nm (Tosoh Co.),

(12) Water Amount Contained in Epoxy Resin Hardener (H)

Water content was measured using a Karl Fischer Moisture Meter CA-100 (Dia Instrument Co.).

(13) Volume Ratio of Core (C) and Shell (S) of Microencapsulated Epoxy Resin Hardener The master batch type epoxy resin hardener composition containing the microencapsulated epoxy resin hardener was cured using a denatured aliphatic amine hardener at 40° C. for 12 hours under a condition where microcapsulateds are maintained and then completely cured at 120° C. for 24 hours. From this cured product, ultra-thin sections were prepared using a cryo-ultramicrotome, and the microencapsulated hardener in epoxy resin was observed by TEM. The average particle diameter and average thickness of the shell (S) of the microencapsulated hardener were obtained using an image processing software, and based on these values, the volume ratio of the core (C) and shell (S).

(14) Infrared Absorption Characteristics of the Surface of Microencapsulated Epoxy Resin Hardener.

The master batch type epoxy resin hardener composition is repeatedly washed and filtered using xylene until epoxy resin is completely removed, and then washing and filtration using cyclohexane were repeated until xylene was removed. After that, cyclohexane was separated by filtration, and completely distilled off at 50° C. or below and dried to separate the microencapsulated epoxy resin hardener from the master batch type epoxy resin hardener composition.

For the surface of the microencapsulated epoxy resin hardener thus obtained, absorption was measured using FT/IR-410 made by JASCO Co.

(15) Separation of Capsule Film from Microencapsulated Epoxy Resin Hardener

The microencapsulated epoxy resin hardener was washed and filtered repeatedly using methanol until the hardener for epoxy resin was removed, and then methanol was completely removed and dried at a temperature of 50° C. or below.

(16) Method for Preparing the Standard Curves for Quantitating the Binding Group (x), (y) and (z)

Tetramethylsuccinonitrile was prepared as a standard substance using FT/IR-410 made by JASCO Co.

[Formula 5]

Standard Substance
Tetramethylsuccinonitrile

Further, model compound (1) which has the binding group (x) having an absorption at 1630-1680 cm$^{-1}$ but neither (y) nor (z),

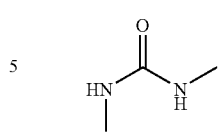

[Formula 6]

Urea bond (x)
Model compound (1)

similarly, model compound (2) which has the binding group (y) having an absorption at 1680-1725 cm$^{-1}$ but neither (x) nor (z),

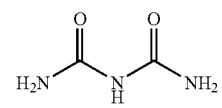

[Formula 7]

Biuret bond (y)
Model compound (2)

and model compound (3) which has the binding group (z) having an absorption at 1730-1755 cm$^{-1}$ but neither (x) nor (y),

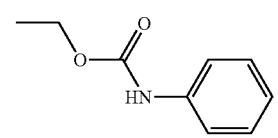

[Formula 8]

Urethane bond (2)
Model compound (3)

are prepared. And then, a mixture, in which each of the standard substance, model compound (1), (2) and (3) are exactly weighed and mixed at an arbitrary ratio, is ground together with KBr powder and a standard sample tablet for FT/IR measurement is prepared using a tablet press. To an area of the absorption band of 2240-2260 cm$^{-1}$ of the standard substance, tetramethylsuccinonitrile, an area ratio of the absorption band of 1630-1680 cm$^{-1}$ of model compound (1) is obtained. That is, the mass ratio in the standard sample, which is the mixture of model compound (1) and the standard sample, is plotted on the vertical axis, and the ratio of the area of the absorption band of 1630-1680 cm$^{-1}$ of model compound (1) to the area of the absorption band of 2240-2260 cm$^{-1}$ of the standard substance, tetramethylsuccinonitrile, is plotted on the horizontal axis, and the standard curve is prepared from the relation between the area ratio of the infrared absorption bands and the mass ratio of the ingredients using linear regression. Similarly, for model compound (2) and (3), the standard curves are prepared from the measured values of the area ratio of the infrared absorption bands and the mass ratio of the ingredients using linear regression. Model compounds (1), (2), (3) and the standard substance, tetramethylsuccinonitrile used were reagent grade and obtained from Tokyo Chemical Industry Co. Ltd.

(17) Measurement of Concentration and Concentration Ratio of Binding Groups (x), (y) and (z)

The microencapsulated epoxy resin hardener obtained according to the method of (6) is dried at 40° C. in vacuo and weighed. Further, the capsule film separated from the microencapsulated epoxy resin hardener is dried at 40° C. in vacuo according to the method described in (7) and the weight of the capsule film separated from the microencapsulated epoxy resin hardener is measured to obtain a sample for measuring the concentration ratio of the binding groups. To 3 g of this sample, 10 mg of the standard substance, tetramethylsuccinonitrile is added, mixed and ground in an agate mortar, and then 2 mg of the mixture is ground together with 50 mg of KBr powder, and a tablet for FT&/IR measurement is prepared using a tablet press. Using this tablet an infrared spectra is obtained by FT/IR-410 made by JASCO Co. Concentrations of the binding group (x), (y) and (z) in the sample can be obtained from thus obtained and the amount of binding group per 1 kg of the microencapsulated epoxy resin hardener and the concentration ratio and obtained spectra chart area and the standard curves prepared in (16).

(18) Measurement of C13 Nuclear Magnetic Resonance Spectra and Judgment of the Presence or Absence of Carbonyl Carbon Due to the Carboxylate Ester Group Measurements were made under a condition of, nuclide for observation and measurement: 13C, pulse program: CPSELTICS, pulse condition: (repeating time 5 sec, 90 degree pulse of proton: 5.2 micro second, contact time: 1 millisecond), magic angle spinning: 5000 Hz, using DSX400 (magnetic field: 400 MHz) made by Bruker Co. When the C13 nuclear magnetic resonance spectra of methyl metacrylate polymer was used as a model compound and when the ratio of the height of the peak of the carbonyl carbon of the ester group, which was present from 165 to 175 ppm and the height of the methylene chain, which was present from 28 to 38 ppm, was one tenth or less compared to the model compound, it was judged that the carbonyl carbon of the carboxylate ester did not exist essentially and that the carboxylate ester group was not essentially contained.

(19) Gel Time

The gel time was obtained by the stroke cure method on a heated plate using a curelastometer V made by TS Engineering Co. Ltd.

(20) Curability-1 of One-Liquid Epoxy Resin Composition

One-liquid epoxy resin composition was produced by mixing 30 parts of the master batch type epoxy resin hardener composition produced in Examples or Comparative Examples with 100 parts of bisphenol A type epoxy resin (epoxy equivalent: 189 g/equivalent, total chlorine amount: 1200 ppm: hereinafter designated as epoxy resin (M)), and the gel time was measured. When the temperature, at which the gel time is less than 30 minutes, is less than 90° C., the curability is indicated by a double circle, over 90° C. but less than 100° C. by a circle ○, over 100° C. but less than 110° C. by a triangle Δ, over 110° C. but less than 120° C. by an x and over 120° C. by an xx.

(21) Storage Stability-1 of One-Liquid Epoxy Resin Composition

One-liquid epoxy resin composition was produced by mixing 30 parts of the master batch type epoxy resin hardener composition produced in Examples or Comparative Examples with 100 parts of epoxy resin (M), stored at 40° C. for 1 week, and the storage stability was evaluated by a value that was obtained by dividing the viscosity after the storage by the viscosity before the storage (hereinafter designated as viscosity magnification). The sample having a viscosity magnification of less than 1.5 is indicated by a double circle ⊚, less than 2 by a circle ○, 2 or greater but less than 3 by a triangle Δ, 3 or greater by an x, and the sample gelled during the storage is indicated by an xx.

(22) Solvent Resistance-1 of Master Batch Type Epoxy Resin Hardener Composition

For measuring solvent resistance of the master batch type epoxy resin hardener composition, a sample was prepared by mixing 80 parts of the master batch type epoxy resin hardener composition with 20 parts of toluene, heated at 40° C. for 6 hours, and then viscosity of the sample after heating was measured. The sample having a viscosity of 200 mPa·s or less is indicated by a double circle ⊚, 200-1,000 mPa·s by a circle ○, 1,000-20,000 mPa·s by a triangle Δ, 20,000-2,000,000 mPa·s by an x and 2,000,000 mPa·s or greater by an xx.

(23) Curability-2 of One-Liquid Epoxy Resin Composition

One-liquid epoxy resin composition was produced by mixing 30 parts of the master batch type epoxy resin hardener composition produced in Examples or Comparative Examples with 100 parts of bisphenol A type epoxy resin (epoxy equivalent: 189 g/equivalent, total chlorine amount: 1200 ppm: hereinafter designated as epoxy resin (M)). Time required for gelling measured by a gelling test apparatus according to JIS C-6521 was evaluated as follows. That is, a gelling plate was kept at 130° C. and 0.4 ml of the sample of one-liquid epoxy resin composition was placed on the plate and stirred with a stirring bar, and time until no filament was formed, that is the gelling time (seconds) was measured. The sample having a gelling time of 90 seconds or less is indicated by a double circle ⊚, from 90 seconds to 120 seconds by a circle ○, from 120 seconds to 180 seconds by a triangle Δ, from 180 seconds to 300 seconds by an x and the sample does not gel is indicated by an xx.

(24) Storage Stability of Master Batch Type Epoxy Resin Hardener Composition

Viscosity of the master batch type epoxy resin hardener composition was measured before and after the storage at 40° C. for 1 week, and evaluation was performed by a viscosity increase factor. After the storage, if the viscosity increase factor is 10 fold or more, or the sample is gelled, x is assigned. The sample having a viscosity increase factor of 5 fold or more but less than 10 fold is indicated by a triangle Δ, 2 fold or more but less than 5 fold by a circle ○, and less than 2 fold by a double circle ⊚. Viscosity was measured at 25° C. using a BM type viscometer.

(25) Solvent Resistance-2 of Master Batch Type Epoxy Resin Hardener Composition

For measuring solvent resistance of the master batch type epoxy resin hardener composition, a sample was prepared by mixing 80 parts of the master batch type epoxy resin hardener composition with 15 parts of toluene and 5 parts of methylisobutylketone, heated at 40° C. for 6 hours, and then viscosity of the sample after heating was measured. The sample having viscosity of 200 mPa·s or less is indicated by a double circle ⊚, 200-1,000 mPa·s by a circle ○, 1,000-20,000 mPa·s by a triangle Δ, 20,000-2,000,000 mPa·s by an x and 2,000,000 mPa·s or greater by an xx.

(26) Shear Bond Strength

For measuring pull shear bond strength of an epoxy resin composition, a JIS G3141 standard adhesive body of 25 mm wide×100 mm long×1.6 mm thick was used. A test piece was prepared according to JIS K6850 by mixing 30 parts of the master batch type epoxy resin hardener composition and 100 parts of epoxy resin (M), cured at 120° C. for 1 hour, and the maximum load to the test piece break was measured.

(27) Fluidity of One-Liquid Epoxy Resin Composition

One-liquid epoxy resin composition was prepared by mixing 30 parts of the master batch type epoxy resin hardener composition, 100 parts of epoxy resin (M) and 100 parts of HN-2200 (Hitachi Chemical Co. Ltd.), the major ingredient of which is phthalic acid anhydride. A mixture of 30 parts of this one-liquid epoxy resin mixture and 70 parts of silica filler with 7μ of particle diameter was mulled with a three roll mill, and the product was heated to 80° C. and then injected to a die (80 mm φ, half circle) for spiral flow measurement according to EMMI-1-66 with an injection pressure of 100 MPa, and then the flow distance was measured at a curing temperature of 140° C. The flow distance of 200 cm or more is indicated by a double circle ⊙, from 150 cm to 200 cm by a circle ○, from 100 cm to 150 cm by a triangle Δ, from 50 cm to 100 cm by an x, and 50 cm or less by an x.

(28) Dispersibility of Master Batch Type Epoxy Resin Hardener Composition

After mulling 30 parts of the master batch type epoxy resin hardener composition and 100 parts of epoxy resin (M) with a three roll mill, the mulled product was applied to a 10 cm square frame prepared on a glass plate with a 0.5 mm applicator to form a thin film. Aggregate development due to insufficient dispersion into epoxy resin of microencapsulated hardener and/or the master batch type epoxy resin hardener composition was investigated by light microscopic observation. The sample having aggregates of 25μ or greater of 5 or less is indicated by a double circle ⊙, from 5 to 10 aggregates by a circle ○, from 10 to 20 aggregates by a triangle Δ, 20 to 40 aggregates by an x and 40 or more aggregates by an xx.

(29) Storage Stability Under Humid Conditions of a Master Batch Type Epoxy Resin Hardener Composition The master batch type epoxy resin hardener composition was stored for 6 hours at a constant temperature of 30° C. and a humidity of 85%. Then, before and after storage for 1 week at 40° C., the viscosity was measured and an evaluation was made using the increase in viscosity. If the viscosity increase factor after storage was 10 or greater or if a gel was formed, this was indicated by an x. If the factor was 5 or greater and less than 10, this was indicated by a triangle Δ. If the factor was 2 or greater and less than 5, this was indicated by a circle ○. If the factor was less than 2, this was indicated by a double circle. The viscosity was measured using a BM viscometer at 25° C.

Production Example 1

Production of Amine Adduct (A-1)

1.5 equivalent of bisphenol A epoxy resin (epoxy equivalent 185 g/equivalent, total chlorine amount of 1400 ppm: hereinafter referred to as epoxy resin e1-1) was reacted and at 80° C. with 1 equivalent of 2-methylimidazole (active hydrogen conversion) in a 1/1 mixed solvent of n-butanol and toluene (resin content 50%). The resulting produce with solvent was then distilled off under reduced pressure until the content of 2-methylimidazole was less than 10 ppm. This resulted in amine adduct A-1, which was in a solid state at 25° C. The molecular weight distribution of the obtained amine adduct was 3.5.

Production Example 2

Production of Amine Adduct (A-2)

One equivalent of epoxy resin e1-1, 1 equivalent of bisphenol A epoxy resin (epoxy equivalent 470 g/equivalent, 1300 ppm total chlorine: hereinafter referred to as epoxy resin e1-2) was reacted at 80° C. with 2 equivalent of triethylenetetramine in a 1/2 mixed solvent of 2-propanol and xylene (resin content 50%). Then, solvent and unreacted low molecular-weight amine compound were distilled off under reduced pressure with distillation being halted when the triethylenetetramine reached 0.3% (relative to resin). This resulted in amine adduct A-2, which was in a solid state at 25° C. The molecular weight distribution of the obtained amine adduct was 2.5.

Production Example 3

Production of Amine Adduct (A-3)

A reaction was performed in the same manner as in Production Example 2 except that 0.5 equivalent of the epoxy resin e1-2, 1 equivalent of cresol novolac epoxy resin (epoxy equivalent 215 g/equivalent, 1500 ppm total chlorine: hereinafter referred to as epoxy resin a1-3), and 1.8 equivalent of N-methylpiperadine were used. After distillation, this resulted in amine adduct A-3, which was in a solid state at 25° C. The N-methylpiperadine contained in the obtained amine adduct was 0.8% (relative to the resin) and the molecular weight distribution was 1.9.

Production Example 4

Production of Amine Adduct (A-4)

A reaction was performed in the same manner as in Production Example 2 except that 1 equivalent of epoxy resin e1-1, 0.7 equivalent of 2-methylimidazole, and the solvent from the Production Example 1 were used. After distillation, this resulted in amine adduct A-4, which was in a solid state at 25° C. The 2-methylimidazole contained in the obtained amine adduct was 0.5% (relative to the resin) and the molecular weight distribution was 3.9.

Production Example 5

A reaction was performed in the same manner as in Production Example 4 except that 1.5 equivalent of bisphenol F epoxy resin (epoxy equivalent 165 g/equivalent, 300 ppm total chlorine: hereinafter referred to as epoxy resin e1-4) and 1 equivalent of 2-methylimidazole were used. After distillation, this resulted in amine adduct A-5, which was in a solid state at 25° C. The 2-methylimidazole contained in the obtained amine adduct was 0.15% (relative to the resin) and the molecular weight distribution was 3.1.

Production Example 6

Production of Amine Adduct (A-6)

A reaction was performed in the same manner as in Production Example 4 except that 1.8 equivalent of the epoxy resin e1-1 and 1 equivalent of 2-methylimidazole were used. After distillation, this resulted in amine adduct A-6, which was in a solid state at 25° C. The 2-methylimidazole contained in the obtained amine adduct was 0.1% (relative to the resin) and the molecular weight distribution was 5.5.

Production Example 7

Production of Amine Adduct (A-7)

A reaction was performed in the same manner as in Production Example 4 except that 4 equivalent of the epoxy resin e1-1 and 1 equivalent of 2-methylimidazole were used. After distillation, this resulted in amine adduct A-7, which was in a solid state at 25° C. The 2-methylimidazole contained in the obtained amine adduct was 0.1% (relative to the resin) and the molecular weight distribution was 8.5.

Production Example 8

Production of Amine Adduct (A-8)

A reaction was performed in the same manner as in Production Example 4 except that 1 equivalent of the epoxy resin e1-1 and 2.5 equivalent of 2-methylimidazole were used. After distillation, this resulted in amine adduct A-8, which was in a solid state at 25° C. The 2-methylimidazole contained in the obtained amine adduct was 4% (relative to the resin) and the molecular weight distribution was 1.5.

Example 1

The following steps were performed: 100 parts by mass of the amine adduct A-1 obtained from Production Example 1 were melted; 2-ethyl-4-methylimidazole was mixed in uniformly; and the results were cooled at room temperature and ground. This resulted in an epoxy resin hardener H-1, which was in a solid state at 25° C. and had an average particle diameter of 2.5 μm. In the ground epoxy resin hardener H-1, the 2-ethyl-4-methylimidazole content was 0.9 parts by mass per 100 parts by mass and the water content was 0.6 parts by mass per 100 parts by mass. To 200 parts by mass of the epoxy resin e3-1 was added 100 parts by mass of the hardener for epoxy resin H-1, 1.5 parts by mass of water, and 7 parts by mass of tolylene diisocyanate. The reaction was allowed to take place for 3 hours at 40° C. while stirring. Then, a shell forming reaction was performed for 8 hours at 50° C. to obtain a master batch type epoxy resin hardener composition F-1.

Using xylene, microcapsulated epoxy resin hardener were separated from the master batch type epoxy resin hardener composition F-1. Through FT-IR measurement, the presence of a binding group (x), (y), and (z) was confirmed.

Furthermore, the curability-1 and storage stability-1 for a one-liquid epoxy resin composition were evaluated when 30 parts of the obtained master batch type epoxy resin hardener composition F-1 were added to 100 parts of an epoxy resin (M). Also, the solvent-resistance-1 of the master batch type epoxy resin hardener composition was evaluated. The obtained results are shown in Table 1.

Examples 2 to 6

The amine adducts A-2 to 6 obtained in Production Examples 2 to 6 were ground to obtain the hardeners for epoxy resins H-2 to 6, indicated in Table 1. The characteristics of the obtained hardeners for epoxy resins are shown in Table 1.

Furthermore, using the proportions shown in Table 1, master batch type hardener compositions for epoxy resins F-2 to 6 were obtained in the same manner as in Example 1. In each of these cases, the presence of binding groups (x), (y), and (z) was confirmed as in Example 1. Also as in Example 1, the curability-1 and storage stability-1 for a one-liquid epoxy resin composition were evaluated when the master batch type hardener compositions for epoxy resins F-2 to 6 were used as hardeners. Also, the solvent-resistance-1 of the master batch type epoxy resin hardener composition was evaluated. The obtained results are shown in Table 1.

Example 7

The amine adduct A-4 obtained from Production Example 4 was ground to obtain an epoxy resin hardener H-4, which was in a solid state at 25° C. and had an average particle diameter of 2.4 μm. Relative to 100 parts by mass of the obtained epoxy resin hardener H-4 was added 1.5 parts by mass of water and 5 parts by mass of MR-200. The reaction was allowed to take place for 3 hours at 40° C. while being stirred. Then, 0.07 parts of a cyclic borate ester (L) was added and a shell forming reaction was performed for 8 hours at 50° C. to obtain a master batch type epoxy resin hardener composition F-7. The presence of binding groups (x), (y), and (z) was confirmed as in Example 1. Also as in Example 1, the curability-1 and storage stability-1 for a one-liquid epoxy resin composition were evaluated when the master batch type hardener compositions for epoxy resins F-7 was used as a hardener. Also, the solvent-resistance-1 of the master batch type epoxy resin hardener composition was evaluated. The obtained results are shown in Table 1.

Comparative Example 1

The amine adduct A-8 obtained in Production Example 8 was ground to obtain an epoxy resin hardener H-7 as shown in Table 1. The characteristics of the obtained epoxy resin hardener are shown in Table 1.

Furthermore, using the proportions shown in Table 1, a master batch type epoxy resin hardener F-8 was obtained in the same manner as in Example 1. As in Example 1, the curability-1 and storage stability-1 for a one-liquid epoxy resin composition were evaluated when the master batch type hardener compositions for epoxy resins F-8 was used as a hardener. Also, the solvent-resistance-1 of the master batch type epoxy resin hardener composition was evaluated. The obtained results are shown in Table 1.

Comparative Example 2

The amine adduct A-8 obtained in Production Example 8 was ground to obtain the epoxy resin hardener H-7 as shown in Table 1. Furthermore, using the proportions shown in Table 1, a master batch type epoxy resin hardener F-9 was obtained in the same manner as in Example 7. As in Example 1, the curability-1 and storage stability-1 for a one-liquid epoxy resin composition were evaluated when the master batch type hardener compositions for epoxy resins F-9 was used as a hardener. Also, the solvent-resistance-1 of the master batch type epoxy resin hardener composition was evaluated. The obtained results are shown in Table 1.

Comparative Example 3

The amine adduct A-7 obtained in Production Example 7 was ground to obtain an epoxy resin hardener H-8 as shown in Table 1. The characteristics of the obtained epoxy resin hardener are shown in Table 1.

Furthermore, using the proportions shown in Table 1, a master batch type epoxy resin hardener F-10 was obtained in the same manner as in Example 1. As in Example 1, the curability-1 and storage stability-1 for a one-liquid epoxy resin composition were evaluated when the master batch type hardener compositions for epoxy resins F-10 was used as a hardener. Also, the solvent-resistance-1 of the master batch type epoxy resin hardener composition was evaluated. The obtained results are shown in Table 1.

Comparative Example 4

The following steps were performed: 100 parts by mass of the amine adduct A-7 obtained from Production Example 7 were melted; 3.9 parts by mass of 2-methylimidazole was mixed in uniformly so that total 2-methylimidazole content was 4.0 parts; and the results were cooled to room temperature and ground. This resulted in an epoxy resin hardener H-9, which was in a solid state at 25° C. and had an average particle diameter of 2.1 μm. This was moistened so that the water content was 3.5 parts by mass per 100 parts by mass of the epoxy resin hardener H-9. Then, 100 parts by mass of the epoxy resin hardener H-9, 1 mass part of water, and 9 parts by mass of MR-200 were added to 200 parts by mass of epoxy resin e3-1, and a reaction was allowed to take place for 3 hours at 40° C. while stirring. Then, a shell forming reaction was performed for 8 hours at 50° C. to obtain a master batch type epoxy resin hardener F-11.

Using xylene, microcapsulated epoxy resin hardener were separated from the master batch type epoxy resin hardener composition F-11. Through FT-IR measurement, the presence of a binding group (x), (y), and (z) was confirmed.

Furthermore, the curability-1 and storage stability-1 for a one-liquid epoxy resin composition were evaluated when 30 parts of the obtained master batch type epoxy resin hardener composition F-11 were added to 100 parts of the epoxy resin (M). Also, the solvent-resistance-1 of the master batch type epoxy resin hardener composition was evaluated. The obtained results are shown in Table 2.

Comparative Example 5

When producing the master batch type epoxy resin hardener F-12 using the epoxy resin hardener H-9 as in Comparative Example 4, 0.2 parts of the cyclic borate ester (L) was added as in Example 7, and a shell forming reaction was performed for 8 hours at 50° C. to obtain the master batch type epoxy resin hardener F-12. Furthermore, the curability-1 and storage stability-1 for a one-liquid epoxy resin composition were evaluated when 30 parts of the obtained master batch type epoxy resin hardener composition F-12 were added to 100 parts of the epoxy resin (M). Also, the solvent-resistance-1 of the master batch type epoxy resin hardener composition was evaluated. The obtained results are shown in Table 2.

Comparative Example 6

The amine adduct A-1 from Production Example 1 was ground as it is and dried to obtain an epoxy resin hardener H-10, indicated in Table 1. The characteristics of the obtained epoxy resin hardener are shown in Table 1. Furthermore, using the proportions shown in Table 1, an attempt was made to produce a master batch type epoxy resin hardener F-13 as in Example 1, but production had to be halted due to severe agglutination.

Comparative Example 7

The following steps were performed: 100 parts by mass of the amine adduct A-1 obtained from Production Example 1 were melted; 5.5 parts by mass of 2-methylimidazole was mixed in uniformly; and the results were cooled to room temperature and ground. This resulted in an epoxy resin hardener H-11, which was in a solid state at 25° C. and had an average particle diameter of 2.5 μm. Then, 100 parts by mass of the epoxy resin hardener H-11, 2 mass part of water, and 9 parts by mass of MR-200 were added to 200 parts by mass of epoxy resin e3-1, and a reaction was allowed to take place for 3 hours at 40° C. while stirring. Then, a shell forming reaction was performed for 8 hours at 50° C. to obtain a master batch type epoxy resin hardener F-14.

Furthermore, the curability-1 and storage stability-1 for a one-liquid epoxy resin composition were evaluated when 30 parts of the obtained master batch type epoxy resin hardener composition F-14 were added to 100 parts of the epoxy resin (M). Also, the solvent-resistance-1 of the master batch type epoxy resin hardener composition was evaluated. The obtained results are shown in Table 1.

Comparative Example 8

When producing the master batch type epoxy resin hardener F-15 using the epoxy resin hardener H-11 as in Comparative Example 7, 0.15 parts of the cyclic borate ester (L) was added as in Example 7, and a shell forming reaction was performed for 8 hours at 50° C. to obtain the master batch type epoxy resin hardener F-15. Furthermore, the curability-1 and storage stability-1 for a one-liquid epoxy resin composition were evaluated when 30 parts of the obtained master batch type epoxy resin hardener composition F-15 were added to 100 parts of the epoxy resin (M). Also, the solvent-resistance-1 of the master batch type epoxy resin hardener composition was evaluated. The obtained results are shown in Table 1.

Production Example 9

Production of Amine Adduct (A-9)

A reaction was performed in the same manner as in Production Example 2 except that 1 equivalent of the epoxy resin e1-1 and 0.7 equivalent of 2-methylimidazole were used and the solvent was the same as in the Production 1. After distillation, this resulted in amine adduct A-9, which was in a solid state at 25° C. The 2-methylimidazole contained in the obtained amine adduct was 0.5% and the molecular weight distribution was 3.9.

Production Example 10

Production of Amine Adduct (A-10)

A reaction was performed in the same manner as in Production 2 except that 2 equivalent of the epoxy resin e1-1 and 1 equivalent of 2-methylimidazole were used and the solvent was the same as in the Production Example 1. After distillation, this resulted in amine adduct A-10, which was in a solid state at 25° C. The 2-methylimidazole contained in the obtained amine adduct was 0.1% and the molecular weight distribution was 6.2.

Production Example 11

Production of Amine Adduct (A-11)

A reaction was performed in the same manner as in Production Example 2 except that 5 equivalent of the epoxy resin e1-1 and 1 equivalent of 2-methylimidazole were used and the solvent was the same as in the Production 1. After distillation, this resulted in amine adduct A-11, which was in a solid state at 25° C. The 2-methylimidazole contained in the obtained amine adduct was 0.1% and the molecular weight distribution was 9.5.

Examples 8-9

The amine adducts A-9 to A-10 from the Production Examples 9-10 were ground to obtain hardeners for epoxy resins H-12 to H-13, indicated in Table 2. The characteristics of the obtained hardeners for epoxy resins are shown in Table 2.

Furthermore, using the proportions shown in Table 2, master batch type hardener compositions for epoxy resins F-16 and F-17 were obtained in the same manner as in Example 1. In both of these cases, the presence of binding groups (x), (y), and (z) was confirmed as in Example 1. Also as in Example 1, the curability-1 and storage stability-1, as well as shear bond strength, for a one-liquid epoxy resin composition were evaluated when the master batch type hardener compositions for epoxy resins F-16 and F-17 were used as hardeners. The obtained evaluation results are shown in Table 2.

Example 10

The amine adduct A-9 obtained from Production Example 9 was ground to obtain an epoxy resin hardener H-12, which was in a solid state at 25° C. and had an average particle diameter of 2.4 µm. To 200 parts by mass of the epoxy resin e3-2 were added 100 parts by mass of the obtained epoxy resin hardener H-12, 1.5 parts by mass of water and 5 parts by mass of MR-200. The reaction was allowed to take place for 3 hours at 40° C. while being stirred. Then, 0.07 parts of a cyclic borate ester (L) was added and a shell forming reaction was performed for 8 hours at 50° C. to obtain a master batch type epoxy resin hardener composition F-18. The presence of binding groups (x), (y), and (z) was confirmed as in Example 1. Also as in Example 1, the curability-1 and storage stability-1, as well as shear bond strength, for a one-liquid epoxy resin composition were evaluated when the master batch type hardener compositions for epoxy resins F-18 was used as a hardener. The evaluation results are shown in Table 2.

Comparative Example 9

The amine adduct A-8 from Production Example 8 was ground to obtain the epoxy resin hardener H-7, indicated in Table 2. The characteristics of the obtained epoxy resin hardener are shown in Table 2.

Furthermore, using the proportions shown in Table 2, a master batch type epoxy resin hardener composition F-19 was obtained in the same manner as in Example 1. Also as in Example 1, the curability-1 and storage stability-1, as well as shear bond strength, for a one-liquid epoxy resin composition were evaluated when the master batch type epoxy resin hardener composition F-19 was used as a hardener. The evaluation results are shown in Table 2.

Comparative Example 10

The amine adduct A-8 from Production Example 8 was pulverized to obtain the epoxy resin hardener H-7, indicated in Table 2. Furthermore, using the hardener for epoxy resins H-7, with the proportions shown in Table 2, a master batch type epoxy resin hardener F-20 was obtained in the same manner as in Example 7. As in Example 1, the curability-1 and storage stability-1, as well as shear bond strength, for a one-liquid epoxy resin composition were evaluated when the master batch type epoxy resin hardener composition F-20 was used as a hardener. The evaluation results are shown in Table 2.

Comparative Example 11

The amine adduct A-11 from Production Example 11 was pulverized to obtain the epoxy resin hardener H-14, indicated in Table 2. The characteristics of the obtained epoxy resin hardener are shown in Table 1.

Furthermore, using the proportions shown in Table 2, a master batch type epoxy resin hardener composition F-21 was obtained in the same manner as in Example 1. As in Example 1, the curability-1 and storage stability-1, as well as shear bond strength, for a one-liquid epoxy resin composition were evaluated when the master batch type epoxy resin hardener composition F-21 was used as a hardener. The evaluation results are shown in Table 2.

Comparative Example 12

The following steps were performed: 100 parts by mass of the amine adduct A-11 obtained from Production Example 11 were melted; 3.9 parts by mass of 2-methylimidazole was mixed in uniformly so that the total 2-methylimidazole content was 4.0 parts; and the results were cooled to room temperature and pulverized. This resulted in an epoxy resin hardener H-15, which was in a solid state at 25° C. and had an average particle size of 3.5 µm. Then, 100 parts by mass of the epoxy resin hardener H-15, 2 mass part of water, and 9 parts by mass of MR-200 were added to 200 parts by mass of epoxy resin e3-1, and a reaction was allowed to take place for 3 hours at 40° C. while stirring. Then, a shell forming reaction was performed for 8 hours at 50° C. to obtain a master batch type epoxy resin hardener composition F-22.

Using xylene, microcapsulated epoxy resin hardener were separated from the master batch type epoxy resin hardener composition F-22. Through FT-IR measurement, the presence of a binding group (x), (y), and (z) was confirmed.

Furthermore, the curability-1 and storage stability-1 and shear bond strength for a one-liquid epoxy resin composition were evaluated when 30 parts of the obtained master batch type epoxy resin hardener composition F-22 were added to 100 parts of the epoxy resin (M). The obtained results are shown in Table 2.

Comparative Example 13

When producing the master batch type epoxy resin hardener composition F-23 using the same epoxy resin hardener H-15 as in comparative example 12, 0.1 parts of the cyclic borate ester compound (L) was added as in Example 7, and a shell forming reaction was performed for 8 hours at 50° C. to obtain the master batch type epoxy resin hardener composition F-23. Furthermore, the curability-1, the storage stability-1, and the shear bond strength for a one-liquid epoxy resin composition were evaluated when 30 parts of the obtained master batch type epoxy resin hardener composition F-23 were added to 100 parts of the epoxy resin (M). The obtained results are shown in Table 2.

Production 12

Production of Epoxy Resin Hardener H-16' Containing the Amine Adduct A-12

1.5 equivalent of bisphenol A epoxy resin (epoxy equivalent 185 g/equivalent, total chlorine amount of 1400 ppm: hereinafter referred to as epoxy resin e1-1) was reacted and at 80° C. with 1 equivalent of 2-methylimidazole (active hydrogen conversion) in a 1/1 mixed solvent of n-butanol and toluene (resin content 50%). The resulting produce with solvent was then distilled off under reduced pressure until the 2-methylimidazole content was less than 10 ppm. This resulted in epoxy resin hardener H-16', which was in a solid state at 25° C. The n-butanol and toluene content per 100 parts by mass of the epoxy resin hardener (H-16') was less than 10 ppm.

Production 13

Production of Epoxy Resin Hardener H-17' Containing the Amine Adduct A-13

1 equivalent of epoxy resin e1-1, 1 equivalent of bisphenol A type epoxy resin (epoxy equivalent 470 g/equivalent, 1300 ppm total chlorine: hereinafter referred to as epoxy resin e1-2), was reacted at 80° C. with and 2 equivalent of triethylenetetramine, in a 1/2 mixed solvent of 2-propanol and toluene (resin content 50%). Then, under reduced pressure, solvent and unreacted low molecular-weight amine compound were distilled off, with distillation being halted when the triethylenetetramine reached 0.3% (relative to resin). This resulted in epoxy resin hardener H-17', which was in a solid state at 25° C. The toluene content per 100 parts of the obtained epoxy resin hardener (H-17') was 2.5 parts and 2-propanol was less than 10 ppm.

Production 14

Production of Epoxy Resin Hardener H-18' Containing the Amine Adduct A-14

In a 1/1/1 mixed solvent (resin content 50%) of 2-propanol/toluene/PGM, 0.5 equivalent of the epoxy resin e1-2 was reacted at 80° C. with 1 equivalent of cresol novolac epoxy resin (epoxy equivalent 215 g/equivalent, 1500 ppm total chlorine: hereinafter referred to as epoxy resin e1-3), and 1.8 equivalent of N-methylpiperadine. After the reaction, distillation was performed to obtain epoxy resin hardener H-18', which was in a solid state at 25° C. For 100 parts of the obtained epoxy resin hardener (H-18'), the N-methylpiperadine content was 0.8%, the PGM content was 0.8 parts, and toluene and 2-propanol was less than 10 ppm.

Production 15

Production of Epoxy Resin Hardener H-19' Containing the Amine Adduct A-15

A reaction was performed in the same manner as in Production 13 except that 1.5 equivalent of the epoxy resin e1-1 and 1.2 equivalent of 2-methylimidazole were used and the solvent was the same as in the Production 12. After distillation, this resulted in epoxy resin hardener H-19', which was in a solid state at 25° C. For 100 parts of the obtained epoxy resin hardener (H-19'), the 2-methylimidazole content was 0.4%, the toluene content was 0.8 parts, and there was less than 10 ppm of n-butanol.

Production 16

Production of Epoxy Resin Hardener H-20' Containing the Amine Adduct A-16

A reaction was performed in the same manner as in Production 13 except that 1 equivalent of the epoxy resin e1-1 and 0.7 equivalent of 2-methylimidazole were used and the solvent was the same as in the Production 12. After distillation, this resulted in epoxy resin hardener H-20', which was in a solid state at 25° C. For 100 parts of the obtained epoxy resin hardener (H-20'), the 2-methylimidazole content was 0.5%, the toluene content was 12 parts, and there was less than 10 ppm of n-butanol.

Production 17

Production of Epoxy Resin Hardener H-21' Containing the Amine Adduct A-17

A reaction was performed in the same manner as in Production 14 using 1.5 equivalent of the epoxy resin e1-1 and 0.9 equivalent of 2-methylimidazole. After distillation, this resulted in epoxy resin hardener H-21', which was in a solid state at 25° C. For 100 parts of the obtained epoxy resin hardener (H-21'), the 2-methylimidazole content was 0.2%, the PGM content was 8 parts, and there was less than 10 ppm of toluene and 2-propanol.

Example 11

The following steps were performed: 100 parts by mass of the epoxy resin hardener H-16' containing the amine adduct A-12 obtained from Production Example 12 were melted; 0.9 parts by mass of 2-ethyl-4-methylimidazole and 0.2 parts of n-butanol were mixed in uniformly; and the results were cooled to room temperature and pulverized. This resulted in an epoxy resin hardener H-16, which was in a solid state at 25° C. and had an average particle diameter of 2.5 µm. For 100 parts by mass of the epoxy resin hardener H-16, the water content was 0.6 parts by mass. To 200 parts by mass of the epoxy resin e3-1 was added 100 parts by mass of the hardener for epoxy resin H-16, 1.5 parts by mass of water, and 7 parts by mass of tolylene diisocyanate. The reaction was allowed to take place for 3 hours at 40° C. while stirring. Then, a shell forming reaction was performed for 8 hours at 50° C. to obtain a master batch type epoxy resin hardener composition F-24.

Using xylene, microcapsulated epoxy resin hardener were separated from the master batch type epoxy resin hardener composition F-24. Through FT-IR measurement, the presence of a binding group (x), (y), and (z) was confirmed.

Furthermore, the curability-2 and fluidity for a one-liquid epoxy resin composition were evaluated when 30 parts of the obtained master batch type epoxy resin hardener composition F-24 were added to 100 parts of an epoxy resin (M). Also, the dispersibility of the master batch type epoxy resin hardener composition was evaluated. The obtained results are shown in Table 3.

47

Example 12

The epoxy resin hardener H-17' containing the amine adduct A-13 obtained from Production 13 was pulverized to obtain the epoxy resin hardener H-17 with the composition shown in Table 3. The characteristics of the obtained epoxy resin hardener are shown in Table 3.

Furthermore, using the proportions shown in Table 3, a master batch type hardener compositions for epoxy resin F-25 was obtained in the same manner as in Example 11. The presence of binding groups (x), (y), and (z) was confirmed as in Example 11. Also as in Example 11, the curability-2 and the fluidity for a one-liquid epoxy resin composition were evaluated when the master batch type hardener compositions for epoxy resins F-25 was used as a hardener. Also, the dispersibility of the master batch type epoxy resin hardener composition was evaluated. The obtained results are shown in Table 3.

Example 13

The epoxy resin hardener H-18' containing the amine adduct A-14 obtained from Production 14 was pulverized to obtain an epoxy resin hardener H-18, which had the composition indicated in Table 3. To 200 parts by mass of the epoxy resin e3-1 were added 100 parts by mass of the obtained epoxy resin hardener H-18, 1.0 part by mass of water and 5 parts by mass of MDI. The reaction was allowed to take place for 3 hours at 40° C. while stirring. Then, 0.3 part of a cyclic borate ester compound (L) were added and a shell forming reaction was performed for 8 hours at 50° C. to obtain a master batch type epoxy resin hardener composition F-26. The characteristics of the obtained epoxy resin hardener are shown in Table 3.

As in Example 11, the curability-2 and the fluidity for a one-liquid epoxy resin composition were evaluated when the master batch type hardener compositions for epoxy resins F-26 was used as a hardener. Also, the dispersibility of the master batch type epoxy resin hardener composition was evaluated. The obtained results are shown in Table 3.

Example 14

The epoxy resin hardener H-19' containing the amine adduct A-15 obtained from Production 15 was pulverized to obtain the epoxy resin hardener H-19 with the composition shown in Table 3. The characteristics of the obtained epoxy resin hardener are shown in Table 3.

Furthermore, using the proportions shown in Table 3, a master batch type hardener compositions for epoxy resin F-27 was obtained in the same manner as in Example 11. As in Example 11, the curability-2 and the fluidity for a one-liquid epoxy resin composition were evaluated when the master batch type hardener compositions for epoxy resins F-27 was used as a hardener. Also, the dispersibility of the master batch type epoxy resin hardener composition was evaluated. The obtained results are shown in Table 3.

Comparative Example 14

The epoxy resin hardener H-20' containing the amine adduct A-16 obtained from Production 16 was pulverized after a predetermined amount of water was added thereto, to obtain the epoxy resin hardener H-20 with the composition shown in Table 3. The characteristics of the obtained epoxy resin hardener are shown in Table 3.

48

Furthermore, using the proportions shown in Table 3, a master batch type hardener compositions for epoxy resin F-28 was obtained in the same manner as in Example 11. As in Example 11, the curability-2 and the fluidity for a one-liquid epoxy resin composition were evaluated when the master batch type hardener compositions for epoxy resins F-28 was used as a hardener. Also, the dispersibility of the master batch type epoxy resin hardener composition was evaluated. The obtained results are shown in Table 3.

Comparative Example 15

The epoxy resin hardener H-21' containing the amine adduct A-17 obtained from Production 17 was pulverized after and a predetermined amount of water was added thereto, to obtain the epoxy resin hardener H-21 with the composition shown in Table 3. The characteristics of the obtained epoxy resin hardener are shown in Table 3.

Furthermore, using the proportions shown in Table 3, a master batch type hardener compositions for epoxy resin F-29 was obtained in the same manner as in Example 11. As in Example 11, the curability-2 and the fluidity for a one-liquid epoxy resin composition were evaluated when the master batch type hardener compositions for epoxy resins F-29 was used as a hardener. Also, the dispersibility of the master batch type epoxy resin hardener composition was evaluated. The obtained results are shown in Table 3.

Production 18

Production of Epoxy Resin Hardener H-22' Containing the Amine Adduct A-18

A reaction was performed at 80° C. using 1.5 equivalent of bisphenol A type epoxy resin (epoxy equivalent 185 g/equivalent, total chlorine amount of 1400 ppm, hereinafter referred to as epoxy resin e1-1) and 1 equivalent of 2-methylimidazole (active hydrogen conversion) in a 1/1 mixed solvent of n-butanol and toluene (resin content 50%). The resulting produce with solvent was then distilled off under reduced pressure until the 2-methylimidazole content was less than 10 ppm. This resulted in epoxy resin hardener H-22' containing amine adduct A-18, which was in a solid state at 25° C.

Production 19

Production of Epoxy Resin Hardener H-23' Containing the Amine Adduct A-19

A reaction was performed at 80° C. using 1 equivalent of the epoxy resin e1-1, 1 equivalent of bisphenol A type epoxy resin (epoxy equivalent 470 g/equivalent, 1300 ppm total chlorine, hereinafter referred to as epoxy resin e1-2) and 2 equivalent of triethylenetetramine in a 1/2 mixed solvent of 2-propanol and toluene (resin content 50%). The resulting produce with solvent was then distilled off under reduced pressure. This resulted in epoxy resin hardener H-23' containing amine adduct A-19, which was in a solid state at 25° C. The triethylenetetramine content in the epoxy resin hardener H-23' containing the amine adduct A-19 was 0.3 weight %.

Production 20

Production of Epoxy Resin Hardener H-24' Containing the Amine Adduct A-20

A reaction was performed at 80° C. in a 1/1/1 mixed solvent (resin content 50%) of 2-propanol/toluene/propylene glycol monomethyl ether using 0.5 equivalent of the epoxy resin e1-2, 1 equivalent of cresol novolac epoxy resin (epoxy equivalent 215 g/equivalent, 1500 ppm total chlorine), and 1.8 equivalent of N-methylpiperadine were used. After the reaction, the solvent was distilled under reduced pressure to obtain epoxy resin hardener H-24' containing the amine adduct A-20, which was in a solid state at 25° C. The N-methylpiperadine content in the epoxy resin hardener H-24' containing the amine adduct A-20 was 0.8 weight %.

Production 21

Production of Epoxy Resin Hardener H-25' Containing the Amine Adduct A-21

A reaction was performed at 80° C. using 1.5 equivalent of the bisphenol A type epoxy resin e1-1 and 1.2 equivalent of 2-methylimidazole in a 1/1 mixed solvent of n-butanol and toluene (resin content 50%). Then, the solvent was distilled under reduced pressure. This resulted in epoxy resin hardener H-25' containing the amine adduct A-21, which was in a solid state at 25° C. The 2-methylimidazole content in the obtained epoxy resin hardener H-25' containing the amine adduct A-21 was 0.4 weight %.

Production 22

Production of Epoxy Resin Hardener H-26' Containing the Amine Adduct A-22

A reaction was performed at 80° C. using 1 equivalent of the bisphenol A type epoxy resin e1-1 and 0.7 equivalent of 2-methylimidazole in a 1/1 mixed solvent of n-butanol and toluene (resin content 50%). Then, the solvent was distilled under reduced pressure. This resulted in epoxy resin hardener H-26' containing the amine adduct A-22, which was in a solid state at 25° C. The 2-methylimidazole content in the obtained epoxy resin hardener H-26' containing the amine adduct A-22 was 0.5 weight %.

Example 15

The following steps were performed: 100 weight parts of the epoxy resin hardener H-22' containing the amine adduct A-18 were melted; 0.9 weight parts of 2-ethyl-4-methylimidazole were mixed in uniformly; and the results were cooled to room temperature and pulverized. This resulted in an epoxy resin hardener H-22, which was in a solid state at 25° C. and had an average particle diameter of 2.5 µm.

To 200 weight parts of a bisphenol A type epoxy resin (epoxy equivalent 175 g/equivalent, diol terminal impurity component/basic structure components=0.08, total chlorine amount of 1400 ppm, hereinafter referred to as epoxy resin e3-1) were added 100 weight parts of particles of the epoxy resin hardener H-22, 1.5 weight parts of water, and 7 weight parts of tolylene diisocyanate (TDI). The reaction was allowed to take place for 3 hours at 40° C. while stirring. Then, a reaction was performed for 8 hours at 50° C. to obtain a master batch type epoxy resin hardener composition F-30. Storage stability was evaluated, and the results are shown in Table 4.

Next, 30 weight parts of the obtained master batch hardener composition for epoxy resins was added to 100 weight parts of a bisphenol A type epoxy resin (epoxy equivalent 189 g/equivalent, 1200 ppm total chlorine) to obtain a one-liquid epoxy resin composition. Then, the curability-2 and storage stability under humid conditions were evaluated. The results are shown in Table 4.

Using xylene, microcapsulated epoxy resin hardener were separated from the obtained one-liquid epoxy resin composition. Through FT-IR measurement, absorption was found at the surface for 1630-1680 $cm^{-1}$ and wave numbers 1680-1725 $cm^{-1}$. Also, C13 nuclear magnetic resonance spectrum measurement was performed and it was found that there were no carbonyl carbons from carboxylate ester groups. Also, the volume ratio of the core to the shell in the obtained microcapsulated epoxy resin hardener was 100:3.5.

Example 16

Epoxy resin hardener H-23' which contains amine adduct A-19 was pulverized, and particles of epoxy resin hardener H-23 of average particle size 2.0 µm was obtained.

To 200 weight parts of the same epoxy resin e3-1 as used in Example 15, 100 weight parts of the particles of the previously described epoxy resin hardener H-23, 1.5 weight parts of water, 5 weight parts of polymethylene phenylene polyisocyanate (MR-200 produced by Nippon Polyurethane Co) were added, and in the same manner as in Example 15, a master batch type hardener composition F-31 for epoxy resin was obtained, and the storage stability and humidified storage stability were evaluated. The results are shown in Table 4.

Next, in the same manner as in Example 15, a one-liquid epoxy resin composition was obtained using the master batch type epoxy resin hardener that was obtained, and the curability-2 thereof was evaluated. The results are shown in Table 4.

With the microencapsulated epoxy resin hardener that was obtained, the core to shell volume ratio was 100:2.5, and it was confirmed that there was absorption at the surface of 1630 to 1680 $cm^{-1}$ and wave number 1680 to 1725 $cm^{-1}$ and that there was no carbonyl carbon from a carboxylate ester group in the capsule film.

Example 17

Epoxy resin hardener H-24' which contains amine adduct A-20 was pulverized, and particles of epoxy resin hardener H-24 of average particle size 1.9 µm were obtained.

To 200 weight parts of the same epoxy resin e3-1 as used in Example 15, 100 weight parts of the particles of the previously described epoxy resin hardener H-24, 1.0 weight part of water, 5 weight parts of 4,4'-diphenylmethane diisocyanate (MDI) were added, and the reaction was continued for 3 hours while stirring at 40° C. Afterwards, 0.3 weight parts of a cyclic boric acid ester compound (L) was added, and the reaction was continued for a further 8 hours at 50° C. to obtain a master batch type hardener F-32 for epoxy resin. Thereupon, the storage stability and humidified storage stability were evaluated. The results are shown in Table 4.

Next, using the master batch type epoxy resin hardener composition that was obtained, in the same manner as in Example 15, a one-liquid epoxy resin composition was obtained, and the curability-2 thereof was evaluated. The results are shown in Table 4.

With the microencapsulated epoxy resin hardener that was obtained, the core to shell volume ratio was 0.100:2.8, and it was confirmed that there was absorption at the surface of 1630 to 1680 $cm^{-1}$ and wavelength 1680-1725 $cm^{-1}$, and that there was no carbonyl carbon from a carboxylate ester group in the capsule film.

Comparative Example 16

Epoxy resin hardener H-25' which contains amine adduct A-21 was pulverized, and particles of epoxy resin hardener H-25 of average particle size 15.5 µm were obtained.

To 200 weight parts of the same epoxy resin e3-1 as used in Example 15, 100 weight parts of the particles of the previously described epoxy resin hardener H-25, 0.5 weight part of water, 3 weight parts of polymethylene phenylene polyisocyanate (MR-200 produced by Nippon Polyurethane Co) were added, and in the same manner as in Example 15, a master batch type hardener composition F-33 for epoxy resin was obtained, and the storage stability and humidified storage stability were evaluated. The results are shown in Table 4.

Next, in the same manner as in Example 15, a one-liquid epoxy resin composition was obtained using the master batch type epoxy resin hardener that was obtained, and the curability-2 thereof was evaluated. The results are shown in Table 4.

With the microencapsulated epoxy resin hardener that was obtained, the core to shell volume ratio was 100:0.8.

Comparative Example 17

Epoxy resin hardener H-26' which contains amine adduct A-22 was pulverized, and particles of epoxy resin hardener H-26 of average particle size 1.0 µm were obtained.

To 200 weight parts of the same epoxy resin e3-1 as used in Example 15, 50 weight parts of the particles of the previously described epoxy resin hardener H-26, 1.0 weight part of water, 35 weight parts of toluene diisocyanate (TDI) were added, and in the same manner as in Example 15, a master batch type hardener composition F-34 for epoxy resin was obtained, and the storage stability and humidified storage stability were evaluated. The results are shown in Table 4.

Next, in the same manner as in Example 15, a one-liquid epoxy resin composition was obtained using the master batch type epoxy resin hardener that was obtained, and the curability-2 thereof was evaluated. The results are shown in Table 4.

With the microencapsulated epoxy resin hardener that was obtained, the core to shell volume ratio was 100:68.0.

Example 18

Epoxy resin hardener H-26' which contains amine adduct A-22 was pulverized, and particles of epoxy resin hardener H-27 of average particle size 2.5 µm were obtained.

To 200 weight parts of the same epoxy resin e3-1 as used in Example 15, 50 weight parts of the particles of the previously described epoxy resin hardener H-27, 1.0 weight part of a polyester type polyol (Diol-400 produced by Mitsui Takeda Chemicals) as an active hydrogen compound, 7 weight parts of toluene diisocyanate (TDI) were added, and in the same manner as in Example 15, a master batch type hardener composition F-35 for epoxy resin was obtained, and the storage stability and humidified storage stability were evaluated. The results are shown in Table 4

Next, in the same manner as in Example 15, a one-liquid epoxy resin composition was obtained using the master batch type epoxy resin hardener that was obtained, and the curability-2 thereof was evaluated. The results are shown in Table 4.

With the microencapsulated epoxy resin hardener that was obtained, the core to shell volume ratio was 100:3.3, and it was confirmed that there was absorption at the surface of 1630 to 1680 $cm^{-1}$ and wave number 1680 to 1725 $cm^{-1}$ and that there was carbonyl carbon from a carboxylate ester group in the capsule film.

Production Example 23

Production of Epoxy Resin Hardener H-28' which Contains Amine Adduct A-23

1.5 equivalents of bisphenol A type epoxy resin (epoxy equivalents of 185 g/equivalent, total chlorine amount of 1400 ppm, henceforth referred to as "epoxy resin e1-1") and 1 equivalent (active hydrogen conversion) of 2-ethyl-4-methylimidazole were reacted at 80° C. in a 1/1 mixture solvent of n-butanol and toluene (resin content 50%). Afterwards, under reduced pressure, the 2-ethyl-4-methylimidazole together with the solvent was removed until the content was less than 10 ppm, and an epoxy resin hardener H-28', which is a solid at 25° C. and which has a main component of amine adduct A-23, was obtained.

Production Example 24

Production of Epoxy Resin Hardener H-29' which Contains a Main Component of Amine Adduct A-24

One equivalent of epoxy resin e1-1, 1 equivalent of bisphenol A type epoxy resin (epoxy equivalent of 470 g/equivalent, total chlorine amount of 1300 ppm, henceforth referred to as "epoxy resin e1-2"), and 2 equivalents of triethylenetetramine were reacted at 80° C. in a 1/2 mixture solvent of 2-propanol and toluene (resin content 50%). Afterwards, the solvent was removed under reduced pressure, and an epoxy resin hardener H-29', which is a solid at 25° C. and which has a main component of amine adduct A-24, was obtained. The triethylenetetramine content in the resulting epoxy resin hardener H-29' was 0.3% by weight.

Production Example 25

Production of Epoxy Resin Hardener H-30' which Contains a Main Component of Amine Adduct A-25

0.5 equivalent of epoxy resin e1-2, 1 equivalent of cresol novolak type epoxy resin (epoxy equivalent of 215 g/equivalent, total chlorine amount 1500 ppm), and 1.8 equivalents of N-methylpiperadine were reacted at 80° C. in a 1/1/1 mixture solvent of 2-propanol/toluene/propyleneglycolmonomethylether (resin content 50%). Afterwards, the solvent was removed under reduced pressure, and an epoxy resin hardener H-30', which is a solid at 25° C. and which has a main component of amine adduct A-25, was obtained. The N-methylpiperadine content in the resulting epoxy resin hardener H-30' was 0.8% by weight.

Production Example 26

Production of Epoxy Resin Hardener H-31' which Contains a Main Component of Amine Adduct A-26

1.5 equivalents of bisphenol A type epoxy resin e1-1 and 1.2 equivalents of 2-methylimidazole were reacted at 80° C. in a 1/1 mixture solvent of n-butanol and toluene (resin content of 50%). Afterwards, under reduced pressure, the solvent was removed, and an epoxy resin hardener H-31', which is a solid at 25° C. and which has a main component of amine adduct A-26, was obtained. The 2-methylimidazole content in the resulting epoxy resin hardener H-31' was 0.4% by weight.

Production Example 27

Production of Epoxy Resin Hardener H-32' which Contains a Main Component of Amine Adduct A-27

One equivalent of bisphenol A type epoxy resin e1-1 and 0.7 equivalents of 2-methylimidazole were reacted at 80° C. in a 1/1 mixture solvent of n-butanol and toluene (resin content of 50%). Afterwards, under reduced pressure, the solvent was removed, and an epoxy resin hardener H-32', which is a solid at 25° C. and which has a main component of amine adduct A-27, was obtained. The 2-methylimidazole content in the resulting epoxy resin hardener H-32' was 0.5% by weight.

Example 19

One hundred weight parts of epoxy resin hardener H-28' which has a main component of amine adduct A-23 was melted, and 0.9 weight part of 2-ethyl-4-methylimidazole was uniformly mixed with this, and after cooling to room temperature, this was pulverized, and epoxy resin hardener particles H-28, which is a solid at 25° C. and which has an average particle size of 2.5 μm, was obtained. The water content in the epoxy resin hardener particles H-28 was 0.6 weight % based on 100 parts by mass of epoxy resin hardener particles.

To 200 weight parts of bisphenol A type liquid epoxy resin (epoxy equivalent of 175 g/equivalent, diol terminal impurity component/basic structural component=0.08, total chlorine amount of 1400 ppm, henceforth referred to as "epoxy resin e3-1"), 100 weight parts of the previously described epoxy resin hardener particles H-28, 1.5 weight parts of water, and 7 weight parts of toluene diisocyanate (TDI) were added, and the reaction was continued for 3 hours while stirring at 40° C. Afterwards, this was reacted for 8 hours at 50° C., and a master batch type epoxy resin hardener composition F-35 was obtained. Thereupon, storage stability, solvent resistance-2, and humidity resistance were evaluated. The results are shown in Table 5.

Next, with 100 weight parts of a bisphenol A type epoxy resin (epoxy equivalent of 189 g/equivalent, total chlorine amount of 1200 ppm, henceforth referred to as "epoxy resin e-4-1"), 30 weight parts of the master batch type epoxy resin hardener composition F-35 that was obtained was mixed, and a one-liquid epoxy resin composition was obtained. Thereupon, the curability-2 thereof was evaluated. The results are shown in Table 5.

With the resulting master batch type epoxy resin hardener composition, xylene was used to separate the microencapsulated epoxy resin hardener, and the surface was analyzed with FT-IR measurements, and it was confirmed that there was absorption at 1630 cm$^{-1}$ to 1680 cm$^{-1}$ and wave number 1680 to 1725 cm$^{-1}$, 1730-1755 cm$^{-1}$. In addition, using analysis charts of model compounds (1), (2), (3) and standard curves created from standard substances and model compounds, with an absorption wavelength of 1630-1680 cm$^{-1}$, this is binding group (x) which is a urea bond which matches the absorption band of model compound (1), with an absorption wavelength of 1680-1725 cm$^{-1}$, this is binding group (y) which is a biuret bond which matches the absorption band of model compound (2), and with an absorption wavelength of 1730 to 1755 cm$^{-1}$, this is binding group (z) which is a urethane bond which matches the absorption band of model compound (3), and the content of each binding group and the concentration ratios of binding groups (x), (y), and (z) are shown in Table 5. In addition, C13 nuclear magnetic resonance spectrum measurement was conducted on the separated capsule film, and it was confirmed that there was no carbonyl carbon from a carboxylate ester group.

Example 20

Epoxy resin hardener H-29' which has a main component of amine adduct A-24 was pulverized to obtain epoxy resin hardener particles H-29 of average particle size of 2.0 μm. The water content in epoxy resin hardener particles H-29 was 1.2% by weight based on 100 parts by mass of epoxy resin hardener particles.

To 200 weight parts of the same epoxy resin e3-1 as used in Example 19, 100 weight parts of the epoxy resin hardener particles H-29, 1.5 weight parts of water, 5 weight parts of polymethylene phenylene polyisocyanate (MR-200 produced by Nippon Polyurethane Co) were added, and in the same manner as in Example 19, a master batch type hardener composition F-36 for epoxy resin was obtained, and the storage stability, solvent resistance-2, and humidity resistance were evaluated. The results are shown in Table 5.

Next, in the same manner as in Example 19, a one-liquid epoxy resin composition was obtained using the master batch type epoxy resin hardener composition F-36 that was obtained, and the curability-2 thereof was evaluated. The results are shown in Table 5.

With the microencapsulated epoxy resin hardener that was obtained, it was confirmed that there was absorption at the surface of 1630 to 1680 cm$^{-1}$, and wave numbers 1680 to 1725 cm$^{-1}$, 1730 to 1755 cm$^{-1}$ and that the absorption bands matched with model compounds (1), (2), and (3) and that from the standard curves that were created, the content of binding groups (x), (y), and (z) and their concentration ratios were as shown in Table 5 and that when C13 nuclear magnetic resonance spectrum measurement was conducted on the separated capsule film, there was no carbonyl carbon from a carboxylate ester group in the capsule film.

Example 21

Epoxy resin hardener H-30' which has a main component of amine adduct A-25 was pulverized to obtain epoxy resin hardener particle H-30 of average particle size of 1.9 μm. The water content in epoxy resin hardener particles H-30 was 0.7% by weight based on 100 parts by mass of epoxy resin hardener particles.

To 200 weight parts of the same epoxy resin e3-1 as used in Example 19, 100 weight part of epoxy resin hardener particles H-30, 1.0 weight part of water, 5 weight parts of 4,4'-diphenylmethanediisocyanate (MDI) were added, and the reaction was continued for 3 hours while stirring at 40° C. Afterwards, 0.5 weight part of cyclic boric acid ester compound (L) was added, and this was reacted for a further 8 hours at 50° C., and a master batch type epoxy resin hardener composition F-37 was obtained. The storage stability, solvent resistance-2, and humidity resistance were evaluated. The results are shown in Table 5.

Next, in the same manner as in Example 19, a one-liquid epoxy resin composition was obtained using the master batch type epoxy resin hardener composition F-37 that was obtained, and the curability-2 thereof was evaluated. The results are shown in Table 5.

With the microencapsulated epoxy resin hardener that was obtained, it was confirmed that there was absorption at the surface of 1630 to 1680 cm$^{-1}$, and wave numbers 1680 to 1725 cm$^{-1}$, 1730 to 1755 cm$^{-1}$ and that the absorption bands matched with model compounds (1), (2), and (3) and that from the standard curves that were created, the content of binding groups (x), (y), and (z) and their concentration ratios were as shown in Table 5 and that when C13 nuclear magnetic resonance spectrum measurement was conducted on the separated capsule film, there was no carbonyl carbon from a carboxylate ester group in the capsule film.

Example 22

Epoxy resin hardener H-31' which has a main component of amine adduct A-26 was pulverized to obtain epoxy resin hardener particles H-31 of average particle size of 3.5 μm. The water content in epoxy resin hardener particles H-31 was 1.0% by weight based on 100 parts by mass of epoxy resin hardener particles.

To 200 weight parts of the same epoxy resin e3-1 as used in Example 19, 100 weight parts of epoxy resin hardener particles H-31, 0.5 weight parts of water, 7 weight parts of polymethylene phenylene polyisocyanate (MR-200 produced by Nippon Polyurethane Co) were added, and in the same manner as in Example 19, a master batch type hardener composition F-38 for epoxy resin was obtained, and the storage stability, solvent resistance-2, and humidity resistance were evaluated. The results are shown in Table 5.

Next, in the same manner as in Example 19, a one-liquid epoxy resin composition was obtained using the master batch type epoxy resin hardener composition F-38 that was obtained, and the curability-2 thereof was evaluated. The results are shown in Table 5.

With the microencapsulated epoxy resin hardener that was obtained, it was confirmed that there was absorption at the surface of 1630 to 1680 cm$^{-1}$, and wave numbers 1680 to 1725 cm$^{-1}$, 1730 to 1755 cm$^{-1}$ and that the absorption bands matched with model compounds (1), (2), and (3) and that from the standard curves that were created, the content of binding groups (x), (y), and (z) and their concentration ratios were as shown in Table 5 and that when C13 nuclear magnetic resonance spectrum measurement was conducted on the separated capsule film, there was no carbonyl carbon from a carboxylate ester group in the capsule film.

Comparative Example 18

Epoxy resin hardener H-32' which has a main component of amine adduct A-27 was pulverized to obtain epoxy resin hardener particles H-32-1 of average particle size of 15.5 μm. The water content in epoxy resin hardener particles H-32-1 was 4.1% by weight with respect relative to 100 parts by mass of epoxy resin hardener particles.

To 200 weight parts of the same epoxy resin e3-1 as used in Example 19, 100 weight parts of epoxy resin hardener particles H-32-1, 0.5 weight parts of water, and 3 weight parts of toluene diisocyanate (TDI) were added, and in the same manner as in Example 19, a master batch type hardener composition F-39 for epoxy resin was obtained, and the storage stability, solvent resistance-2, and humidity resistance were evaluated. The results are shown in Table 5.

Next, in the same manner as in Example 19, a one-liquid epoxy resin composition was obtained using the master batch type epoxy resin hardener composition F-39 that was obtained, and the curability-2 thereof was evaluated. The results are shown in Table 5.

With the microencapsulated epoxy resin hardener that was obtained, it was confirmed that there was absorption at the surface of 1630 to 1680 cm$^{-1}$, and wave numbers 1680 to 1725 cm$^{-1}$, 1730 to 1755 cm$^{-1}$ and that the absorption bands matched with model compounds (1), (2), and (3) and that from the standard curves that were created, the content of binding groups (x), (y), and (z) and their concentration ratios were as shown in Table 5 and that when C13 nuclear magnetic resonance spectrum measurement was conducted on the separated capsule film, there was no carbonyl carbon from a carboxylate ester group in the capsule film.

Comparative Example 19

Epoxy resin hardener H-32' which has a main component of amine adduct A-27 was pulverized to obtain epoxy resin hardener particles H-32-2 of average particle size of 1.8 μm. The water content in the epoxy resin hardener particles H-32-2 was 0.1% by weight based on 100 parts by mass of epoxy resin hardener particles.

To 200 weight parts of the same epoxy resin e3-1 as used in Example 19, 100 weight part of epoxy resin hardener particles H-32-2, 0.1 weight part of water, and 3 weight parts of toluene diisocyanate (TDI) were added, and as in the same manner as in Example 19, a master batch type hardener composition F-40 for epoxy resin was obtained, and the storage stability, solvent resistance-2 and humidity resistance were evaluated. The results are shown in Table 5.

Next, in the same manner as in Example 19, a one-liquid epoxy resin composition was obtained using the master batch type epoxy resin hardener composition F-40 that was obtained, and the curability-2 thereof was evaluated. The results are shown in Table 5.

With the microencapsulated epoxy resin hardener that was obtained, it was confirmed that there was absorption at the surface of 1630 to 1680 cm$^{-1}$, and wave numbers 1680 to 1725 cm$^{-1}$, 1730 to 1755 cm$^{-1}$ and that the absorption bands matched with model compounds (1), (2), and (3) and that from the standard curves that were created, the content of binding groups (x), (y), and (z) and their concentration ratios were as shown in Table 5 and that when C13 nuclear magnetic resonance spectrum measurement was conducted on the separated capsule film, there was no carbonyl carbon from a carboxylate ester group in the capsule film.

Example 23

Epoxy resin hardener H-32' which has a main component of amine adduct A-27 was pulverized to obtain epoxy resin hardener particles H-32-3 of average particle size of 3.1 μm. The water content in the epoxy resin hardener particle H-32-3 was 2.5% by weight with respect relative to 100 parts by mass of epoxy resin hardener particles.

To 200 weight parts of the same epoxy resin e3-1 as used in Example 19, 100 weight part of epoxy resin hardener particles H-32-3, 1.0 weight part of a polyester type polyol (Diol-400 produced by Mitsui Takeda Chemicals) as an active hydrogen compound, and 7 weight parts of 4,4'-diphenylmethanediioscyanate (MDI) were added, and the reaction was continued for 3 hours while stirring at 40° C. Afterwards, 0.2 weight part of cyclic boric acid ester compound (L) was added, and this was reacted for further 8 hours at 50° C., and a master batch epoxy resin hardener composition F-41 was obtained. The storage stability, solvent resistance-2, and humidity resistance were evaluated. The results are shown in Table 5.

Next, in the same manner as in Example 19, a one-liquid epoxy resin composition was obtained using the master batch type epoxy resin hardener composition F-41 that was obtained, and the curability-2 thereof was evaluated. The results are shown in Table 5.

With the microencapsulated epoxy resin hardener that was obtained, it was confirmed that there was absorption at the surface of 1630 to 1680 cm$^{-1}$, and wave numbers 1680 to 1725 cm$^{-1}$, 1730 to 1755 cm$^{-1}$ and that the absorption bands matched with model compounds (1), (2), and (3) and that from the standard curves that were created, the content of binding groups (x), (y), and (z) and their concentration ratios were as shown in Table 5 and that when C13 nuclear magnetic resonance spectrum measurement was conducted on the separated capsule film, there was carbonyl carbon from carboxylate ester group in the capsule film.

Production Example 28

Production of Epoxy Resin Hardener H-33' which Contains Amine Adduct A-28 as a Main Component 1.5 equivalents of bisphenol A type epoxy resin (epoxy equivalents of 185 g/equivalent, weight average molecular weight of 380, total chlorine amount of 1400 ppm, henceforth referred to as "epoxy resin e1-1") and 1 equivalent (active hydrogen conversion) of 2-methylimidazole were reacted at 80° C. in a 1/1 mixture solvent of n-butanol and toluene (resin content 50%). Afterwards, under reduced pressure, 2-methylimidazole together with the solvent was removed until the 2-methylimidazole content was less than 10 ppm, and an epoxy resin hardener H-28', which is a solid at 25° C. and which has a main component of amine adduct A-28, was obtained. The molecular weight distribution of amine adduct A-28 that was obtained was 3.5, and the weight average molecular weight was 3100. In addition, the n-butanol and toluene content with respect relative to 100 parts by mass of the epoxy resin hardener (H-33') that was obtained was less than 10 ppm.

Production Example 29

Production of Epoxy Resin Hardener H-34' which Contains Amine Adduct A-29 as a Main Component One equivalent of epoxy resin e1-1, 1 equivalent of bisphenol A type epoxy resin (epoxy equivalents of 470 g/equivalent, total chlorine amount of 1300 ppm, henceforth referred to as "epoxy resin e1-2") and 2 equivalents of triethylenetetramine were reacted at 80° C. in a 1/2 mixture solvent of 2-propanol and toluene (resin content 50%). Afterwards, under reduced pressure, the solvent was removed, and an epoxy resin hardener H-34', which is a solid at 25° C. and which has main components of amine adduct A-29 and triethylenetetramine which is a low molecular weight amine compound, was obtained. The molecular weight distribution of amine adduct A-29 that was obtained was 2.5, and the weight average molecular weight was 2400. The triethylenetetramine contained in 100 parts by mass of the epoxy resin hardener (H-29') that was obtained was 0.3% by weight. In addition, the toluene content with respect relative to 100 parts by mass of the epoxy resin hardener (H-34') that was obtained was 2.5 parts by mass, and the 2-propanol content was less than 10 ppm.

Production Example 30

Production of Epoxy Resin Hardener H-35' which Contains Amine Adduct A-30 as a Main Component 0.5 equivalent of epoxy resin e1-2, 1 equivalent of cresol novolak type epoxy resin (epoxy equivalent of 215 g/equivalent, weight average molecular weight of 480, total chlorine amount of 1500 ppm), and 1.8 equivalents of N-methylpiperadine were reacted at 80° C. in a 1/1/1 mixture solvent of 2-propanol/toluene/propyleneglycolmonomethylether (resin content 50%). Afterwards, the solvent was removed under reduced pressure, and an epoxy resin hardener H-35', which is a solid at 25° C. and which has main components of amine adduct A-30 and N-methylpiperadine which is a low molecular weight amine compound, was obtained. The molecular weight distribution of amine adduct A-30 that was obtained was 1.9, and the weight average molecular weight was 1600. In addition, the N-methylpiperadine contained in 100 parts by mass of the resulting epoxy resin hardener (H-35') was 0.8 weight parts. In 100 parts by mass of the resulting epoxy resin hardener (H-35'), there was 0.8 parts by mass of PGM and less than 10 ppm of toluene and 2-propanol.

Production Example 31

Production of Epoxy Resin Hardener H-36' which Contains Amine Adduct A-31 as a Main Component One equivalent of bisphenol A type epoxy resin e1-1 and 0.7 equivalent of 2-methylimidazole were reacted at 80° C. in a 1/1 mixture solvent of n-butanol and toluene (resin content 50%). Afterwards, under reduced pressure, the solvent was removed, and an epoxy resin hardener H-36', which is a solid at 25° C. and which has main components of amine adduct A-31 and 2-methylimidazole which is a low molecular weight amine compound, was obtained. The molecular weight distribution of amine adduct A-31 that was obtained was 3.9, and the weight average molecular weight was 3400. In addition, the 2-methylimidazole content in 100 parts by mass of the resulting epoxy resin hardener (H-36') was 0.5 weight parts. In 100 parts by mass of the resulting epoxy resin hardener (H-36'), the toluene content was 2 parts and n-butanol was less than 10 ppm.

Production Example 32

Production of Epoxy Resin Hardener H-37' which Contains Amine Adduct A-32 as a Main Component 1.5 equivalents of bisphenol F type epoxy resin (epoxy equivalents of 165 g/equivalent, weight average molecular weight of 340, total chlorine amount of 300 ppm, henceforth referred to as epoxy resin e1-4), and 1 equivalent of 2-methylimidazole were reacted in the same manner as in Production example 31. Afterwards, through distillation, an epoxy resin hardener H-37', which is a solid at 25° C. and which has main components of amine adduct A-32 and 2-methylimidazole, was obtained. The molecular weight distribution of amine adduct A-32 that was obtained was 3.1, and the weight average molecular weight was 2800. In addition, the 2-methylimidazole content in 100 parts by mass of the resulting epoxy resin hardener (H-37') was 1.5 weight parts. In 100 parts by mass of the resulting epoxy resin hardener (H-36'), the toluene content was 1.2 parts and n-butanol was less than 10 ppm.

Production Example 33

Production of Epoxy Resin Hardener H-38' which Contains Amine Adduct A-33 as a Main Component 1.8 equivalents of epoxy resin e1-1 and 1 equivalent of 2-methylimidazole were reacted in the same manner as in Production example 30. Afterwards, through distillation, an epoxy resin hardener H-38', which is a solid at 25° C. and which has main components of amine adduct A-33 and 2-methylimidazole which is a low molecular weight amine compound, was obtained. The molecular weight distribution of amine adduct A-33 that was obtained was 5.5, and the weight average molecular weight was 5600. In addition, the 2-methylimidazole content in 100 parts by mass of the resulting epoxy resin hardener (H-38') was 0.8 weight parts. In 100 parts by mass of the resulting epoxy resin hardener (H-38'), the PGM content was 0.8 parts by mass, and toluene and 2-propanol were less than 10 ppm.

Production Example 34

Production of Epoxy Resin Hardener H-39' which Contains Amine Adduct A-34 as a Main Component Four equivalents of epoxy resin e1-1 and 1 equivalent of 2-methylimidazole were reacted in the same manner as in Production example 31. Afterwards, through distillation, an epoxy resin hardener H-39', which is a solid at 25° C. and which has main components of amine adduct A-34 and 2-methylimidazole which is a low molecular weight amine compound, was obtained. The molecular weight distribution of amine adduct A-34 that was obtained was 8.5, and the weight average molecular weight was 9800. In addition, the 2-methylimidazole content in 100 parts by mass of the resulting epoxy resin hardener (H-39') was 0.1 weight parts. In 100 parts by mass of the resulting epoxy resin hardener (H-39'), the toluene content was 0.5 parts, and n-butanol was less than 10 ppm.

Production Example 35

Production of Epoxy Resin Hardener H-40' which Contains Amine Adduct A-35 as a Main Component One equivalent of epoxy resin e1-1 and 2.5 equivalents of 2-methylimidazole were reacted in the same manner as in Production example 30. Afterwards, through distillation, an epoxy resin hardener H-40', which is a solid at 25° C. and which has main components of amine adduct A-35 and 2-methylimidazole which is a low molecular weight amine compound, was obtained. The molecular weight distribution of amine adduct A-35 that was obtained was 1.5, and the weight average molecular weight was 1100. In addition, the 2-methylimidazole content in 100 parts by mass of the resulting epoxy resin hardener (H-40') was 4 parts by mass. In 100 parts by mass of the resulting epoxy resin hardener (H-39'), the PGM content was 5.5 parts by mass, and toluene and 2-propanol were less than 10 ppm.

Example 24

Epoxy resin hardener H-33' which has a main component of amine adduct A-28 was melted, and for 100 parts by mass of epoxy resin hardener (H-33'), 0.9 part by mass of 2-ethyl-4-methylimidazole and 0.2 part of n-butanol were uniformly mixed, and after cooling to room temperature, this was pulverized to obtain epoxy resin hardener particles H-33, which is a solid at 25° C. and which has an average particle size of 2.5 μm. In 100 parts by mass of the particles of epoxy resin hardener (H-33), the 2-ethyl-4-methylimidazole content was 0.9 parts by mass, the n-butanol content was 0.2 parts by mass, and the water content was 0.6 parts by mass.

To 200 weight parts of bisphenol A type liquid epoxy resin (epoxy equivalent of 175 g/equivalent, diol terminal impurity component/basic structural component=0.08, total chlorine amount of 1400 ppm, henceforth referred to as "epoxy resin e3-1"), 100 weight parts of the previously described epoxy resin hardener particles H-33, 1.5 weight parts of water, and 7 weight parts of toluene diisocyanate (TDI) were added, and the reaction was continued for 3 hours while stirring at 40° C. Afterwards, this was reacted for 8 hours at 50° C., and a master batch type epoxy resin hardener composition F-36 was obtained. Thereupon, storage stability, dispersibility, solvent resistance-2, and humidified storage stability were evaluated. The results are shown in Table 6.

Next, with 100 weight parts of a bisphenol A type epoxy resin (epoxy equivalent of 189 g/equivalent, total chlorine amount of 1200 ppm, henceforth referred to as "epoxy resin e-4-1"), 30 weight parts of the master batch type epoxy resin hardener composition F-36 that was obtained was mixed, and a one-liquid epoxy resin composition was obtained. Thereupon, the storage stability-1, curability-1, curability-2, fluidity, and shear bond strength thereof were evaluated.

With the resulting master batch type epoxy resin hardener composition, xylene was used to separate the microencapsulated epoxy resin hardener, and the surface was analyzed with FT-IR measurements, and it was confirmed that there was absorption at 1630 cm$^{-1}$ to 1680 cm$^{-1}$ and wave number 1680 to 1725 cm$^{-1}$, and 1730-1755 cm$^{-1}$. In addition, using analysis charts of model compounds (1), (2), (3) and standard curves created from standard substances and model compounds, with an absorption wavelength of 1630-1680 cm$^{-1}$, this is binding group (x) which is a urea bond which matches the absorption band of model compound (1); with an absorption wavelength of 1680-1725 cm$^{-1}$, this is binding group (y) which is a biuret bond which matches the absorption band of model compound (2); and with an absorption wavelength of 1730 to 1755 cm$^{-1}$, this is binding group (z) which is a urethane bond which matches the absorption band of model compound (3), and the content of each binding group and the concentration ratios of binding groups (x), (y), and (z) are shown in Table 6. In addition, the resulting microencapsulated epoxy resin hardener had a core to shell volume ratio of 100:3.5. C13 nuclear magnetic resonance spectrum measurement was conducted on the separated capsule film, and it was confirmed that there was no carbonyl carbon from a carboxylate ester group.

Examples 25-29

Epoxy resin hardener H-34' to H-38', which were obtained in Production examples 29 to 33 and which have main components of amine adducts A-29 to A-33, were pulverized to obtain epoxy resin hardener H-34 to H-38, which are solids at 25° C. and which are described in Table 6. The properties of the resulting epoxy resin hardener are shown in Table 6.

Furthermore, with the mixes shown in Table 6, master batch type epoxy resin hardener compositions F-37 to F-41 were obtained in the same manner as in Example 24. With all of these, as in Example 24, storage stability, dispersibility, solvent resistance-2, and humidified storage stability for the master batch type epoxy resin hardener compositions were evaluated. The results are shown in Table 6. Furthermore, as with Example 24, 30 weight parts of the master batch type epoxy resin hardener composition F-37 to F-41 that were obtained were mixed with 100 parts by mass of epoxy resin e-4-1 to obtain a one-liquid epoxy resin composition. Thereupon, storage stability-1, curability-1, curability-2, fluidity, and shear bond strength thereof were evaluated.

As with Example 24, with the resulting master batch type epoxy resin hardener composition, xylene was used to separate the microencapsulated epoxy resin hardener, and the surface thereof was analyzed with FT-IR measurements, and it was confirmed that binding groups (x), (y), and (z) were present. In addition, using analysis charts of model compounds (1), (2), (3) and standard curves created from standard substances and model compounds, the content of each binding group and the concentration ratios of binding groups (x), (y), and (z) and the core to shell volume ratio for the microencapsulated epoxy resin hardener which was obtained are as shown in Table 6. C13 nuclear magnetic resonance spectrum measurement was conducted on the separated capsule film, and it was confirmed that there was no carbonyl carbon from a carboxylate ester group.

Example 30

Epoxy resin hardener H-37', which was obtained in Production example 32 and which has a main component of amine adduct A-32, was pulverized to obtain epoxy resin hardener H-37 which was obtained, which is a solid at 25° C. and which is described in Table 6. One hundred parts by mass of the resulting epoxy resin hardener H-37, 1.5 parts by mass of water, 5 parts by mass of MR-200 were added, and the reaction was continued for 3 hours while stirring at 40° C. Afterwards, 0.1 parts of cyclic boric acid ester compound (L) was added, and a further shell-forming reaction was conducted for 8 hours at 50° C. to obtain a master batch type epoxy resin hardener composition F-42. In the same manner as in Example 24, the storage stability, dispersibility, solvent resistance-2, and humidified storage stability thereof were evaluated. The results are shown in Table 6. Furthermore, in the same manner as in Example 24, with 100 parts by mass of epoxy resin e-4-1, 30 weight parts of the resulting master batch type epoxy resin hardener composition F-42 was mixed, and a one-liquid epoxy resin composition was obtained. Thereupon, the storage stability-1, curability-1, curability-2, fluidity, and shear bond strength thereof were evaluated.

In the same manner as in Example 24, with the resulting master batch type epoxy resin hardener composition, xylene was used to separate the microencapsulated epoxy resin hardener, and the surface thereof was analyzed with FT-IR measurements, and it was confirmed that binding groups (x), (y), and (z) were present. In addition, using analysis charts of model compounds (1), (2), (3) and standard curves created from standard substances and model compounds, the content and the concentration ratios of binding groups (x), (y), and (z) and the core to shell volume ratio for the microencapsulated epoxy resin hardener which was obtained are as shown in Table 6. C13 nuclear magnetic resonance spectrum measurement was conducted on the separated capsule film, and it was confirmed that there was no carbonyl carbon from a carboxylate ester group.

Comparative Example 20

Epoxy resin hardener H-39', which was obtained in Production example 34 and which has main component of amine adduct A-34, was pulverized to obtain epoxy resin hardener H-39, which is a solid at 25° C. and which is described in Table 6. The properties of the resulting epoxy resin hardener are shown in Table 6.

Furthermore, with the mix shown in Table 6, a master batch type epoxy resin hardener composition F-43 was obtained in the same manner as in Example 24. As in Example 24, storage stability, dispersibility, solvent resistance-2, and humidified storage stability for the master batch type epoxy resin hardener composition were evaluated. The results are shown in Table 6. Furthermore, as with Example 24, 30 weight parts of the master batch type epoxy resin hardener composition F-43 that was obtained was mixed with 100 parts by mass of epoxy resin e-4-1 to obtain a one-liquid epoxy resin composition. Thereupon, storage stability-1, curability-1, curability-2, fluidity, and shear bond strength thereof were evaluated.

As with Example 24, with the master batch type epoxy resin hardener composition, xylene was used to separate the microencapsulated epoxy resin hardener, and the surface thereof was analyzed with FT-IR measurements, and it was confirmed that binding groups (x), (y), and (z) were present. In addition, using analysis charts of model compounds (1), (2), (3) and standard curves-created from standard substances and model compounds, the content and the concentration ratios of binding groups (x), (y), and (z) and the core to shell volume ratio for the microencapsulated epoxy resin hardener which was obtained are as shown in Table 6. C13 nuclear magnetic resonance spectrum measurement was conducted on the separated capsule film, and it was confirmed that there was no carbonyl carbon from a carboxylate ester group.

Comparative example 21

Epoxy resin hardener H-39', which was obtained in Production example 34 and which has a main component of amine adduct A-34, was melted, and per 100 parts by mass of epoxy resin hardener (H-39'), 3.9 parts by mass of 2-methylimidazole was added, and after cooling to room temperature, this was pulverized, and epoxy resin hardener H-39-2, which is a solid at 25° C. and which is described in Table 6, was obtained. The properties of the resulting epoxy resin hardener are shown in Table 6.

Furthermore, with the mix shown in Table 6, a master batch type epoxy resin hardener composition F-44 was obtained in the same manner as in Example 24. As in Example 24, storage stability, dispersibility, solvent resistance-2, and humidified storage stability for the master batch type epoxy resin hardener composition were evaluated. The results are shown in Table 6. Furthermore, as with Example 24, 30 weight parts of the master batch type epoxy resin hardener composition F-44 that was obtained was mixed with 100 parts by mass of epoxy resin e-4-1 to obtain a one-liquid epoxy resin composition. Thereupon, storage stability-1, curability-1, curability-2, fluidity, and shear bond strength thereof were evaluated.

As with Example 24, with the master batch type epoxy resin hardener composition, xylene was used to separate the microencapsulated epoxy resin hardener, and the surface thereof was analyzed with FT-IR measurements, and it was confirmed that binding groups (x), (y), and (z) were present.

In addition, using analysis charts of model compounds (1), (2), (3) and standard curves created from standard substances and model compounds, the content and the concentration ratios of binding groups (x), (y), and (z) and the core to shell volume ratio for the microencapsulated epoxy resin hardener which was obtained are as shown in Table 6. C13 nuclear magnetic resonance spectrum measurement was conducted on the separated capsule film, and it was confirmed that there was no carbonyl carbon from a carboxylate ester group.

Comparative Example 22

When producing a master batch type epoxy resin hardener composition F-45 using the same epoxy resin hardener H-39-2 as in Comparative example 21, as in Example 30, 0.2 parts of cyclic boric acid ester compound (L) was added, and a further shell-forming reaction was conducted for 8 hours at 50° C. to obtain a master batch type epoxy resin hardener composition F-45. In the same manner as in Example 24, the storage stability, dispersibility, solvent resistance-2, and humidified storage stability were evaluated for the master batch type epoxy resin hardener composition. The results are shown in Table 6. Furthermore, in the same manner as in Example 24, with 100 parts by mass of epoxy resin e-4-1, 30 weight parts of the resulting master batch type epoxy resin hardener composition F-45 was mixed, and a one-liquid epoxy resin composition was obtained. Thereupon, the storage stability-1, curability-1, curability-2, fluidity, and shear bond strength were evaluated.

As with Example 24, with the master batch type epoxy resin hardener composition, xylene was used to separate the microencapsulated epoxy resin hardener, and the surface thereof was analyzed with FT-IR measurements, and it was confirmed that binding groups (x), (y), and (z) were present. In addition, using analysis charts of model compounds (1), (2), (3) and standard curves created from standard substances and model compounds, the content and the concentration ratios of binding groups (x), (y), and (z) and the core to shell volume ratio for the microencapsulated epoxy resin hardener which was obtained are as shown in Table 6. C13 nuclear magnetic resonance spectrum measurement was conducted on the separated capsule film, and it was confirmed that there was no carbonyl carbon from a carboxylate ester group.

Comparative Example 23

Epoxy resin hardener H-40', which was obtained in Production example 35 and which has main component of amine adduct A-35, was pulverized to obtain epoxy resin hardener H-40, which is a solid at 25° C. and which is described in Table 6. The properties of the resulting epoxy resin hardener are shown in Table 6.

Furthermore, with the mix shown in Table 6, a master batch type epoxy resin hardener composition F-46 was obtained in the same manner as in Example 24. As in Example 24, storage stability, dispersibility, solvent resistance-2, and humidified storage stability for the master batch type epoxy resin hardener composition were evaluated. The results are shown in Table 6. Furthermore, as with Example 24, 30 weight parts of the master batch type epoxy resin hardener composition F-46 that was obtained was mixed with 100 parts by mass of epoxy resin e-4-1 to obtain a one-liquid epoxy resin composition. Thereupon, storage stability-1, curability-1, curability-2, fluidity, and shear bond strength thereof were evaluated.

As with Example 24, with the master batch type epoxy resin hardener composition, xylene was used to separate the microencapsulated epoxy resin hardener, and the surface thereof was analyzed with FT-IR measurements, and it was confirmed that binding groups (x), (y), and (z) were present. In addition, using analysis charts of model compounds (1), (2), (3) and standard curves created from standard substances and model compounds, the content and the concentration ratios of binding groups (x), (y), and (z) and the core to shell volume ratio for the microencapsulated epoxy resin hardener which was obtained are as shown in Table 6. C13 nuclear magnetic resonance spectrum measurement was conducted on the separated capsule film, and it was confirmed that there was no carbonyl carbon from a carboxylate ester group.

Example 31

When producing a master batch type epoxy resin hardener composition F-47 using the same epoxy resin hardener H-40 as in Comparative Example 23, to 200 weight parts of the same epoxy resin e3-1 as used in Example 30, 100 part by mass of epoxy resin hardener H-40, 1.0 weight part of a polyester type polyol (Diol-400 produced by Mitsui Takeda Chemicals) as an active hydrogen compound, 7 weight parts of 4,4'-diphenylmethanediisocyanate (MDI) were added, and the reaction was continued for 3 hours while stirring at 40° C. Afterwards, 0.2 weight part of cyclic boric acid ester compound (L) was added, and this was further reacted for 8 hours at 50° C. to obtain a master batch type epoxy resin hardener composition F-47. In the same manner as in Example 24, the storage stability, dispersibility, solvent resistance-2, and humidified storage stability were evaluated for the master batch type epoxy resin hardener composition. The results are shown in Table 6. Furthermore, in the same manner as in Example 24, with 100 parts by mass of epoxy resin e-4-1, 30 weight parts of the resulting master batch type epoxy resin hardener composition F-47 was mixed, and a one-liquid epoxy resin composition was obtained. Thereupon, the storage stability-1, curability-1, curability-2, fluidity, and shear bond strength were evaluated.

As with Example 24, with the master batch type epoxy resin hardener composition, xylene was used to separate the microencapsulated epoxy resin hardener, and the surface thereof was analyzed with FT-IR measurements, and it was confirmed that binding groups (x), (y), and (z) were present. In addition, using analysis charts of model compounds (1), (2), (3) and standard curves created from standard substances and model compounds, the content and the concentration ratios of binding groups (x), (y), and (z) and the core to shell volume ratio for the microencapsulated epoxy resin hardener are as shown in Table 6. C13 nuclear magnetic resonance spectrum measurement was conducted on the separated capsule film, and it was confirmed that there was carbonyl carbon from a carboxylate ester group.

[Example of Making a Conductive Film]

Fifteen parts of bisphenol A type epoxy resin (AER-2603 produced by Asahi Kasei Chemicals), 6 parts of phenol novolak resin (product name "BRG-558" produced by Showa Highpolymer Co.), and 4 parts of synthetic rubber ("Nipol 1072" produced by Zeon Co. weight average molecular weight of 300,000) were dissolved in 20 parts of a 1:1 (weight ratio) mixture solvent of methylethylketone and butyl cellosolve acetate. Seventy four (74) parts of silver powder was mixed into this solution, and this was further mixed with a three roll mill. To this, 30 parts of the master batch type epoxy resin hardener obtained in Example 24 was further added, and this was further uniformly mixed, and a conductive adhesive was obtained. Using the conductive adhesive that was obtained, this was cast on top of a polypropylene film of thickness 40 μm, and this was dried and semi-cured for 60 minutes at 80° C., and a conductive film having a conductive adhesive layer of thickness 35 μm was obtained. Using this conductive film, on top of a heat block of 80° C., the conductive adhesive layer was transferred to the back surface of a silicon wafer. Furthermore, there was full dicing of the silicon wafer, and on top of the heat block, the semiconductor chip with the conductive adhesive was attached and cured to the lead frame under conditions of 2 minutes at 200° C., and there were no problems with the conductivity of the chip.

[Example of Making a Conductive Paste]

To 100 parts of epoxy resin (M), 30 parts of the master batch type epoxy resin hardener composition obtained in Example 24, 150 g of squamous silver powder (made by Tokuriki Chemical Research Co. Ltd.) which has an average particle size of 14 μm and an aspect ratio of 11, and 60 g of squamous nickel powder (product name "NI110104" produced by Kojundo Chemical Laboratory Co. Ltd.) which has an average particle size of 10 μm and an aspect ratio of 9 were added, and after stirring until uniform, this was uniformly dispersed with a three roll mill to make a conductive paste. After screen printing the resulting conductive paste onto a polyimide film substrate of thickness 1.4 mm, this was heated and cured for 1 hour at 200° C. When the conductivity of the resulting circuit board was measured, this was useful as a conductive paste.

[Example of Making an Anisotropic Conductive Film]

Forty weight parts of bisphenol A type epoxy resin (AER6097 made by Asahi Kasei Chemicals, epoxy equivalents of 42500 g/eq) and 30 weight parts of a phenoxy resin (YP-50 made by Tohto Kasei) were dissolved in 30 parts of ethyl acetate, and 30 parts of the master batch type epoxy resin hardener composition obtained in Example 24 and 5 parts of conductive particles (gold-plated cross-linked polystyrene) of particle size 8 μm were added thereof and mixed uniformly, and a one-liquid epoxy resin composition was obtained. This was coated on top of a polyester film, and the ethyl acetate was dried and removed at 70° C., and the anisotropic conductive film was obtained.

The resulting anisotropic conductive film was sandwiched between an IC chip and electrodes, and with heat crimping at 30 kg/cm² for 20 seconds on top of a hotplate of 200° C., the electrodes were joined, and there was conduction, and this was useful as an anisotropic conductive material.

[Example of Making an Anisotropic Conductive Paste]

After mixing 50 weight parts of bisphenol A type epoxy resin (AER6091 made by Asahi Kasei Chemicals, epoxy equivalents of 480 g/eq), 50 weight parts of bisphenol A type epoxy resin (AER2603 made by Asahi Kasei Chemicals), and 5 weight parts of micropearl Au-205 (made by Sekisui Kagaku, specific gravity 2.67) as conductive particles, 30 parts of master batch type epoxy resin hardener composition obtained in Example 24 was added, and this was further mixed uniformly, and an anisotropic conductive paste was obtained. The resulting anisotropic conductive paste was coated onto a low-alkali glass having an ITO electrode. This was pressed together and bonded with a testing TAB (Tape Automated Bonding) film with a pressure of 2 MPa for 30 seconds with a ceramic tool at 230° C. When the resistance between adjacent ITO electrodes were measured, this was useful as an anisotropic conductive paste.

[Example of Making an Insulation Paste]

After mixing 100 weight parts of bisphenol F type epoxy resin (Product name: "YL983U" of Yuka Shell Epoxy Co. Ltd.), 4 weight parts of dicyandiamide, 100 weight parts of silica powder, 10 weight parts of phenylglycidylether as a diluent, and 1 weight part of organic phosphate (Product name "PM-2" made by Nippon Kayaku), this was further mixed with a three roll mill. In addition, 30 parts of master batch type epoxy resin hardener composition obtained in Example 24 was added thereto, and this was further mixed uniformly, and vacuum degassing and centrifuge degassing were conducted, and an insulation paste was produced. Using the resulting insulation paste, a semiconductor chip was bonded to a resin substrate by heating and hardening for 1 hour at 200° C., and this was useful as an insulation paste.

[Example of Making an Insulation Film]

After mixing and uniformly dispersing 180 weight parts of phenoxy resin (Product name "YP-50" produced by Tohto Kasei Corp. Ltd.), 40 weight parts of cresol novolak type epoxy resin (epoxy equivalent of 200 g/eq, Product name "EOCN-1020-80" produced by Nippon Kayaku Co. Ltd.), 300 weight parts of spherical silica (average particle size: 2 μm, product name "SE-5101" produced by Admatechs Co., Ltd.), and 200 weight parts of methylethylketone, 250 weight parts of the master batch type epoxy resin hardener composition obtained in Example 24 was added to this, and this was further stirred and mixed and a solution containing the epoxy resin composition was obtained. On top of polyethyleneterephthalate which has had mold separation treatment, the resulting solution was coated so that a thickness of 50 μm after drying was achieved, and heat drying in a hot air circulation dryer was conducted to obtain an insulation film for semiconductor bonding. The resulting insulation film for semiconductor bonding was cut for each support base at a size that was bigger than the wafer size of 5 inches, and a resin film was joined on the electrode side of a wafer with bump electrodes. Next, support base with mold release treatment was inserted above, and a wafer with a bonding resin was obtained by heat pressing in a vacuum at 70° C., 1 MPa, heating time 10 seconds. Then, it was observed that there was no peeling of resin in the individual pieces of semiconductor with adhesive film when pieces were cut and separated using a dicing saw (DAD-2H6M produced by DISCO) at a spindle rotation number 30,000 rpm, cutting speed 20 mm/sec. The resulting film was useful as an insulation film.

[Example of Making an Encapsulating Material]

Fifty weight parts of bisphenol A type epoxy resin (AER6091 produced by Asahi Kasei Chemicals, epoxy equivalents of 480 g/eq), 50 weight parts of bisphenol A type epoxy resin (AER2603 produced by Asahi Kasei Chemicals), and 40 weight parts of HN-2200 (Hitachi Chemical Co., Ltd.) which has a main component of anhydrous phthalic anhydride as a hardener, and 80 weight parts of spherical molten silica of average particle size of 16 μm were uniformly dispersed and mixed. To this, 5 weight parts of the master batch type epoxy resin hardener composition which was obtained in the Example 24 were added to achieve an epoxy resin composition. The resulting epoxy resin composition was coated in a 1 cm square to a thickness of 60 μm on a printed circuit board, and this was heated in an oven for 10 minutes at 110° C. and semi-cured. Afterwards, a 1 cm square silicon chip of thickness 370 μm was placed on top of the semi-cured epoxy resin composition, and a load was added, and while maintaining contact of the bump and an electrode of the chip, complete hardening treatment was conducted for 1 hour at 220° C. The encapsulating material comprising the epoxy resin composition that was obtained was useful and had no problems in outer appearance and in conduction of the chip.

[Example of Making a Coating Material]

Thirty parts of the master batch type epoxy resin hardener compositions obtained in Example 24 were added to 30 parts of epoxy resin (M), 30 parts of YP-50 (produced by Tohto Kasei) as a phenoxy resin, 50 parts of methylethylketone solution of a methoxy group-containing silane-denatured epoxy resin (product name "Compoceran E103" produced by Arakawa Chemical Industries Ltd.), and a solution was prepared in which this was diluted and mixed with methylethylketone to 50 weight %. The prepared solution was coated on top of a release PET (polyethylene terephthalate) film (SG-1 produced by Panac Industries, INC) using a roll coater, and this was dried and cured for 15 minutes at 150° C., and a semi-cured resin (dry film) with release film of film thickness 100 μm was created. After these dry films were heated and pressed onto previous copper clad laminates at 120° C. for 10 minutes at 6 MPa, this was returned to room temperature, and the release film was removed, and when this was cured for 2 hours at 200° C., a substance that was useful as a coating material for insulation between layers was obtained.

[Example of Making a Coating Composition]

Thirty weight parts of titanium dioxide and 70 weight parts of talc were mixed with 50 weight parts of bisphenol A type epoxy resin (AER6091 produced by Asahi Kasei Chemicals, epoxy equivalents of 480 g/eq), and 140 weight parts of a 1:1 mixture solvent of MIBK/xylene as a mixture solvent was added, stirred, and mixed, and this was a main agent. To this, 30 weight parts of the master batch type epoxy resin hardener composition obtained in Example 24 was added, and this was uniformly dispersed to obtain a substance useful as an epoxy resin composition.

[Example of Making a Prepreg]

Fifteen parts of a novolak type epoxy resin (Epiclon N-740 produced by Dainippon Ink And Chemicals Inc), 40 parts of bisphenol F type epoxy resin (epicoat 4005 produced by JER), 30 parts of bisphenol A type liquid epoxy resin (AER2603 produced by Asahi Kasei Chemicals) were dissolved and mixed inside a flask in an oil bath of 130° C., and this was cooled to 80° C. Fifteen parts of master batch type epoxy resin hardener composition obtained in Example 24 was further added, and this was sufficiently stirred and mixed. The previously described resin composition which has been cooled to room temperature was coated onto a release paper at a resin coating weight of 162 g/m² using a doctor knife to make a resin film. Next, Mitsubishi rayon CF cloth (model number: TR3110, coating weight 200 g/m²) which is a plain weave of 12.5 fibers/inch of carbon fiber with elasticity of 24 ton/mm² was placed on top of this resin film, and after impregnating the resin composition into the carbon fiber cloth, a propylene film was layered, and this was passed between a pair of rolls with a surface temperature 90° C. to create a cloth prepreg. The resin content was 45 weight %. The resulting prepreg was further layered in the same fiber direction, and molding was conducted at curing conditions of 150° C.×1 hour, and a FRP molded article with reinforcing fibers of carbon fiber was obtained, and the created prepreg was useful.

[Example of Making a Thermal Conductive Epoxy Resin Composition]

One hundred parts of bisphenol A type epoxy resin (AER2603 produced by Asahi Kasei Chemicals), 40 weight parts of a 50% methylethylketone solution of a phenol novolak resin (product name "Tamanol 759" produced by Arakwa Kagaku Kogyo Corp. Ltd.) as an epoxy resin hardener, and 15 weight parts of flake graphite powder (HOPG produced by Union Carbide) were stirred until uniform, and then this was uniformly dispersed with a three roll mill. To this, 15 parts of master batch type epoxy resin hardener composition obtained in Example 24 was further added, and this was adequately stirred and mixed. Using the resulting conductive paste, a semiconductor chip (1.5 mm square, thickness 0.8 mm) was mounted on top of a Cu lead frame, and in addition, heat curing was conducted for 150° C. for 30 minutes to obtain a sample for evaluation. The thermal conductivity of the resulting sample was measured by laser flash method. In other words, from the measured thermal diffusivity α, specific heat Cp, and density σ, the thermal conductivity K was determined by the following formula, K=α×Cp×α, and K was $5 \times 10^{-3}$ Cal/cm·sec·° C. or greater, and this was useful as a thermal conductive paste.

[Example of Making a Sealing Material for Fuel Cell]

After mixing with a mixer the raw material of a mixture of 100 parts by mass of a biphenyl type epoxy resin 3,3',5,5'-tetramethyl-4,4'-dihydroxybiphenylglycidylether (Epicoat YX-4000 made by Japan Epoxy Resin, epoxy equivalents of 195), 60 parts of phenol novolak resin (TD-2131, produced by Dainippon Ink), 10 parts of bisphenol A type epoxy resin (AER2603, produced by Asahi Kasei Chemicals), 800 parts by mass of artificial graphite (product name "SGP" produced by SEC Co., average particle size 75 μm), mold release agent (calcium stearate), and lubricant (carnauba wax), 10 parts of master batch type epoxy resin hardener composition obtained in Example 24 was added, and this was uniformly mixed with a three roll mill. The resulting material was pressure molded in a die for separator material for a fuel cell with a molding pressure of 25 MPa, molding temperature of 150° C. and molding time of 15 minutes, and a sample for evaluation was obtained. When the flexural strength of the resulting separator material for fuel cell was measured according to JIS K 7203, the flexural strength was 50 MPa. In addition, when gas permeability was measured using nitrogen gas according to the JIS K7126 A method, the gas permeability was 0.6 cm³/m²·24 hours·atm, and this was useful as separator material for fuel cell.

[Table 1-1]

TABLE 1

| | | | Example 1 | Example 2 | Example 3 | Example 4 | Example 5 | Example 6 | Example 7 |
|---|---|---|---|---|---|---|---|---|---|
| Starting material for forming microencapsulated epoxy resin hardener | Epoxy resin hardener (H) | Amine adduct (A) | A-1 | A-2 | A-3 | A-4 | A-5 | A-6 | A-4 |
| | | Molecular weight distribution of amine adduct | 3.5 | 2.5 | 1.9 | 3.9 | 3.1 | 5.5 | 3.9 |
| | | Low molecular weight amine compound (B) | 2E4Z | TETA | NP | 2MZ | 2MZ | 2MZ | 2MZ |

TABLE 1-continued

|  |  | | | | | | | |
|---|---|---|---|---|---|---|---|---|
|  | Content of low molecular weight amine compound (B) with respect relative to 100 parts by mass of epoxy resin hardener(H) | 0.9 part | 0.3 part | 0.8 part | 0.5 part | 0.15 part | 0.1 part | 0.5 part |
|  | Water content with respect relative to 100 parts by mass of epoxy resin hardener (H) | 0.6 part | 1.2 parts | 0.8 part | 0.4 part | 1.5 parts | 0.5 part | 0.4 part |
|  | Average particle size (μm) | 2.5 | 2.0 | 1.9 | 2.4 | 2.9 | 2.5 | 2.4 |
| Mixture for master batch type epoxy resin hardener composition which contains microencapsulated epoxy resin hardener | Epoxy resin hardener (H) | H-1 100 parts | H-2 100 parts | H-3 100 parts | H-4 100 parts | H-5 100 parts | H-6 100 parts | H-4 100 parts |
|  | Isocyanate compound | TDI 7 parts | MR200 5 parts | OTI 12 parts | MR200 8 parts | MR200 7 parts | MDI 9 parts | MR200 5 parts |
|  | Active hydrogen compound | Water 1.5 parts | Water 1.5 parts | Water 2 parts | Water 1 part | Water 1 part | Water 1.5 parts | Water 1.5 parts |
|  | Epoxy resin (e3) | e3-1 200 parts | e3-2 200 parts | e3-1 200 parts | e3-2 200 parts | e3-2 200 parts | e3-2 200 parts | e3-2 200 parts |
|  | Content of cyclic boric acid ester compound (L) | — | — | — | — | — | — | 0.07 part |
|  | Total chlorine amount (ppm) | 1500 ppm | 1400 ppm | 1800 ppm | 1600 ppm | 900 ppm | 1700 ppm | 1600 ppm |
| Master batch type epoxy resin hardener composition | | F-1 | F-2 | F-3 | F-4 | F-5 | F-6 | F-7 |
| Storage stability-1 of the one-liquid epoxy resin composition | | ◎ | ○ | ◎ | ○ | ○ | ◎ | ◎ |
| Curability-1 of the one-liquid epoxy resin composition | | ○ | ◎ | ◎ | ○ | ○ | ○ | ◎ |
| Solvent resistance-1 of master batch type epoxy resin hardener | | ◎ | ◎ | ◎ | ○ | ○ | ◎ | ◎ |

|  |  |  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|---|
| Starting material for forming microencapsulated epoxy resin hardener | Epoxy resin hardener (H) | Amine adduct (A) | A-8 | A-8 | A-7 | A-7 | A-7 | A-1 | A-1 | A-1 |
|  |  | Molecular weight distribution of amine adduct | 1.5 | 1.5 | 8.5 | 8.5 | 8.5 | 3.5 | 3.5 | 3.5 |
|  |  | Low molecular weight amine compound (B) | 2MZ | 2MZ | 2MZ | 2MZ | 2MZ | 2MZ | 2MZ | 2MZ |
|  |  | Content of low molecular weight amine compound (B) with respect relative to 100 parts by mass of epoxy resin hardener (H) | 4 parts | 4 parts | 0.1 part | 4 parts | 4 parts | Less than 0.001 part | 5.5 parts | 5.5 parts |
|  |  | Water content with respect relative to 100 parts by mass of epoxy resin hardener (H) | 1.5 parts | 1.5 parts | 3.5 parts | 3.5 parts | 3.5 parts | 4 parts | 0.01 part | 0.01 part |
|  |  | Average particle size (μm) | 3.1 | 3.1 | 2.1 | 2.1 | 2.1 | 2.5 | 2.5 | 2.5 |

TABLE 1-continued

| Mixture for master batch type epoxy resin hardener composition which contains microencapsulated epoxy resin hardener | Epoxy resin hardener (H) | H-7 100 parts | H-7 100 parts | H-8 100 parts | H-9 100 parts | H-9 100 parts | H-10 100 parts | H-11 100 parts | H-11 100 parts |
|---|---|---|---|---|---|---|---|---|---|
| | Isocyanate compound | TDI 9 parts | TDI 9 parts | MDI 9 parts | MR200 9 parts | MR200 9 parts | OTI 12 parts | MR200 9 parts | MR200 9 parts |
| | Active hydrogen compound | Water 1 part | Water 1 part | Water 0 part | Water 1 part | Water 1 part | Water 2 parts | Water 1 part | Water 1 part |
| | Epoxy resin (e3) | e3-1 200 parts | e3-1 200 parts | e3-1 200 parts | e3-1 200 parts | e3-1 200 parts | e3-1 200 parts | e3-1 200 parts | e3-1 200 parts |
| | Content of cyclic boric acid ester compound (L) | — | 0.1 part | — | — | 0.2 part | — | — | 0.15 part |
| | Total chlorine amount (ppm) | 1800 ppm | 1850 ppm | 1700 ppm | 1700 ppm | 1700 ppm | — | 1600 ppm | 1600 ppm |
| Master batch type epoxy resin hardener composition | | F-8 | F-9 | F-10 | F-11 | F-12 | F-13 | F-14 | F-15 |
| Storage stability-1 of the one-liquid epoxy resin composition | | XX | X | ⊚ | X | Δ | — | XX | X |
| Curability-1 of the one-liquid epoxy resin composition | | ⊚ | ○ | X | ○ | ○ | — | ⊚ | ⊚ |
| Solvent resistance-1 of master batch type epoxy resin hardener | | X | XX | ○ | Δ | Δ | — | X | X | epoxy resin e3-1: bisphenol A type liquid epoxy resin (epoxy equivalent of 175 g/equivalent, diol terminal impurity component/basic structural component = 0.08, total chlorine amount: 1400 ppm)
epoxy resin e3-2: bisphenol F type liquid epoxy resin (epoxy equivalent of 165 g/equivalent, diol terminal impurity component/basic structural component = 0.12, total chlorine amount: 1300 ppm)
2MZ: 2-methylimidazole
TETA: triethylenetetramine
NP: N-methylpiperadine
2E4MZ: 2-ethyl-4-methylimidazole
TDI: tolylene diisocyanate
OTI: 1,8-diisocyanate-4-isocyanatemethyloctane
MDI: 4,4'-diphenylmethanediisocyanate
MR-200: polymethylenephenylenepolyisocyanate produced by Nippon Polyurethane Co.
Cyclic boric acid ester compound (L): 2,2'-oxybis(5,5'-dimethyl-1,3,2-oxaborinane)

[Table 2]

TABLE 2

| | | | Example 8 | Example 9 | Example 10 | Comparative Example 9 | Comparative Example 10 | Comparative Example 11 | Comparative Example 12 | Comparative Example 13 |
|---|---|---|---|---|---|---|---|---|---|---|
| Starting material for forming microencapsulated epoxy resin hardener | Epoxy resin hardener (H) | Amine adduct (A) | A-9 | A-10 | A-9 | A-8 | A-8 | A-11 | A-11 | A-11 |
| | | Molecular weight distribution of amine adduct | 3.9 | 6.2 | 3.9 | 1.5 | 1.5 | 9.5 | 9.5 | 9.5 |
| | | Low molecular weight amine compound (B) | 2MZ | 2MZ | 2MZ | 2MZ | 2MZ | 2MZ | 2MZ | 2MZ |
| | | Content of low molecular weight amine compound (B) with respect relative to 100 parts by mass of amine adduct (A) | 0.5 part | 0.1 part | 0.5 part | 4 parts | 4 parts | 0.1 part | 4 parts | 4 parts |
| | | Average particle size (μm) | 2.4 | 2.5 | 2.4 | 3.1 | 3.1 | 4.1 | 3.5 | 3.5 |
| Mixture for master batch type epoxy resin hardener composition which contains microencapsulated epoxy resin hardener | Epoxy resin hardener (H) | | H-12 100 parts | H-13 100 parts | H-12 100 parts | H-7 100 parts | H-7 100 parts | H-14 100 parts | H-15 100 parts | H-15 100 parts |
| | Isocyanate compound | | MR200 9 parts | MDI 9 parts | MR200 5 parts | TDI 9 parts | TDI 9 parts | MDI 9 parts | MR200 9 parts | MR200 9 parts |
| | Active hydrogen compound | | Water 2 parts | Water 1.5 parts | Water 1.5 parts | Water 1 part | Water 1 part | Water 2 parts | Water 2 parts | Water 2 parts |
| | Epoxy resin (e3) | | e3-2 200 parts | e3-2 200 parts | e3-2 200 parts | e3-1 200 parts | e3-1 200 parts | e3-1 200 parts | e3-1 200 parts | e3-1 200 parts |
| | Content of cyclic boric acid ester compound (L) | | — | — | 0.07 part | — | 0.1 part | — | — | 0.1 part |
| | Total chlorine amount (ppm) | | 1600 ppm | 1700 ppm | 1700 ppm | 1800 ppm | 1850 ppm | 1800 ppm | 1800 ppm | 1800 ppm |
| Master batch type epoxy resin hardener composition | | | F-16 | F-17 | F-18 | F-19 | F-20 | F-21 | F-22 | F-23 |

TABLE 2-continued

|  | Example 8 | Example 9 | Example 10 | Comparative Example 9 | Comparative Example 10 | Comparative Example 11 | Comparative Example 12 | Comparative Example 13 |
|---|---|---|---|---|---|---|---|---|
| Storage stability-1 of the one-liquid epoxy resin composition | ◎ | ◎ | ◎ | XX | X | ◎ | X | Δ |
| Curability-1 of the one-liquid epoxy resin composition | ○ | ○ | ◎ | ◎ | ○ | X | ○ | ○ |
| Shear bond strength (kg/cm$^2$) | 162 | 175 | 164 | 138 | 137 | 159 | 157 | 156 | epoxy resin e3-1: bisphenol A type liquid epoxy resin (epoxy equivalent of 175 g/equivalent, diol terminal impurity component/basic structural component = 0.08, total chlorine amount: 1400 ppm)
epoxy resin e3-2: bisphenol F type liquid epoxy resin (epoxy equivalent of 165 g/equivalent, diol terminal impurity component/basic structural component = 0.12, total chlorine amount: 1300 ppm)
2MZ: 2-methylimidazole
2E4MZ: 2-ethyl-4-methylimidazole
TDI: tolylene diisocyanate
MDI: 4,4'-diphenylmethanediisocyanate
MR-200: polymethylenephenylenepolyisocyanate produced by Nippon Polyurethane Co.
Cyclic boric acid ester compound (L): 2,2'-oxybis(5,5'-dimethyl-1,3,2-oxaborinane)

[Table 3]

TABLE 3

|  |  |  | Example 11 | Example 12 | Example 13 | Example 14 | Comparative Example 14 | Comparative Example 15 |
|---|---|---|---|---|---|---|---|---|
| Starting material for forming microencapsulated epoxy resin hardener | Epoxy resin hardener (H) | Amine adduct (A) | A-12 | A-13 | A-14 | A-15 | A-16 | A-17 |
|  |  | Low molecular weight amine compound (B) | 2E4Z | TETA | NP | 2MZ | 2MZ | 2MZ |
|  |  | Content of low molecular weight amine compound (B) with respect relative to 100 parts by mass of epoxy resin hardener (H) | 0.9 part | 0.3 part | 0.8 part | 0.4 part | 0.5 part | 0.2 part |
|  |  | Water content with respect relative to 100 parts by mass of epoxy resin hardener (H) | 0.6 part | 1.2 parts | 0.7 part | 1 part | 3.5 parts | 5.5 parts |
|  |  | Content of solvent (SL) with respect relative to 100 parts by mass of epoxy resin hardener (H) | n-butanol 0.2 part | toluene 2.5 parts | PGM 0.8 part | toluene 0.8 part | toluene 12 parts | PGM 8 parts |
|  |  | Average particle size (μm) | 2.5 | 2.0 | 1.9 | 3.5 | 4.5 | 5.1 |
| Mixture of master batch type epoxy resin hardener composition which contains microencapsulated epoxy resin hardener | Epoxy resin hardener (H) |  | H-16 100 parts | H-17 100 parts | H-18 100 parts | H-19 100 parts | H-20 100 parts | H-21 100 parts |
|  | Isocyanate compound |  | TDI 7 parts | MR200 5 parts | MDI 5 parts | MR200 7 parts | TDI 9 parts | MDI 10 parts |
|  | Active hydrogen compound |  | Water 1.5 parts | Water 1.5 parts | Water 1 part | Water 0.5 part | Water 1 part | Water 1 part |
|  | Epoxy resin (e3) |  | e3-1 200 parts | e3-1 200 parts | e3-1 200 parts | e3-1 200 parts | e3-1 200 parts | e3-1 200 parts |
|  | Content of cyclic boric acid ester compound(L) |  | — | — | 0.3 part | — | — | 0.2 part |
|  | Total chlorine amount (ppm) |  | 1500 ppm | 1400 ppm | 1800 ppm | 1500 ppm | 1800 ppm | 1850 ppm |
|  | Master batch type epoxy resin hardener composition |  | F-24 | F-25 | F-26 | F-27 | F-28 | F29 |
|  | Fluidity of the one-liquid epoxy resin composition |  | ◎ | ○ | ◎ | ◎ | XX | X |
|  | Curability-2 of the one-liquid epoxy resin composition |  | ○ | ◎ | ◎ | ○ | ◎ | ◎ |
|  | Dispersibility of master batch type epoxy resin hardener |  | ○ | ○ | ○ | ○ | X | XX | epoxy resin e3-1: bisphenol A type liquid epoxy resin (epoxy equivalent of 175 g/equivalent, diol terminal impurity component/basic structural component = 0.08, total chlorine amount: 1400 ppm)
2MZ: 2-methylimidazole
TETA: triethylenetetramine
NP: N-methylpiperadine
2E4MZ: 2-ethyl-4-methylimidazole
PGM: propyleneglycolmonomethylether
TDI: tolylene diisocyanate
MDI: 4,4'-diphenylmethanediisocyanate
MR-200: polymethylenephenylenepolyisocyanate produced by Nippon Polyurethane Co.
Cyclic boric acid ester compound (L): 2,2'-oxybis(5,5'-dimethyl-1,3,2-oxaborinane)

[Table 4]

TABLE 4

| | | | Example 15 | Example 16 | Example 17 | Comparative Example 16 | Comparative Example 17 | Comparative Example 18 |
|---|---|---|---|---|---|---|---|---|
| Starting material for forming microencapsulated epoxy resin hardener | Epoxy resin hardener (H) | Amine adduct (A) | A-18 | A-19 | A-20 | A-21 | A-22 | A-22 |
| | | Low molecular weight amine compound (B) | 2E4Z | TETA | NP | 2MZ | 2MZ | 2MZ |
| | | Content of low molecular weight amine compound (B) with respect relative to 100 parts by mass of epoxy resin hardener (H) | 0.9 part | 0.3 part | 0.8 part | 0.4 part | 0.5 part | 0.5 part |
| | | Average particle size (μm) | 2.5 | 2.0 | 1.9 | 15.5 | 1.0 | 2.5 |
| Mixture for master batch type epoxy resin hardener composition which contains microencapsulated epoxy resin hardener | Epoxy resin hardener (H) | | H-22 100 parts | H-23 100 parts | H-24 100 parts | H-25 100 parts | H-26 50 parts | H-27 100 parts |
| | Isocyanate compound | | TDI 7 parts | MR200 5 parts | MDI 5 parts | MR200 3 parts | TDI 35 parts | MDI 9 parts |
| | Active hydrogen compound | | Water 1.5 parts | Water 1.5 parts | Water 2 parts | Water 0.5 part | Water 1 part | Diol-400 1 part |
| | Epoxy resin (e3) | | e3-1 200 parts | e3-1 200 parts | e3-1 200 parts | e3-1 200 parts | e3-1 200 parts | e3-1 200 parts |
| | Content of cyclic boric acid ester compound (L) | | — | — | 0.3 part | — | — | — |
| | Total chlorine amount (ppm) | | 1500 ppm | 1400 ppm | 1800 ppm | 1500 ppm | 1800 ppm | 1500 ppm |
| | Core (C) to shell (S) volume ratio of microencapsulated epoxy resin hardener | | 100:3.5 | 100:2.5 | 100:2.8 | 100:0.8 | 100:68.0 | 100:3.3 |
| | Master batch type epoxy resin hardener composition | | F-30 | F-31 | F-32 | F-33 | F-34 | F-35 |
| | Storage stability of master batch type epoxy resin hardener composition | | ◎ | ○ | ◎ | Δ | X | Δ |
| | Curability-2 of the one-liquid epoxy resin composition | | ○ | ○ | ○ | X | Δ | ○ |
| | Humidified storage stability of master batch type epoxy resin hardener composition | | ○ | ○ | ○ | Δ | X | X | epoxy resin e3-1: bisphenol A type liquid epoxy resin (epoxy equivalent of 175 g/equivalent, diol terminal impurity component/basic structural component = 0.08, total chlorine amount: 1400 ppm)
2MZ: 2-methylimidazole
TETA: triethylenetetramine
NP: N-methylpiperadine
2E4MZ: 2-ethyl-4-methylimidazole
TDI: tolylene diisocyanate
MDI: 4,4'-diphenylmethanediisocyanate
MR-200: polymethylenephenylenepolyisocyanate produced by Nippon Polyurethane Co.
Diol-400: polyester polyol produced by Mitsui Takeda Chemicals Co.
Cyclic boric acid ester compound (L): 2,2'-oxybis(5,5'-dimethyl-1,3,2-oxaborinane)

[Table 5]

TABLE 5

| | | | Example 19 | Example 20 | Example 21 | Example 22 | Comparative Example 18 | Comparative Example 19 | Example 23 |
|---|---|---|---|---|---|---|---|---|---|
| Starting material for forming microencapsulated epoxy resin hardener | Epoxy resin hardener (H) | Amine adduct (A) | A-23 | A-24 | A-25 | A-26 | A-27 | A-27 | A-27 |
| | | Low molecular weight amine compound (B) | 2E4Z | TETA | NP | 2MZ | 2MZ | 2MZ | 2MZ |
| | | Content of low molecular weight amine compound (B) with respect relative to 100 parts by mass of epoxy resin hardener (H) | 0.9 part | 0.3 part | 0.8 part | 0.4 part | 0.5 part | 0.5 part | 0.5 part |
| | | Water content with respect relative to 100 parts by mass of epoxy resin hardener (H) | 0.6 part | 1.2 parts | 0.7 part | 1 part | 4.1 parts | 0.1 part | 2.5 parts |
| | | Average particle size (μm) | 2.5 | 2.0 | 1.9 | 3.5 | 15.5 | 1.8 | 3.1 |

TABLE 5-continued

|  |  | Example 19 | Example 20 | Example 21 | Example 22 | Comparative Example 18 | Comparative Example 19 | Example 23 |
|---|---|---|---|---|---|---|---|---|
| Mixture for master batch type epoxy resin hardener composition which contains microencapsulated epoxy resin hardener | Epoxy resin hardener (H) | H-28 100 parts | H-29 100 parts | H-30 100 parts | H-31 100 parts | H-32-1 100 parts | H-32-2 100 parts | H-32-3 100 parts |
|  | Isocyanate compound | TDI 7 parts | MR200 5 parts | MDI 5 parts | MR200 7 parts | TDI 3 parts | TDI 3 parts | MDI 10 parts |
|  | Active hydrogen compound | Water 1.5 parts | Water 1.5 parts | Water 1 part | Water 0.5 part | Water 0.5 part | Water 0.1 part | Diol-400 1 part |
|  | Epoxy resin (e3) | e3-1 200 parts | e3-1 200 parts | e3-1 200 parts | e3-1 200 parts | e3-1 200 parts | e3-1 200 parts | e3-1 200 parts |
|  | Content of cyclic boric acid ester compound (L) | — | — | 0.5 part | — | — | 0.5 part | 0.2 part |
|  | Total chlorine amount (ppm) | 1500 ppm | 1400 ppm | 1800 ppm | 1500 ppm | 1800 ppm | 1800 ppm | 1850 ppm |
| Master batch type epoxy resin hardener composition |  | F-36 | F-37 | F-38 | F-39 | F-40 | F-41 | F-42 |
| Concentration of binding group (x) (meq-kg) |  | 65 | 38 | 48 | 54 | 48 | 20 | 78 |
| Concentration of binding group (y) (meq-kg) |  | 21 | 8 | 15 | 18 | 21 | 7 | 30 |
| Concentration of binding group (z) (meq-kg) |  | 17 | 10 | 18 | 16 | 16 | 18 | 25 |
| Binding group concentration ratio (x)/(x + y + z) |  | 0.63 | 0.68 | 0.59 | 0.61 | 0.56 | 0.45 | 0.59 |
| Storage stability of master batch type epoxy resin hardener composition |  | ◎ | ○ | ◎ | ◎ | Δ | X | ○ |
| Curability-2 of the one-liquid epoxy resin composition |  | ○ | ○ | ◎ | ○ | X | ◎ | Δ |
| Solvent resistance-2 of master batch type epoxy resin hardener composition |  | ○ | ○ | ○ | ○ | ○ | X | Δ |
| Humidified storage stability of master batch type epoxy resin hardener composition |  | ○ | ○ | ○ | ○ | Δ | Δ | X | epoxy resin e3-1: bisphenol A type liquid epoxy resin (epoxy equivalent of 175 g/equivalent, diol terminal impurity component/basic structural component = 0.08, total chlorine amount: 1400 ppm)
2MZ: 2-methylimidazole
TETA: triethylenetetramine
NP: N-methylpiperadine
2E4MZ: 2-ethyl-4-methylimidazole
TDI: tolylene diisocyanate
MDI: 4,4'-diphenylmethanediisocyanate
MR-200: polymethylenephenylenepolyisocyanate produced by Nippon Polyurethane Co.
Diol-400: polyester polyol produced by Mitsui Takeda Chemicals Co.
Cyclic boric acid ester compound (L): 2,2'-oxybis(5,5'-dimethyl-1,3,2-oxaborinane)

[Table 6-1]

TABLE 6

|  |  |  | Example 24 | Example 25 | Example 26 | Example 27 | Example 28 | Example 29 | Example 30 |
|---|---|---|---|---|---|---|---|---|---|
| Starting material for forming microencapsulated epoxy resin hardener | Epoxy resin hardener (H) | Amine adduct (A) | A-28 | A-29 | A-30 | A-31 | A-32 | A-33 | A-32 |
|  |  | Molecular weight distribution of amine adduct (A) | 3.5 | 2.5 | 1.9 | 3.9 | 3.1 | 5.5 | 3.1 |
|  |  | Weight average molecular weight of amine adduct (A) | 3100 | 2400 | 1600 | 3400 | 2800 | 5600 | 2800 |
|  |  | Low molecular weight amine compound (B) | 2E4Z | TETA | NP | 2MZ | 2MZ | 2MZ | 2MZ |
|  |  | Content of low molecular weight amine compound (B) with respect relative to 100 parts by mass of epoxy resin hardener (H) | 0.9 part | 0.3 part | 0.8 part | 0.5 part | 1.5 part | 0.8 part | 1.5 part |
|  |  | Water content with respect relative to 100 parts by mass of epoxy resin hardener (H) | 0.6 part | 1.2 parts | 0.8 part | 0.4 part | 1.5 parts | 0.5 part | 1.5 parts |
|  |  | Content of solvent (SL) with respect relative to 100 parts by mass of epoxy resin hardener (H) | n-butanol 0.2 part | toluene 2.5 parts | PGM 0.8 part | toluene 0.8 part | toluene 1.2 parts | PGM 0.8 parts | toluene 1.2 parts |
|  |  | Average particle size (μm) | 2.5 | 2.0 | 1.9 | 2.4 | 2.9 | 2.5 | 2.9 |

TABLE 6-continued

|  |  | Example 24 | Example 25 | Example 26 | Example 27 | Example 28 | Example 29 | Example 30 |
|---|---|---|---|---|---|---|---|---|
|  | Colorimetric method solubility (mass %) by xylene extraction with respect to epoxy resin e3-2 | 0.3% | 0.5% | 0.8% | 0.3% | 0.4% | 0.2% | 0.4% |
| Mixture for master batch type epoxy resin hardener composition which contains microencapsulated epoxy resin hardener | Epoxy resin hardener (H) | H-33 100 parts | H-34 100 parts | H-35 100 parts | H-36 100 parts | H-37 100 parts | H-38 100 parts | H-37 100 parts |
|  | Isocyanate compound | TDI 7 parts | MR200 5 parts | MDI 5 parts | MR200 8 parts | MR200 7 parts | MDI 9 parts | MR200 5 parts |
|  | Active hydrogen compound | Water 1.5 parts | Water 1.5 parts | Water 2 parts | Water 1 part | Water 1 part | Water 1.5 parts | Water 1.5 parts |
|  | Epoxy resin (e3) | e3-1 200 parts | e3-2 200 parts | e3-1 200 parts | e3-2 200 parts | e3-2 200 parts | e3-2 200 parts | e3-2 200 parts |
|  | Content of cyclic boric acid ester compound (L) | — | — | — | — | — | — | 0.1 part |
|  | Total chlorine amount (ppm) | 1500 ppm | 1400 ppm | 1800 ppm | 1600 ppm | 1100 ppm | 1700 ppm | 1100 ppm |
|  | Core (C) to shell (S) volume ratio of microencapsulated epoxy resin hardener | 100:8.5 | 100:5.5 | 100:7.8 | 100:14.5 | 100:10.2 | 100:9.8 | 100:10.7 |
|  | Concentration of binding group (x) (meq-kg) | 65 | 38 | 48 | 125 | 101 | 75 | 58 |
|  | Concentration of binding group (y) (meq-kg) | 21 | 8 | 15 | 38 | 23 | 18 | 18 |
|  | Concentration of binding group (z) (meq-kg) | 17 | 10 | 18 | 56 | 48 | 29 | 15 |
|  | Binding group concentration ratio $(x)/(x+y+z)$ | 0.63 | 0.68 | 0.59 | 0.57 | 0.58 | 0.61 | 0.63 |
|  | Master batch type epoxy resin hardener composition | F-36 | F-37 | F-38 | F-39 | F40 | F-41 | F-42 |
|  | Storage stability-1 of the one-liquid epoxy resin composition | ◎ | ○ | ○ | ◎ | ◎ | ◎ | ◎ |
|  | Curability-1 of the one-liquid epoxy resin composition | ○ | ◎ | ◎ | ○ | ○ | ○ | ◎ |
|  | Curability-2 of the one-liquid epoxy resin composition | ○ | ◎ | ◎ | ○ | ○ | ○ | ○ |
|  | Fluidity of the one-liquid epoxy resin composition | ◎ | ○ | ◎ | ○ | ○ | ○ | ○ |
|  | Storage stability of master batch type epoxy resin hardener composition | ◎ | ○ | ○ | ◎ | ◎ | ◎ | ◎ |
|  | Dispersibility of master batch type epoxy resin hardener composition | ○ | ○ | ○ | ○ | ○ | ◎ | ○ |
|  | Solvent resistance-2 of master batch type epoxy resin hardener composition | ◎ | ◎ | ◎ | ○ | ◎ | ◎ | ○ |
|  | Humidified storage stability of master batch type epoxy resin hardener composition | ◎ | ◎ | ◎ | ○ | ○ | ○ | ◎ |
|  | Shear bond strength (kg/cm$^2$) | 158 | 155 | 144 | 162 | 160 | 168 | 164 |

[Table 6-2]

TABLE 6

|  |  |  | Comparative Example 20 | Comparative Example 21 | Comparative Example 22 | Comparative Example 23 | Example 31 |
|---|---|---|---|---|---|---|---|
| Starting material for forming microencapsulated epoxy resin hardener | Epoxy resin hardener (H) | Amine adduct (A) | A-34 | A-34 | A-35 | A-35 | A-35 |
|  |  | Molecular weight distribution of amine adduct (A) | 8.5 | 8.5 | 8.5 | 1.5 | 1.5 |
|  |  | Weight average molecular weight of amine adduct (A) | 9800 | 9800 | 9800 | 1100 | 1100 |
|  |  | Low molecular weight amine compound (B) | 2MZ | 2MZ | 2MZ | 2MZ | 2MZ |
|  |  | Content of low molecular weight amine compound (B) with respect relative to 100 parts by mass of epoxy resin hardener (H) | 0.1 part | 4 parts | 4 parts | 4 parts | 4 parts |
|  |  | Water content with respect relative to 100 parts by mass of epoxy resin hardener (H) | 1.5 parts | 3.9 parts | 3.9 parts | 3.5 parts | 3.5 parts |
|  |  | Content of solvent (SL) with respect relative to 100 parts by mass of epoxy resin hardener (H) | toluene 0.5 part | toluene 0.5 part | toluene 0.5 part | PGM 5.5 parts | PGM 5.5 parts |

TABLE 6-continued

|  |  | Comparative Example 20 | Comparative Example 21 | Comparative Example 22 | Comparative Example 23 | Example 31 |
|---|---|---|---|---|---|---|
|  | Average particle size (μm) | 2.1 | 3.9 | 3.9 | 2.1 | 2.1 |
|  | Colorimetric method solubility (mass %) by xylene extraction with respect to epoxy resin e3-2 | 0.1% | 1.8% | 1.8% | 3.2% | 3.2% |
| Mixture for master batch type epoxy resin hardener composition which contains microencapsulated epoxy resin hardener | Epoxy resin hardener (H) | H-39 100 parts | H-39-2 100 parts | H-39-2 100 parts | H-40 100 parts | H-40 100 parts |
|  | Isocyanate compound | MR200 9 parts | MR200 9 parts | MRS200 9 parts | MR200 9 parts | MR200 9 parts |
|  | Active hydrogen compound | Water 1 part | Water 1 part | Water 1 part | Water 1 part | Diol-400 1 part |
|  | Epoxy resin (e3) | e3-1 200 parts | e3-1 200 parts | e3-1 200 parts | e3-1 200 parts | e3-1 200 parts |
|  | Content of cyclic boric acid ester compound (L) | — | — | 0.2 part | — | 0.2 part |
|  | Total chlorine amount (ppm) | 1800 ppm | 1800 ppm | 1800 ppm | 1700 ppm | 1700 ppm |
| Core (C) to shell (S) volume ratio of microencapsulated epoxy resin hardener |  | 100:11.4 | 100:8.8 | 100:8.8 | 100:7.5 | 100:6.5 |
| Concentration of binding group (x) (meq-kg) |  | 105 | 95 | 104 | 90 | 98 |
| Concentration of binding group (y) (meq-kg) |  | 35 | 25 | 28 | 25 | 35 |
| Concentration of binding group (z) (meq-kg) |  | 30 | 42 | 38 | 45 | 40 |
| Binding group concentration ratio (x)/(x + y + z) |  | 0.61 | 0.58 | 0.61 | 0.56 | 0.56 |
| Master batch type epoxy resin hardener composition |  | F-43 | F-44 | F-45 | F-46 | F-47 |
| Storage stability-1 of the one-liquid epoxy resin composition |  | Δ | XX | Δ | X | Δ |
| Curability-1 of the one-liquid epoxy resin composition |  | X | ◯ | Δ | ◯ | ◯ |
| Curability-2 of the one-liquid epoxy resin composition |  | X | ◯ | Δ | ◯ | ◯ |
| Fluidity of the one-liquid epoxy resin composition |  | ◯ | Δ | ◯ | Δ | Δ |
| Storage stability of master batch type epoxy resin hardener composition |  | ◯ | Δ | ◯ | X | Δ |
| Dispersibility of master batch type epoxy resin hardener composition |  | ◯ | Δ | ◯ | Δ | ◯ |
| Solvent resistance-2 of master batch type epoxy resin hardener composition |  | ◯ | Δ | ◯ | Δ | Δ |
| Humidified storage stability of master batch type epoxy resin hardener composition |  | ◯ | Δ | ◯ | Δ | X |
| Shear bond strength (kg/cm$^2$) |  | 157 | 155 | 156 | 138 | 137 | epoxy resin e3-1: bisphenol A type liquid epoxy resin (epoxy equivalent of 175 g/equivalent, diol terminal impurity component/basic structural component = 0.08, total chlorine amount: 1400 ppm)
epoxy resin e3-2: bisphenol F type liquid epoxy resin (epoxy equivalent of 165 g/equivalent, diol terminal impurity component/basic structural component = 0.12, total chlorine amount: 1300 ppm)
2MZ: 2-methylimidazole
TETA: triethylenetetramine
NP: N-methylpiperadine
2E4MZ: 2-ethyl-4-methylimidazole
TDI: tolylene diisocyanate
MDI: 4,4'-diphenylmethanediisocyanate
MR-200: polymethylenephenylenepolyisocyanate produced by Nippon Polyurethane Co.
Diol-400: polyester polyol produced by Mitsui Takeda Chemicals Co.
Cyclic boric acid ester compound (L): 2,2'-oxybis(5,5'-dimethyl-1,3.2-oxaborinane)

The invention claimed is:

1. A microcapsulated epoxy resin hardener comprising at least a core (C) and a shell (S) covering the core, wherein:

the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients, a molecular weight distribution of the epoxy resin hardener (H), defined as a ratio of a weight average molecular weight to a number average molecular weight of the amine adduct (A), being over 1 but 7 or less, and a water content of the epoxy resin hardener (H) being 0.05-3 parts by mass based on 100 parts by mass of the epoxy resin hardener (H), and a content of said low molecular amine compound (B) in said epoxy resin hardener (H) is 0.001-3 parts by mass based on 100 parts by mass of said epoxy resin hardener (H); and the shell (S) has, at least on a surface, a binding group (x) absorbing infrared radiation of wave number 1630-1680 cm$^{-1}$, a binding group (y) absorbing infrared radiation of wave number 1680-1725 cm$^{-1}$, and a binding group (z) absorbing infrared radiation of wave number 1730-1755 cm$^{-1}$.

2. The microcapsulated epoxy resin hardener according to claim 1, wherein said shell (S) contains essentially no carboxylate ester group.

3. The microcapsulated epoxy resin hardener according to claim 1, wherein said shell (S) contains essentially no ester bond except for a carbamate ester bond.

4. A master batch type epoxy resin hardener composition comprising an epoxy resin (e3) and the microcapsulated epoxy resin hardener according to claim 1, wherein a weight ratio of the epoxy resin (e3) to the microcapsulated epoxy resin hardener is 100:0.1 to 100:1000.

5. The microcapsulated epoxy resin hardener comprising at least a core (C) and a shell (S) covering the core, wherein:
the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients,
a water content of the epoxy resin hardener (H) being 0.05-3 parts by mass based on 100 parts by mass of the epoxy resin hardener (H), and
a content of said low molecular amine compound (B) in said epoxy resin hardener (H) is 0.001-3 parts by mass based on 100 parts by mass of said epoxy resin hardener (H), and
a content of a solvent (SL) that is inert to the amine adduct (A) being 0.001-3 parts by mass based on 100 parts by mass of the epoxy resin hardener (H); and
the shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$.

6. The microcapsulated epoxy resin hardener according to claim 5, wherein said shell (S) contains essentially no carboxylate ester group.

7. The microcapsulated epoxy resin hardener according to claim 5, wherein said shell (S) contains essentially no ester bond except for a carbamate ester bond.

8. The microcapsulated epoxy resin hardener comprising at least a core (C) and a shell (S) covering the core, wherein:
the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients and has a solubility to a liquid epoxy resin of 0.01-3 mass % determined by a colorimetric method after solvent extraction, and
a content of said low molecular amine compound (B) in said epoxy resin hardener (H) is 0.001-3 parts by mass based on 100 parts by mass of said epoxy resin hardener (H); and
the shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$.

9. The microcapsulated epoxy resin hardener according to claim 8, wherein said shell (S) contains essentially no carboxylate ester group.

10. The microcapsulated epoxy resin hardener according to claim 8, wherein said shell (S) contains essentially no ester bond except for a carbamate ester bond.

11. The microcapsulated epoxy resin hardener comprising at least a core (C) and a shell (S) covering the core, wherein:
the core (C) is formed from, as a starting material, particles having an average particle diameter of over 0.3 μm but 12 μm or less, defined as a median diameter, which are made of an epoxy resin hardener (H) having an amine adduct (A) and a low molecular amine compound (B) as major ingredients, and a content of said low molecular amine compound (B) in said epoxy resin hardener (H) is 0.001-3 parts by mass based on 100 parts by mass of said epoxy resin hardener (H); and
the shell (S) has, at least on a surface, a binding group (x) absorbing infrared radiation of wave number 1630-1680 $cm^{-1}$ a binding group (y) absorbing infrared radiation of wave number 1680-1725 $cm^{-1}$, and a binding group (z) absorbing infrared radiation of wave number 1730-1755 $cm^{-1}$, and contains a resin having a urea bond in its structure; and
a volume ratio of the core (C) to the shell (S) is 100:1 to 100:50.

12. The microcapsulated epoxy resin hardener according to claim 11, wherein said shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$, and contains a resin having a urea bond but essentially no carboxylate ester bond in its structure.

13. The microcapsulated epoxy resin hardener according to claim 11, wherein said shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$, and contains a resin having a urea bond but essentially no ester bond except for a carbamate ester bond in its structure.

14. The microcapsulated epoxy resin hardener comprising at least a core (C) and a shell (S) covering the core, wherein:
the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients,
a water content of the epoxy resin hardener (H) being 0.05-3 parts by mass based on 100 parts by mass of the epoxy resin hardener (H), and
a content of said low molecular amine compound (B) in said epoxy resin hardener (H) is 0.001-3 parts by mass based on 100 parts by mass of said epoxy resin hardener (H); and
the shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$, and the binding groups (x), (y) and (z) being a urea group, biuret group and urethane group, respectively, and a concentration ratio of the binding group (x) to a total concentration of the binding groups (x), (y) and (z) (=x/(x+y+z)) being 0.50-0.75.

15. The microcapsulated epoxy resin hardener according to claim 14, wherein said shell (S) contains essentially no carboxylate ester group in its structure.

16. The microcapsulated epoxy resin hardener according to claim 14, wherein said shell (S) contains essentially no ester bond except for a carbamate ester bond in its structure.

17. A microcapsulated epoxy resin hardener comprising at least a core (C) and a shell (S) covering the core, wherein:
the core (C) is formed from, as a starting material, particles having an average particle diameter of over 0.3 μm but 12 μm or less, defined as a median diameter, which are made of an epoxy resin hardener (H) which has an amine adduct (A) and a low molecular amine compound (B) as major ingredients, said amine adduct (A) being obtained by a reaction of an epoxy resin (e1) and an amine compound, and a weight average molecular weight of said amine adduct (A) being 150-8000, and a content of said low molecular amine compound (B) in said epoxy resin hardener (H) is 0.001-3 parts by mass based on 100 parts by mass of said epoxy resin hardener (H); and the shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$.

18. The microcapsulated epoxy resin hardener according to claim 17, wherein said shell (S) contains essentially no carboxylate ester group.

19. The microcapsulated epoxy resin hardener according to claim 17, wherein said shell (S) contains essentially no ester bond except for a carbamate ester bond.

20. A microcapsulated epoxy resin hardener comprising at least a core (C) and a shell (S) covering the core, wherein;

the core (C) is formed from, as a starting material, particles having an average particle diameter of over 0.3 µm but 12 µm or less, defined as a median diameter, which are made of an epoxy resin hardener (H) which has an amine adduct (A) and a low molecular amine compound (B) as major ingredients, said amine adduct (A) being obtained by a reaction of an epoxy resin (e1) and an amine compound, and a weight average molecular weight of said epoxy resin (e1) being 150-5000, and a content of said low molecular amine compound (B) in said epoxy resin hardener (H) is 0.001-3 parts by mass based on 100 parts by mass of said epoxy resin hardener (H); and the shell (S) has, at least on a surface, a binding group (x) absorbing infrared radiation of wave number 1630-1680 $cm^{-1}$, a binding group (y) absorbing infrared radiation of wave number 1680-1725 $cm^{-1}$, and a binding group (z) absorbing infrared radiation of wave number 1730-1755 $cm^{-1}$.

21. The microcapsulated epoxy resin hardener according to claim 20, wherein said shell (S) contains essentially no carboxylate ester group.

22. The microcapsulated epoxy resin hardener according to claim 20, wherein said shell (S) contains essentially no ester bond except for a carbamate ester bond.

23. The microcapsulated epoxy resin hardener according to any one of claims 1-22, wherein said low molecular amine compound (B) is an imidazole.

24. The microcapsulated epoxy resin hardener according to claim 1, wherein a total chlorine content of said epoxy resin (e1) is 2500 ppm or less.

25. The microcapsulated epoxy resin hardener according to claim 1, wherein said epoxy resin hardener (H) is a solid at 25° C.

26. The microcapsulated epoxy resin hardener according to claim 1, wherein a total chlorine content of the epoxy resin hardener (H) is 2500 ppm or less.

27. The microcapsulated epoxy resin hardener according to claim 1, wherein said shell (S) comprises any two or more of an isocyanate compound, an active hydrogen compound, an epoxy resin hardener (h2), an epoxy resin (e2) and said low molecular amine compound (B).

28. The microcapsulated epoxy resin hardener according to claim 1, wherein a total chlorine content of said epoxy resin (e2) is 2500 ppm or less.

29. A separator material for fuel cells comprising the composition according to claim 4.

30. The master batch type epoxy resin hardener composition according to claim 4, wherein a total chlorine content of said epoxy resin (e3) is 2500 ppm or less.

31. The master batch type epoxy resin hardener composition according to claim 4, wherein the total chlorine content is 2500 ppm or less.

32. The master batch type epoxy resin hardener composition according to claim 4, wherein diol terminal impurity component of said epoxy resin (e3) is 0.001-30 weight % of basic structural components of said epoxy resin (e3).

33. A one-liquid epoxy resin composition comprising an epoxy resin (e4) and the master batch type epoxy resin hardener composition according to claim 4, wherein a weight ratio of the epoxy resin (e4) to said master batch type epoxy resin hardener composition is 100:0.001 to 100:1000.

34. The composition according to claim 4, further comprising at least one epoxy resin hardener (h3) selected from the group consisting of acid anhydrides, phenols, hydrazides and guanidines.

35. The composition according to claim 4, further comprising a cyclic borate ester compound.

36. The composition according to claim 35, wherein the cyclic borate ester compound is 2,2'-oxybis(5,5'-dimethyl-1,3,2-dioxaborinan).

37. The composition according to claim 35, wherein a content of said cyclic borate ester compound is 0.001-10 mass %.

38. A paste composition comprising the composition according to claim 4.

39. A film composition comprising the composition according to claim 4.

40. An adhesive comprising the composition according to claim 4.

41. An adhesive paste comprising the composition according to claim 4.

42. An adhesive film comprising the composition according to claim 4.

43. An electrically conductive material comprising the composition according to claim 4.

44. An anisotropic electrically conductive material comprising the composition according to claim 4.

45. An anisotropic electrically conductive film comprising the composition according to claim 4.

46. An insulating material comprising the composition according to claim 4.

47. A sealing material comprising the composition according to claim 4.

48. A coating material comprising the composition according to claim 4.

49. A paint composition comprising the composition according to claim 4.

50. A prepreg comprising the composition according to claim 4.

51. A heat conductive material comprising the composition according to claim 4.

* * * * *